(12) United States Patent
Hidaka

(10) Patent No.: US 6,538,953 B2  
(45) Date of Patent: Mar. 25, 2003

(54) SEMICONDUCTOR MEMORY DEVICE

(75) Inventor: Hideto Hidaka, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/103,999

(22) Filed: Mar. 25, 2002

(65) Prior Publication Data

US 2002/0097626 A1 Jul. 25, 2002

Related U.S. Application Data

(62) Division of application No. 09/737,737, filed on Dec. 18, 2000, now Pat. No. 6,366,515.

(30) Foreign Application Priority Data

Jun. 21, 2000 (JP) .......................................... 2000-186061

(51) Int. Cl.[7] .............................................. G11C 8/00
(52) U.S. Cl. .................................. 365/230.03; 222/200
(58) Field of Search ........................... 365/230.03, 222, 365/200, 230.06, 230.08, 189.05

(56) References Cited

U.S. PATENT DOCUMENTS

| 5,798,976 | A | * | 8/1998 | Arimoto ...................... 365/222 |
| 6,038,196 | A | | 3/2000 | Oh .............................. 365/236 |
| 6,208,577 | B1 | | 3/2001 | Mullarkey ................... 365/222 |
| 6,400,637 | B1 | * | 6/2002 | Akamatsu et al. ...... 365/230.03 |

FOREIGN PATENT DOCUMENTS

| JP | 10-188562 | 7/1998 |
| JP | 11-250694 | 9/1999 |

* cited by examiner

*Primary Examiner*—David Lam  
(74) *Attorney, Agent, or Firm*—McDermott, Will & Emery

(57) ABSTRACT

A refresh address is set to a definite state prior to the rise of a clock signal, a refresh instruction is taken-in in synchronization with a clock signal and a refresh operation is performed according to the refresh instruction. Further, in a refresh operation, refresh is performed with a sub-word line being a unit; thereby enabling high speed refresh of memory sell data with a reduced current consumption.

8 Claims, 38 Drawing Sheets

: LOCAL ROW-RELATED CONTROL CIRCUIT

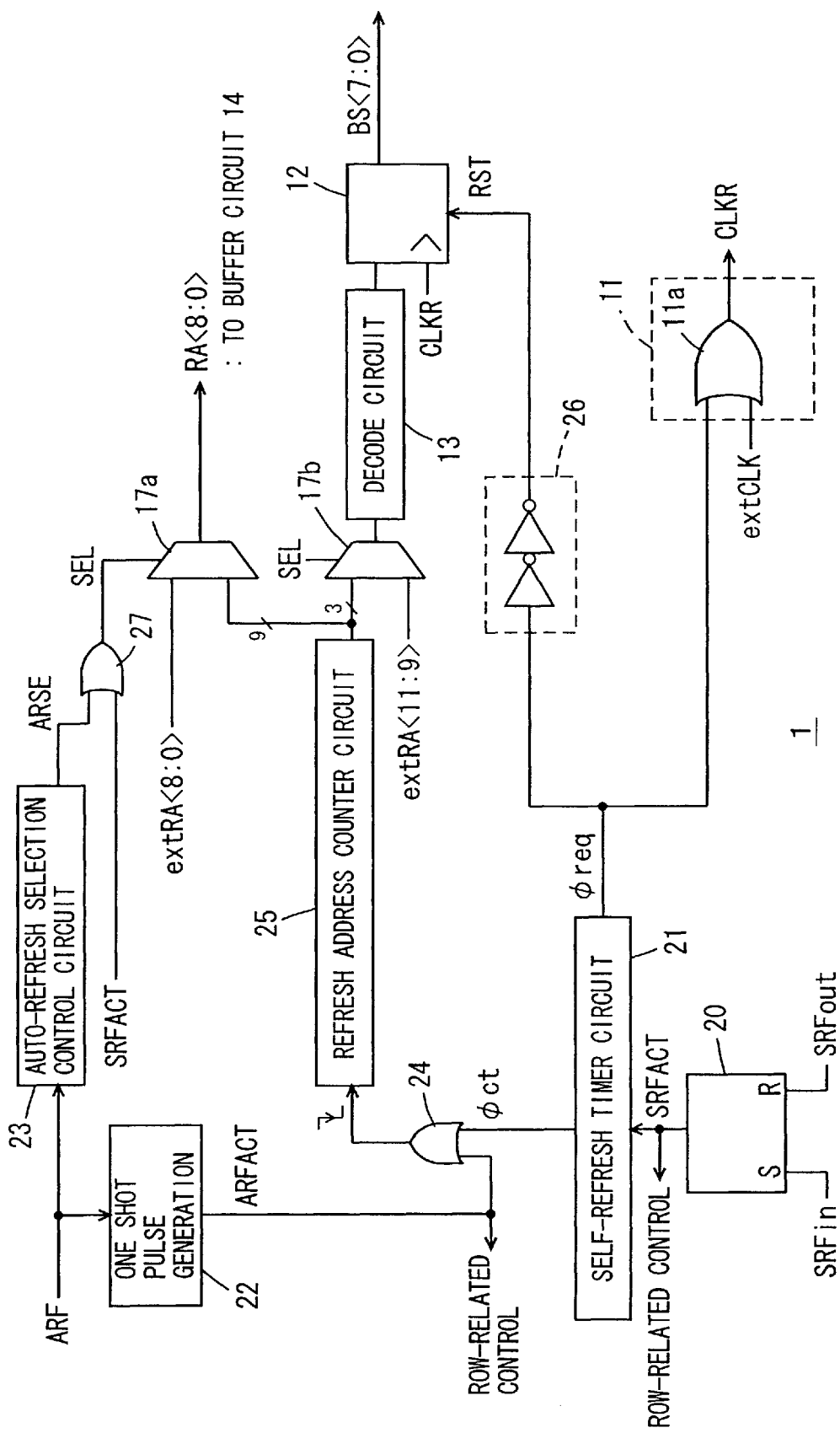
F I G. 5

FIG. 16A

SPECIFIED BY BS<0:7>

|  | SENSE AMPLIFIER BAND SAB#0 |  |
|---|---|---|
| RB#0: | MSA ... MSA | |
|  | SENSE AMPLIFIER BAND SAB#1 | |
| RB#1: | MWL SWL | MAIN WORD LINE DRIVER BAND |
|  | SENSE AMPLIFIER BAND SAB#2 | |
| RB#2: |  | |
|  | SENSE AMPLIFIER BAND SAB#3 | |
| RB#3: |  | |
|  | SENSE AMPLIFIER BAND SAB#4 | |
| RB#4: |  | |
|  | SENSE AMPLIFIER BAND SAB#5 | |
| RB#5: |  | |
|  | SENSE AMPLIFIER BAND SAB#6 | |
| RB#6: |  | |
|  | SENSE AMPLIFIER BAND SAB#7 | |
| RB#7: |  | |
|  | SENSE AMPLIFIER BAND SAB#8 | |

CB#0 CB#1 CB#2 CB#3 CB#4 CB#5 CB#6 CB#7 — MWDB

FIG. 16B

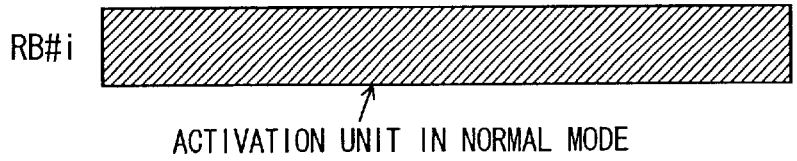

ACTIVATION UNIT IN NORMAL MODE

FIG. 16C

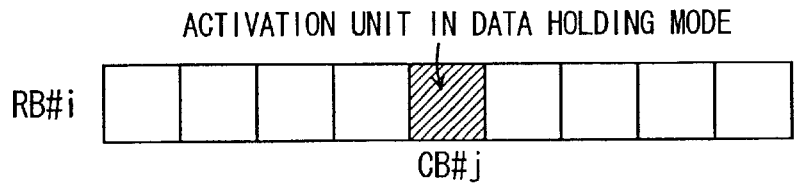

ACTIVATION UNIT IN DATA HOLDING MODE

CB#j

| | CB #0 | CB #1 | CB #2 | CB #3 | CB #4 | CB #5 | CB #6 | CB #7 |
|---|---|---|---|---|---|---|---|---|
| CB0 | 0 | 1 | 0 | 1 | 0 | 1 | 0 | 1 |
| CB1 | 0 | 0 | 1 | 1 | 0 | 0 | 1 | 1 |
| CB2 | 0 | 0 | 0 | 0 | 1 | 1 | 1 | 1 |

A GATE CIRCUIT IS PROVIDED TO ZSD0 TO 3

FIG. 37

SPECIFIED BY BS<0:7>

| | SENSE AMPLIFIER BAND SAB#0 | |
|---|---|---|
| NRB#0: | NMSA ... NMSA | |
| NMWL | SENSE AMPLIFIER BAND SAB#1 | |
| NRB#1: NSWL | | |
| | SENSE AMPLIFIER BAND SAB#2 | |
| NRB#2: | | |
| | SENSE AMPLIFIER BAND SAB#3 | |
| NRB#3: | | MAIN WORD LINE DRIVER BAND |
| | SENSE AMPLIFIER BAND SAB#4 | |
| RRB# { NRB#4 | NMSA | |
| SRB# | SMSA | |
| | SENSE AMPLIFIER BAND SAB#5 | |
| NRB#5: | | |
| | SENSE AMPLIFIER BAND SAB#6 | |
| NRB#6: | | |
| | SENSE AMPLIFIER BAND SAB#7 | |
| NRB#7: | | |
| | SENSE AMPLIFIER BAND SAB#8 | |

CB#0 CB#1 CB#2 CB#3 CB#4 CB#5 CB#6 CB#7     MWDB

16 MBITS: NORMAL/REFRESH: TWO ROW BLOCKS

8 MBITS : NORMAL/REFRESH
: ONE ROW BLOCK

4 MBITS : NORMAL/REFRESH
: 1/2 ROW BLOCK

SPARE DTRMIN. ON EACH ROW BLOCK

SPARE DTRMIN. ON EACH COLUMN BLOCK IN EACH ROW BLOCK

SPARE DTRMIN. COMMONLY PERFORMED ON ROW BLOCKS

SPARE DTRMIN. COMMONLY PERFORMED ON ROW BLOCKS, ONE COLUMN BLOCK AS A UNIT

SEMICONDUCTOR MEMORY DEVICE

This application is a divisional of U.S. patent application Ser. No. 09/737,737, filed Dec. 18, 2000 now U.S. Pat. No. 6,366,515.

CROSS REFERENCE TO RELATED APPLICATION

The present application relates to co-pending application Ser. No. 09/511,927 in which features pertinent to the subject matter of the present application are disclosed.

BACKGROUND OF THE INVENTION

1. Field of the Invention

The present invention relates to a semiconductor memory device and particularly, to a dynamic semiconductor memory device operable in a refresh mode in which a refresh (restoring) of a stored data is performed. More particularly, the present invention relates to a configuration for refresh control in a dynamic semiconductor memory device.

2. Description of the Background Art

In a dynamic type semiconductor memory device (DRAM), a memory cell is constructed of one transistor and one capacitor. Information is stored in a memory capacitor in an electrical charge form. When the accumulated charge in the memory cell capacitor is lost due to leakage current or the like, a stored data therein is destroyed. Therefore, in order to prevent destruction of a stored data, a refresh operation is performed to restore a stored data in a memory cell in a prescribed period. A refresh mode includes an auto-refresh mode in which a refresh instruction is externally supplied to perform refresh of memory cell data, and a self-refresh mode in which refresh timing is automatically determined internally to perform a refresh operation.

In any of the auto-refresh mode and the self-refresh mode, a refresh address specifying a memory cell (a memory cell row) to be refreshed is generated from an internally provided counter.

FIG. 63 is a chart representing an application sequence of external signals of a conventional DRAM in the auto-refresh mode. The DRAM referred in FIG. 63 takes in an externally applied command CMD in synchronization with a clock signal CLK, to perform an operation according to the taken in command.

First, in a clock cycle #1, a precharge command PRG is supplied. The precharge command PRG is taken into the DRAM at the rise of the external clock signal CLK and an internal precharge operation is performed (in this operation, the memory device is restored to an initial state).

In a next clock cycle #2, a no-operation command NOP is supplied as a command CMD. This is because when the internal circuitry is restored to an initial state by supplying the precharge command PRG, a so-called RAS precharge period is ensured In a clock cycle #3, an auto-refresh command ARF is supplied. The auto-refresh command ARF is taken into the memory device at a rising edge of the external clock signal CLK, and a refresh activation signal RFACT is maintained at H level internally for a prescribed period to perform refresh of memory cell data.

In a clock cycle #4, a no-operation command NOP is again supplied. This is done to ensure an activation period of the refresh activation signal RFACT and the precharge period following the activation period.

Subsequently, in a clock cycle #5, auto-refresh command ARF is again supplied. A refresh operation of memory cell data is again performed according to a refresh address generated internally following the auto-refresh command ARF. The auto-refresh command ARF is repeatedly supplied successively a prescribed number of times. A certain period is used as a refresh period and in the remaining period, data access is performed according to another command CMD so as to realize efficient data access.

FIG. 64A is a block diagram schematically showing a configuration of a refresh address generating section. In FIG. 64A, the refresh address generating section includes: an address buffer 900 taking in an address signal AD supplied externally in a normal operating mode; a refresh address generating circuit 901 generating a refresh address specifying a memory cell to be refreshed; a multiplexer (MUX) 901 selecting one of an address signal from the address buffer 900 and the refresh address from the refresh address generating circuit 901 according to a select signal SEL to generate an internal address signal ADin; and a decoder 903 decoding an internal address signal ADin from multiplexer 902 to drive a word line WL provided corresponding to an addressed row to a selected state.

The selection signal SEL is activated when auto-refresh command ARF or self-refresh command SRF instructing the self-refresh mode is supplied. The multiplexer 902 selects a refresh address from the refresh address generating circuit 901 in a refresh mode (including the auto-refresh mode and the self-refresh mode) in response to activation of the selection signal SEL. The decoder 903 is activated in response to activation of a row-related activation signal RACT and decodes an internal address signal ADin to drive a word line on a selected row to a selected state when activated. The address buffer 900 is activated in accordance with a command supplied in the normal operating mode and takes in and latch an address signal supplied externally to generate an internal address signal.

FIG. 64B is a waveform diagram representing operations in the refresh mode. When auto-refresh command ARF is supplied as a command CMD, the auto-refresh command ARF is internally taken in at the rise of the clock signal CLK (see FIG. 63) and a refresh activation signal RFACT is activated in accordance with the taken-in auto-refresh command ARF and the selection signal SEL is activated in response to the refresh activation signal RFACT. When the selection signal SEL is activated, the multiplexer 902 selects the refresh address from refresh address generating circuit 901 to generate an internal address signal ADin. After the internal address signal ADin becomes definite, decoder 903 activated by the row-related activation signal RACT performs a decode operation to drive a word line WL corresponding to an addressed row to a selected state.

Therefore, when an auto-refresh command ARF is supplied, a to-be-selected word line WL is driven to a selected state after elapse of time ta from the rise of a clock signal CLK or in a time tb after the row-related activation signal RACT is activated. This is because a command supplied externally is taken in at the rise of the clock signal CLK and then, an internal operation instructing signal is generated to start an internal operation.

On the other hand, when a self-refresh command SRF is supplied, selection signal SEL and refresh activation signal RFACT are activated in response to the self-refresh command SRF. The selection signal SEL maintains an active state at H level during the self-refresh mode. A row-related activation signal RACT is activated by a refresh request generated periodically from a refresh timer included in refresh address generating circuit 901. In the self-refresh mode, multiplexer 902 already selects a refresh address from refresh address generating circuit 901 according to selection signal SEL. When a refresh request is generated, an internal address signal ADin is in the definite state; therefore, decoder 903 performs a decode operation in response to a row-related activation signal RACT to drive a selected word line WL to a selected state.

In the self-refresh mode, it is necessary to take a time tc to drive a word line WL to a selected state after activation of row-related activation signal RACT, wherein times tb and tc are equal to each other. In the auto-refresh mode, decoder 903 is required to be activated after selection signal SEL is activated, and an internal address signal ADin becomes definite, and therefore timing adjustment becomes more complex than in the self-refresh mode, leading to a problem that a row-related control signal has to be activated at different activation timings between the self-refresh mode and the auto-refresh mode. In this case, it may be possibly considered that selection signal SEL is selectively activated by a refresh request in the self-refresh mode. When selection signal SEL is driven to an active state in response to a refresh request in the self-refresh mode, however, selection signal SEL has to be charged and discharged, to increase current consumed in the self-refresh mode in which a current consumption is required to be as small as possible.

Further, Japanese Patent Laying-Open No.11-339174 discloses a technique that in order to advance internal operation start timing, a row address signal externally supplied is taken in asynchronously with clock signal CLK to supply the row address signal to a decoder or to perform a decode operation prior to application of a command.

In this case, however, a command CMD in the normal operating mode is taken in internally in synchronization with clock signal CLK to perform an internal operation. That is, an internal address signal is generated utilizing a set-up time of a command to perform spare determination or the like. Therefore, an auto-refresh command ARF is taken internally at a rise of clock signal CLK, and selection signal SEL is activated in synchronization with the clock signal CLK. Accordingly, in this prior art technique, in the auto-refresh mode, definite timing of an internal address signal ADin is determined by clock signal CLK and an internal operation start timing is delayed in the auto-refresh mode compared with that in the normal operating mode. That is, when the auto-refresh command is supplied externally, operation starting timing of the internal circuitry is different in application of a command in the normal operating mode (a Row ACT command) and in application of auto-refresh command. Further, a period of an auto-refresh is made longer, thereby increasing a waiting period in a normal access.

It is required to make an internal operation (a row selecting operation) start timing different between the auto-refresh command and commands applied in the other normal modes, leading to complexity in circuit configuration. This applies to a case where a timing margin of an address signal is different for the self-refresh mode and for the auto-refresh mode.

In the self-refresh mode, what is required is only to hold a stored data in a memory cell. In applications such as a portable equipment, an amount of data to be held is limited. Therefore, when a refresh region is limited to a part of a whole address region, a number of times of refresh can be reduced. More specifically, since a refresh cycle of a memory cell is of a prescribed time period, when a refresh region is set to a half of a whole address region, for examples, the number of times of refresh can be reduced by a factor of 2, thereby enabling a current consumed in the self-refresh mode to decrease correspondingly. On the other hand, in the auto-refresh mode, whole the address region is refreshed according to the auto-refresh command supplied externally. This is to prevent a data under processing from vanishing. Accordingly, since a refresh region is limited in the self-refresh mode, there causes a necessity to change a configuration for generating a refresh address according to which mode of the auto-refresh mode and the self-refresh mode is designated.

Further, when a refresh address region is restricted, if a redundancy circuit for replacing a defective row with a spare row is provided, redundancy replacement has to be performed efficiently and correctly. Conventionally, however, no disclosure is provided on circuit configuration with which a refresh address region is changed with ease between the auto-refresh mode and the self-refresh mode and a current consumption is reduced in the self-refresh mode. Especially, when a configuration of a control circuit for the address modification and reduction of current consumption increases in complexity and in addition, a current consumption in the self-refresh mode is caused, a lifetime of a battery in a portable equipment is shortened and a normal operation is adversely affected.

SUMMARY OF THE INVENTION

It is an object of the present invention to provide a dynamic semiconductor memory device capable of performing self-refresh and auto-refresh with ease, stability and a reduced current consumption.

It is another object of the present invention to provide a dynamic semiconductor memory device capable of processing a row access command and an auto-refresh command at the same timing in performing an internal operation,.

It is still another object of the present invention to provide a dynamic semiconductor memory device capable of reducing a current consumption in the refresh mode much more.

A semiconductor memory device according to an aspect of the present invention includes: a refresh address generating circuit for generating a refresh address specifying a memory cell to be refreshed in a refresh mode; an address circuit for generating an internal address based on the refresh address in asynchronization with a clock signal; and a refresh control circuit taking in a refresh instruction supplied externally in synchronization with a clock signal and generating a refresh control signal to perform refresh of a memory cell specified by the internal address according to the taken in refresh instruction.

A semiconductor memory circuit according to a second aspect of the present invention includes: a plurality of memory sub-blocks each having a plurality of normal memory cells disposed in a matrix of rows and columns. The plurality of memory sub-blocks are arranged in alignment in a row direction.

A semiconductor memory device according to the second aspect of the present invention further includes: a plurality of normal sub-word lines, provided corresponding to the respective rows in each of the plurality of memory sub-blocks, each connecting to the normal memory cells on a corresponding row; a plurality of normal main word lines, disposed extending in a row direction in common to the plurality of memory sub-blocks, each provided corresponding to a prescribed number of normal sub-word lines in each of the plurality of memory sub-blocks; and a plurality of spare memory cells disposed aligned on at least one row in each of the plurality of memory sub-blocks. The plurality of spare memory cells are disposed aligned in a column direction with normal memory cells in a corresponding memory sub-block.

A semiconductor memory device according to the second aspect of the present invention further includes: a plurality of spare sub-word lines, provided corresponding to spare memory cell rows in the plurality of memory sub-blocks, each connecting to spare memory cells on a corresponding row; at least one spare main word line, disposed extending in the row direction in common to the plurality of memory sub-blocks, provided corresponding to a prescribed number of spare sub-word lines in each of the plurality of memory sub-blocks; and a repairing control circuit for storing a defect address indicating a position of a defective normal memory cell for replacing a normal sub-word line on the defective row with a spare sub-word line in a corresponding memory sub-block when a row including a defective normal memory cell is specified. At least, in a data holding mode, defect repairing is performed on a sub-word line basis.

A semiconductor memory device according to a third aspect of the present invention includes: a circuit for storing bit information indicating a storage capacity of a memory array; and a refresh size setting circuit for setting a size of rows to be refreshed of a memory array according to the bit information in a refresh mode in which a stored data in a memory array is refreshed.

When a refresh instruction is applied externally, a refresh address is taken in asynchronously with a clock signal to generate an internal address, and the internal address can be generated utilizing a set-up time for a refresh command, which enables advancement in start timing for internal refresh operation. Further, by taking in an address signal asynchronously with the clock signal, similarly to other commands, for the auto-refresh command and a normal row active command, the address signals can be internally decoded to start internal operations at the same timing, and a circuit configuration can be made common to any external command to simplify a circuit configuration. Activation timing of an internal refresh address signal can be the same in both of the self-refresh mode and the auto-refresh mode, thereby enabling simplification of circuit configuration for refresh through commonization thereof.

Further, by enabling repairing of a defective memory cell on a sub-word line basis, correct refreshing of a stored data can be ensured, even when a consumed current is reduced through activation of only a prescribed number of sub-word lines in the data holding mode. Further, by setting a refresh row size adjustably according to a storage capacity, the number of sense amplifier operating concurrently can be optimized to stabilize a sense power supply voltage even when a value of decoupling capacitance of a sense power supply voltage line is small.

The foregoing and other objects, features, aspects and advantages of the present invention will becomes more apparent from the following detailed description of the present invention when taken in conjunction with the accompanying drawings.

BRIEF DESCRIPTION OF THE DRAWINGS

FIG. 5 is a block diagram schematically showing a configuration of an address generating section of a row-related control circuit according to the first embodiment of the present invention;

FIG. 16A is a diagram schematically showing a configuration of a memory array section of a semiconductor memory device according to a second embodiment of the present invention, FIG. 16B is a diagram representing a row block to be activated in a normal operating mode, and FIG. 16C is a diagram schematically showing an activation region in a data holding mode;

FIG. 37 is a diagram schematically showing a configuration of an array section of a semiconductor memory device according to a fourth embodiment of the present invention;

DESCRIPTION OF THE PREFERRED EMBODIMENTS

First Embodiment

Figure 1:
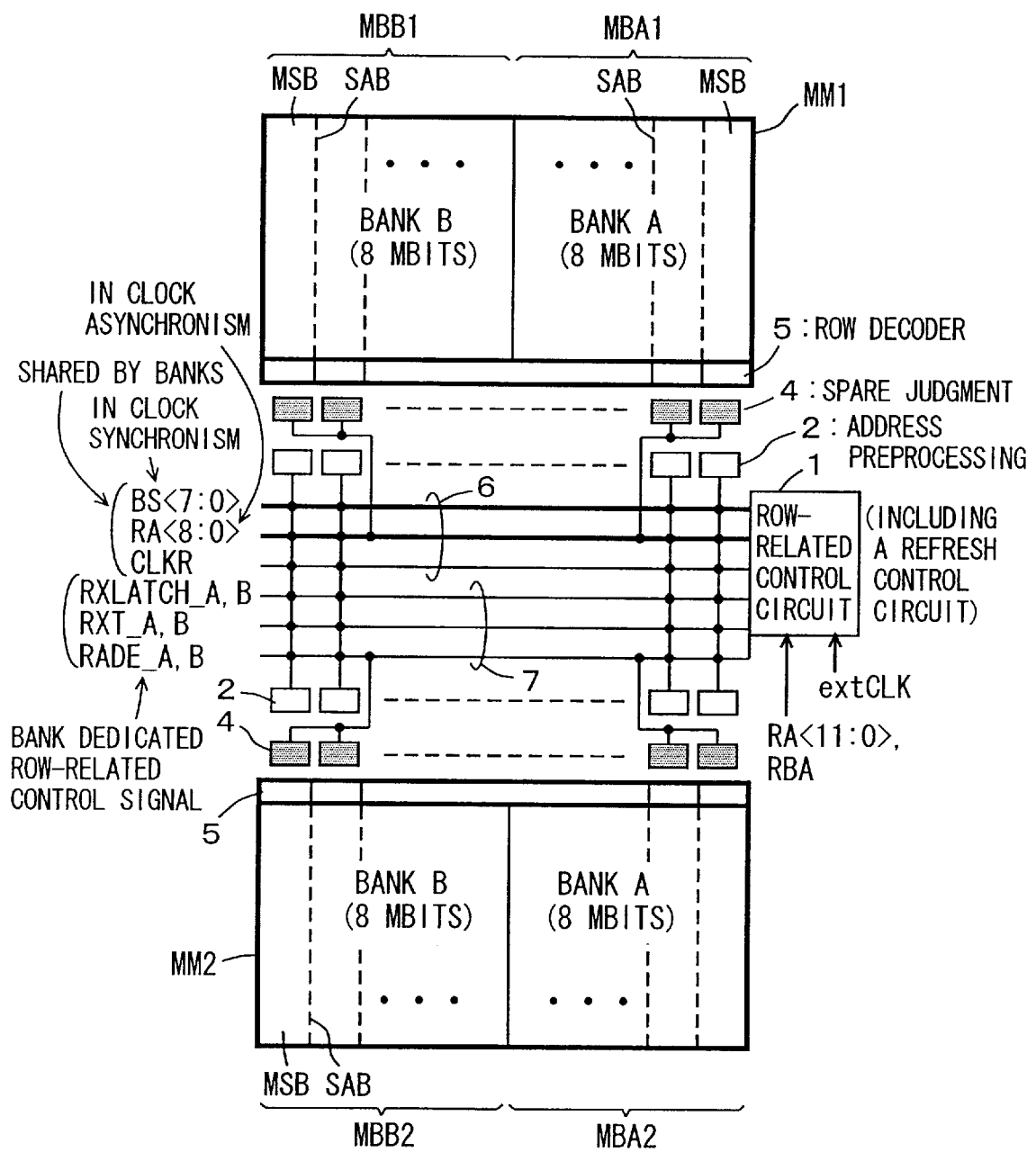
FIG. 1 is a block diagram schematically showing the entire configuration of a semiconductor memory device according to the present invention.

FIG. 1 is a block diagram schematically showing a configuration of a main part of a semiconductor memory device according to a first embodiment of the present invention. In FIG. 1, the semiconductor memory device includes two memory mats MM1 and MM2 disposed oppositely. Memory mat MM1 is divided into two memory blocks MBA1 and MBB1 assigned, respectively, to banks A and B. Memory mat MM2 is divided into two memory blocks MBA2 and MBB2 assigned to respective banks A and B. The memory blocks MBA1, MBA2, MBB1 and MBB2 are each have an 8 Mbit storage capacity, as one example, and divided into memory sub-blocks MSBs each having a storage capacity of 1 Mbits arranged along a column direction. That is, memory blocks MB1, MB2, MBB1 and MBB2 each include 8 memory sub-blocks MSBs.

Between two adjacent memory sub-blocks MSBs, a sense amplifier band SAB including sense amplifier circuits for sensing, amplifying and latching a data of a memory cell in a selected row is placed. The sense amplifier band SAB is provided extending in a row direction in a corresponding memory block.

On one side of each of memory mats MM1 and MM2, there is provided a (central) row-related control circuit 1, receiving a row bank address signal RBA supplied externally, row address bits RA<11:0>, an external clock signal extCLK and a command not shown, for generating row-related operation control signals The row-related control circuit 1 includes a refresh control circuit for performing a refresh of a data of a memory cell and generates a refresh address from an internal address counter therein in a refresh mode. In the refresh mode, a refresh request is repeatedly generated and a count value of a refresh address counter is also updated at predetermined intervals.

The row related control circuit 1 transmits an internal clock signal CLKR in synchronization with an external clock signal extCLK, row address signal bits RA<8:0> generated based on external address bits RA<8:0> in a normal operating mode, and a block selection signal BS<7:0> generated by decoding a 4-bit row address signal RA<11:9> and synchronous with the clock signal CLKR (extCLK), in one direction through a bank common signal bus 6 in asynchronization with the clock signal CLKR (extCLK). In the refresh mode, the row related control circuit 1 generates row address bits RA<8:0> and a block selection signal BS<7:0> according to a refresh address generated from the internal address counter. Therefore, in application of a row active command in the normal operating mode and in application of an auto-refresh command, a row address signal and a block selection signal are generated from the row-related control circuit 1 at the same timing and transmitted onto the bank common signal bus 6.

The block selection signal BS<7:0> specifies one of 8 memory sub-blocks MSBs. The row address signal RA<8:0> specifies memory cells on one row in one memory sub-block. An internal clock CLKR, row address bits RA<8:0> and a block selection signal BS<7:0> are signals in common to the banks A and B.

When an active command or an auto-refresh command is supplied to the row-related control circuit 1, the row-related control circuit 1 generates row-related control signals RXLATCH_A, B; RXT_A, B and RADE_A, B for each of the banks based on a row address signal RBA supplied simultaneously with the active command or the auto-refresh command, and transmits the generated signals to the respective banks along one direction through bank dedicated signal buses 7. The row-related control circuit 1 activates row-related control signals in common for the banks A and B in response to a refresh request generated from the internal timer therein. In the self-fresh mode, refresh operations are performed in parallel in the respective banks A and B.

A (address) preprocessing circuit 2, a spare determination circuit 4 and a row decoder are provided corresponding to each of memory sub-blocked MSB included in the memory mats MM1 and MM2. The (address) preprocessing circuit 2 latches and decodes row address bits RA<8:1> in response to row-related control signals RXLATCH (RXLATCH_A or B) and RADE LADE_A or P) and supplies a decode result to a corresponding row decoder 5. The spare determination circuit 4 performs spare determination on the row address bits RA<8:0> in asynchronization with a clock signal and supplies a spare determination result indicating signal to the corresponding decoder 5. The spare determination operation is performed in asynchronization with clock signal CLKR (extCLK) utilizing an address set-up time and thereby, spare determination result definite timing can be advanced, and an operation start timing for internal word line selection can be advanced correspondingly.

The spare determination circuit 4 performs spare determination based on received row address bits RA<8:0> with nine bits at the maximum (when redundancy replacement is performed on a sub-word line basis). Therefore, when a defect bit address is programmed through fuse programming, only fuse elements with 9 bits being the maximum are required, and an occupancy area of a spare determination circuit 4 can be reduced, as compared with a configuration for performing the spare determination utilizing a predecode signal (a predecode signal is of 20 bits X<19:0>).

Figure 2:
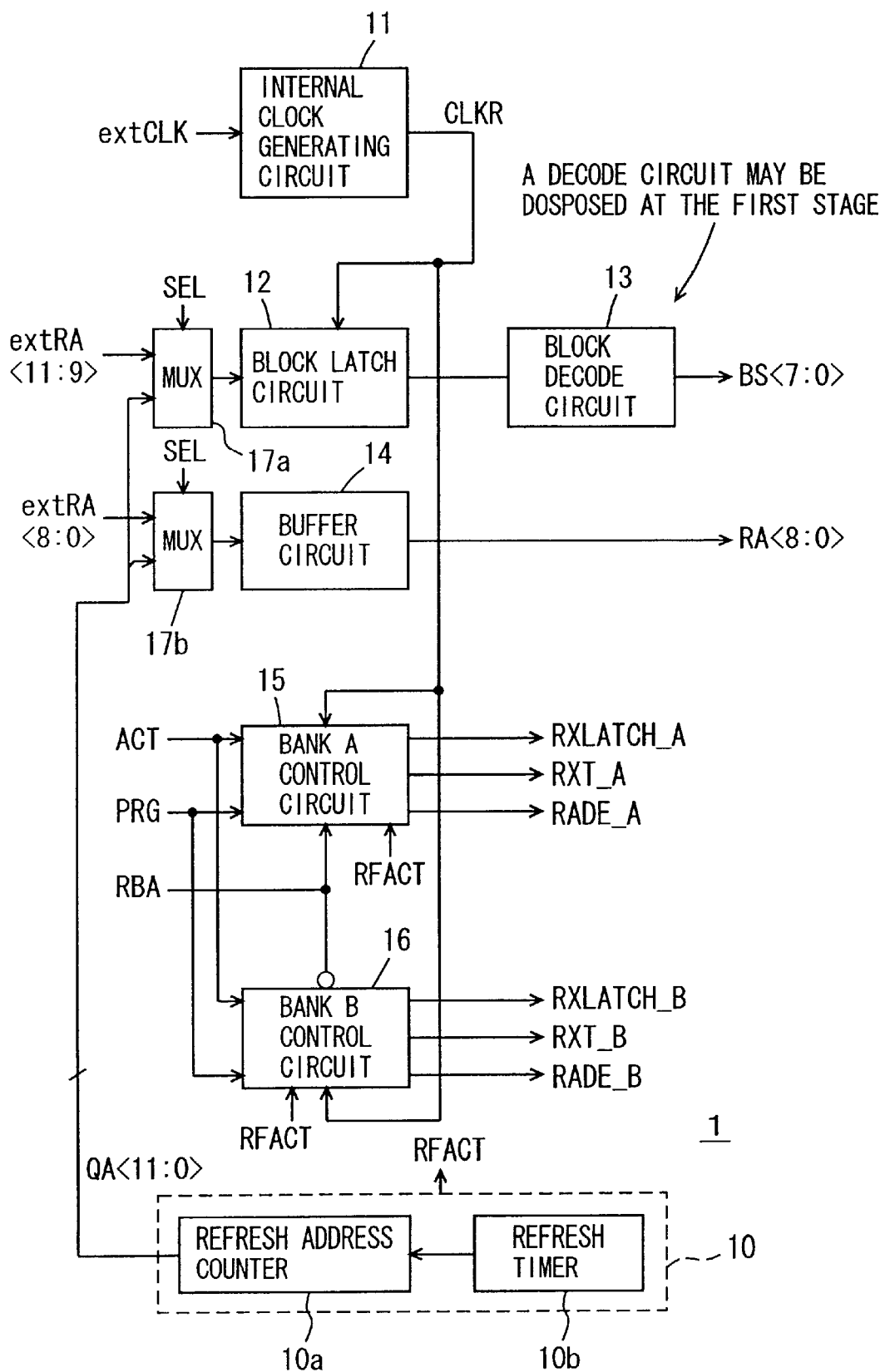
FIG. 2 is a block diagram schematically showing a configuration of a row-related control circuit shown in FIG. 1.

FIG. 2 is a block diagram schematically showing a configuration of the row-related control circuit 1 shown in FIG. 1. In FIG. 2, the row-related control circuit 1 includes a refresh control circuit 10; an internal clock generating circuit 11 receiving external clock signal extCLK to generate the internal clock signal CLKR in synchronization with the external clock signal extCLK; a block latch circuit 12 receiving one of external address bits extRA<11:9> and refresh address bits QA<11:9> from refresh address counter 10a included in the refresh control circuit 10 through a multiplexer (MUX 17a), and taking in the one of the external address bits and the refresh address bits in synchronization with the internal clock CLKR to hold the taken-in one for a period of one clock cycle; a block decoder circuit 13 decoding output address bits of the block latch circuit 12 to generate a block selection signal BS<7:0>; and a buffer circuit 14 receiving and buffering one of external address bits extRA<8:0> and refresh address bits QA<8:0> from the refresh control circuit 10 through a multiplexer 17b to generate internal address bits RA<8:0>.

The buffer circuit 14 has a function of buffering row address bits supplied through the multiplexer 17b and operates in asynchronization with internal clock signal CLKR (external clock signal extCLK). The buffer circuit 14 may also be constituted of a repeater. The internal clock generating circuit 11 includes a buffer circuit and a PLL (phase-locked loop) or a DLL (delayed locked loop).

The row-related control circuit 1 further includes: a bank A control circuit 15 and a bank B control circuit 16, receiving an active command ACT, a precharge command PRG and a row bank address RBA, for activating/deactivating an internal row control signal in accordance with the received command when specified by the row bank address signal RBA. In a normal access operation mode, the bank A control circuit 15 is activated, when active command ACT is supplied and a row bank address signal RBA specifies the bank A, to activate row-related control signals RXLATCH_A; RXT_A and RADE_A in a prescribed sequence. In the normal access operating mode, the bank B control circuit 16 is activated when a row bank address signal RBA specifies the bank B, and activates row-related control signals RXLATCH_B; RXT_B and RADE_B in a prescribed sequence when the active command ACT is supplied.

The bank A control circuit 15 and the bank B control circuit 16 are activated by a refresh activation signal in the refresh mode. At this time, while the banks A and B are simultaneously refreshed, the refreshes may be performed alternately. The bank A control circuit 15 and the bank B control circuit 16 take in a supplied command in synchronization with the internal clock signal CLKR and maintain corresponding row-related control signals RXLATCH; RXT and RADE in active states during the time when a corresponding bank is in an active state. An auto-refresh command is also taken-in in the auto-refresh mode in synchronization with the internal clock signal CLKR. In the self-refresh mode, the semiconductor memory device is in a sleep mode and thereby, generation of internal clock signal CLKR is ceased. Accordingly, in this case, the bank A control circuit 15 and the bank B control circuit 16 utilize a refresh request signal φreq as the internal clock signal CLKR to define respective refresh cycles.

The refresh control circuit, detailed description of which construction will be given later, includes a refresh timer 10b defining a refresh period in the refresh mode, and a refresh address counter 10a having a refresh address (count) incremented or decremented according to issuance of the refresh request from the refresh timer 10b.

By latching block selection signals BS<7:0> for a period of one clock cycle of the internal clock signal CLKR, a selected block can be correctly driven to a selected state by the local row-related control circuit (a preprocessing circuit) and a non-selected sub-block can be maintained in a non-selected state. Further, row address bits RA<8:0> are commonly supplied to the banks A and B in asynchronization with internal clock signal CLKR through the buffer circuit 14, and each memory sub-block in the banks can receive the row address bits RA<8:0> to perform the spare determination, utilizing a set-up time of the row address signal. The row address bits RA<8:0> are generated from an external address signal or a refresh address; therefore internal row address bits R<8:0> are generated at the same timing in the refresh operation mode and in the normal access mode. Accordingly, in the bank A control circuit 15 and the bank B control circuit 16, activation/deactivation timings of row-related control signals can be made the same in any of the normal access mode, the auto-refresh mode and the self-refresh mode.

Control signals supplied individually to the banks A and B are shown including row address latch signals RXLATCH_A and B, word line activation signals RXT_A and B, and row address enable signals RADE_A and B. In addition to those control signals, a sense amplifier activation signal, a bit line isolation instructing signal and a bit line equalize signal are transmitted.

In the configuration shown in FIG. 2, block decode circuit 13 may be provided at a stage preceding block latch circuit 12 and the block decode circuit 13 may perform a decode operation in asynchronization with internal clock signal CLKR to drive one of the block selection signals BS<7:0> to a selected state.

Figure 3:
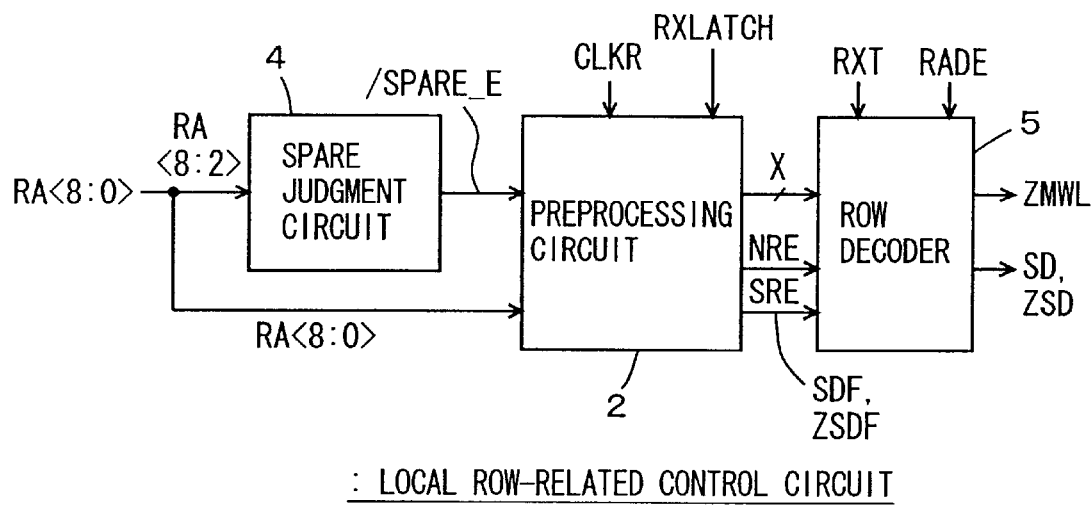
FIG. 3 is a block diagram representing signals associated with a local row-related control circuit shown in FIG. 1.

FIG. 3 is a block diagram schematically showing a configuration of each of the local row-related control circuits provided corresponding to respective memory sub-blocks MSB. In FIG. 3, the local row-related control circuit includes: a spare determination circuit 4 receiving row address bits RA<8:2> from the buffer circuit 14 shown in FIG. 2 and determining whether or not the row address bits RA<8:2> specify an address of a defective bit; a preprocessing circuit 2 taking in row address bits RA<8:0> and a spare determination result indicating signal /SPARE_E from the spare determination circuit 4 in synchronization with internal clock CLK, and latching the address bits and the signal in synchronization with a latch instructing signal RXLATCH to predecode the latched row address bits; and a row decoder 5 receiving and predecoding a row predecode signal X (X<19:0>) from the preprocessing circuit 2 to generate a main word line drive signal ZMWL in response to a word line activation signal RXT and a row address enable signal RADE. The preprocessing circuit 2 further generates complementary sub-decode signals SD and ZSD.

The spare determination circuit 4 includes: a fuse program circuit storing an address of a defective bit to activate/deactivate the spare determination result indicating signal /SPARE_E according to coincidence/non-coincidence of the stored defective bit address and row address bits RA<8:2> supplied from the buffer circuit 14.

The reason why row address bits RA<8:2> are supplied to the spare determination circuit 4 is as follows: In a memory sub-block MSB, a main word line and a sub-word line are provided corresponding to the rows. One main word line is placed corresponding to sub-word lines arranged on a plurality of rows. In the first embodiment, one main word line is provided for sub-word lines on respective 4 rows. In order to select one of the 4 sub-word lines, sub-decode signals SD and ZSD are generated. The sub-decode signals SD and ZSD are generated by decoding row address bits RA<1:0>. Therefore, in the spare determination circuit 4 shown in FIG. 3, a defective bit is repaired on a main word line basis.

As shown in FIG. 3, in the local row-related control circuit, the spare determination circuit 4 performs spare determination prior to taking in row address bits RA<8:0> in synchronization with internal clock signal CLKR in the preprocessing circuit 2. Accordingly, in the preprocessing circuit 2, when the row address bits RA<8:0> are taken-in in synchronization with internal clock signal CLKR, the spare determination result has been made definite, and therefore, operation timing of the row decoder 5, or an activation timing of word line activation signal RXT can be advanced. Hence, a time (a row access time) required till a main word line MW1 and a sub-word line SWL are driven to selected states from application of active command ACT or auto-refresh command ARF, can be made shorter. Further, the spare determination circuit only receives a 7 bit row address RA<8:2> among a 9-bit row address and the fuse elements for storing a defect address are required to be provided corresponding only to the 7-bit row address, thereby enabling an occupancy area of the spare determination circuit 4 to decrease.

Further, in application of auto-refresh command ARF, the spare determination circuit 4 performs a spare determination operation in asynchronization with a clock signal In the auto-refresh mode as well, by selecting a refresh address from the address control circuit in asynchronization with a clock signal and supplying the selected address to the address buffer, activation timing of the spare determination result indicating signal /SPARE_E can be advanced.

Figure 4:
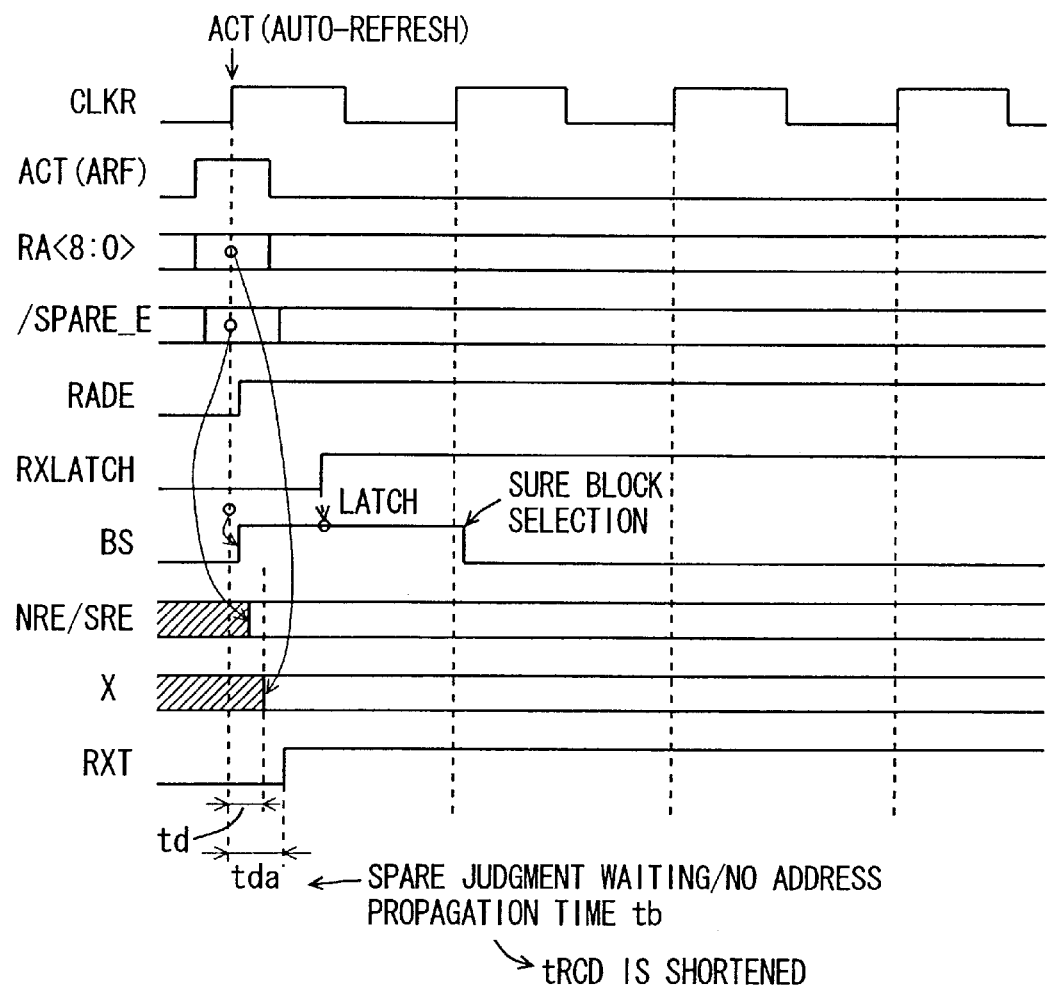
FIG. 4 is a timing chart representing operations in a semiconductor memory device according to a first embodiment of the present invention.

FIG. 4 is a timing chart representing operations in the normal operating mode (the normal access and the auto-refresh mode) of a semiconductor memory device according to the first embodiment of the present invention. Description will be given of operation in the normal operating mode of the row-related circuits shown in FIGS. 1 to 3 below:

Row address bits RA<8:0> are externally supplied in parallel to supply of an active command ACT instructing a row selection. The active command ACT is taken-in in response to the clock signal CLKR in the central row-related control circuit 1, which in turn generates the row-related operation control signals. Row address bits RA<8:0> corresponding to an external address signal are transmitted to the local row-related control circuits provided for respective memory sub-blocks through the buffer circuit 14. Spare determination is performed based on the row address bits RA<8:2> in the spare determination circuit 4 shown in FIG. 3 prior to the rise of the internal clock signal CLKR and a spare determination result indicating signal /SPARE_E from the spare determination circuit 4 enters a definite state.

Then, when the clock signal CLKR rises to H level, the bank A control circuit 15 or the bank B control circuit 16 operates in response to an active command ACT and a bank address signal RBA to drive row-related control signals RADE (A, B), RXLATCH (A, B) and RXT (A, B) to active states in a prescribed sequence. Further, a block selection signal BS (one of BS<7:0>) is driven to a selected state in synchronization with the rise of the clock signal CLKR and is kept in the selected state for a period of one clock cycle.

The preprocessing circuit 2 takes in the spare determination result indicating signal /SPARE_E in synchronization with the rise of internal clock signal CLKR, to drive the normal row enable signal NRE or the spare row enable signal SRE to an active state and to latch the signal in response to latch instructing signal RXLATCH.

Then, the predecode circuit included in the preprocessing circuit predecodes supplied row address bits RA<8:0> to generate a predecode signal X and supplies the predecode signal X to the row decoder 5. The predecode signal X from the preprocessing circuit 2 is transmitted to the row decoder 5 placed in the vicinity thereof across a short distance. Hence, the predecode signal X enters a definite state in a time td after internal clock signal CLKR rises to H level.

A propagation time of the predecode signal X from the preprocessing circuit 2 to the row decoder is taken into consideration a little, and word line activation signal RXT is activated to a selected state at timing a little later than the time td. That is, the word line activation signal RXT can be driven to an active state after the time td elapses from the rise of internal clock signal CLKR with no necessity of considering a spare determination time and an address propagation time with respect to the internal clock signal CLKR. Accordingly, the time tda can be shorter and correspondingly, a RAS-CAS delay time tRCD can also be shorter since a time can be made shorter from when the active command or the auto-refresh command is supplied till an addressed memory cell row is driven to a selected state.

A similar operation to that performed in application of active command ACT is performed at similar timings in application of auto-refresh command ARF.

FIG. 5 is a block diagram representing a specific configuration of a part related to refresh address of the row-related control circuit 1 shown FIG. 1. In FIG. 5, the row-related control circuit 1 includes: a set/reset flip flop 20 set in response to activation of a self-refresh mode instructing command SRFin and reset in response to activation of a self-refresh mode completion command SRFout; a self-refresh timer circuit 21 activated, when a self-refresh activation signal SRFACT from the set/reset flip flop 20, to generate a refresh request signal φreq and a count-up instructing signal at prescribed intervals; a one-shot pulse generating circuit 22 generating an auto refresh activation signal AREACT in the form of a one-shot pulse with a prescribed time width when auto-refresh command ARF is activated; an OR circuit 24 receiving a pulse signal (not shown) of one-shot corresponding to auto-refresh activation signal AREFACT from the one-shot pulse generating circuit 22 and a count-up signal φct from the self-refresh timer circuit 21; a refresh address counter circuit 25 performing a count operation in response to an output signal of the OR circuit 24 to generate a refresh address; and an auto-refresh selection control circuit 23 generating an auto-refresh address selection activation signal ARSE in response to activation of the auto-refresh command ARF. Selection signal SEL for multiplexers 17a and 17b is generated from the OR circuit 27.

In the configuration shown in FIG. 5, the block decode circuit 13 is placed at the stage preceding the block latch circuit 12. The multiplexer 17b selects one of a 3-bit count value from the refresh address counter 25 and a 3-bit row address extRA<11:9> supplied from an outside of the memory device according to select signal SEL for application to the decode circuit 13. The decode circuit 13 decodes row address bits from the multiplexer 17b to generate a block selection signal. The block latch circuit 12 latches the block selection signal from the block decode circuit 13 in response to internal clock signal CLKR to generate block selection signals BS<7:0>.

The internal clock generating circuit 11 includes an OR circuit 11a to generate the internal clock signal CLKR in response to refresh request signal φreq from the self-refresh timer circuit 21 and external clock signal extCLK. The OR circuit 11a includes a phase-locked loop circuit for generating the internal clock signal in synchronization with clock signal extCLK supplied externally. External supply of clock signal extCLK is normally stopped during the time when self-refresh is performed. Hence, in an operating mode in which self-refresh is performed (a sleep mode), internal clock signal CLKR is generated in response to refresh request signal φreq to enable a clock synchronization operation to be performed.

Refresh request φreq is supplied to a reset input of the block latch circuit 12 through a delay circuit 26 as a reset signal RST.

In the normal operating mode, the self-refresh timer 21 is in an inactive state and refresh request signal φreq is also in an inactive state (at L level). The multiplexers 17a and 17b select row address bits extRA<8:0> and extRA<11:9> supplied externally, respectively. The OR circuit 11a generates the internal clock signal CLKR based on the external clock signal extCLK. The reset signal RST from the delay circuit 26 is in an inactive state at all times since refresh request φreq is fixedly in an inactive state. Accordingly, the block latch circuit 12 latches an output signal of the block decode circuit 13 generated based on row address bits supplied through the multiplexer 17b for a period of one clock cycle according to the internal clock signal CLKR.

Figure 6:
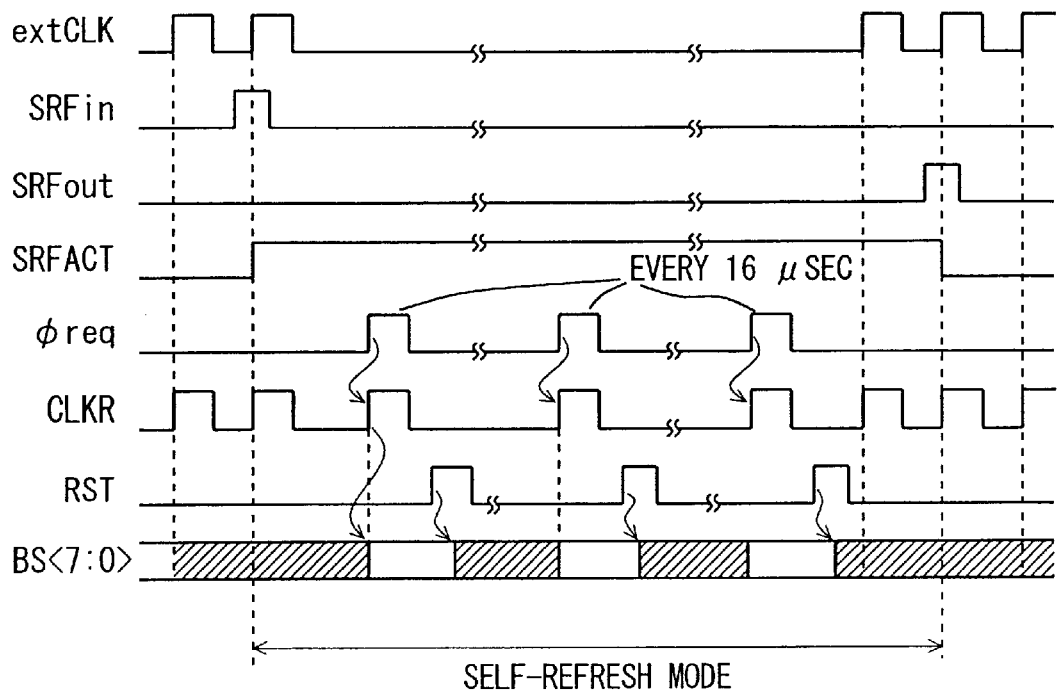
FIG. 6 is a timing chart representing operations in the address generating section shown in FIG. 5.

Next, description will be given of operation in the self-refresh mode of the row-related control circuit shown in FIG. 5 with reference to FIG. 6.

When self-refresh instructing command SRFin is supplied in synchronization with the external clock signal extCLK, the set/reset flip flop 20 is set and self-refresh activation signal SRFACT is activated. The self-refresh timer circuit 21 includes, for example, an oscillation circuit and a count circuit, and activates oscillation operation of the oscillation circuit and counts the number of oscillation signals to measure a refresh interval. After a prescribed time elapses, the self-refresh timer 21 activates the refresh request signal φreq. The multiplexers 17a and 17b are set to a state of selecting output count bits of the refresh address counter circuit 25 according to selection signal SEL form the OR circuit 27.

Accordingly, row address bits RA<8:0> and block selection signals BS<7:0> are generated based on the refresh address count value from the refresh address counter circuit 25.

The internal clock signal CLKR is generated from the OR circuit 11a in response to the refresh request signal φreq, and block selection signals BS<7:0> latched by the block latch circuit 12 are reset by reset signal RST from the delay circuit 26. A delay time that the delay circuit 26 has is a time period corresponding to a period of one clock cycle of the external clock signal extCLK. Hence, block selection signals BS<7:0> is kept in a latch state for a period corresponding to one clock cycle in the self-refresh mode as well.

Herein, in the normal access operation mode, states of block selection signals BS<7:0> change in response to external address bits extRE<11:9> in each clock cycle.

After a refresh operation is performed by refresh request signal φreq, that is, after block selection signals BS<7:0> are reset, the count-up instruction signal φc from the self-refresh timer circuit 21 is activated at an appropriate timing and responsively, a refresh address of the refresh address counter circuit 25 is incremented or decremented according to the output signal of the OR circuit 24.

Logic circuit such as an external processor is in the sleep mode during the self-refresh mode and generation of external clock signal extCLK is ceased. Even while generation of the external clock signal is ceased, by generating the internal clock signal CLKR according to the refresh request φreq, an internal clock signal is supplied to the bank control circuits to allow the row-related control signals activated in a prescribed period to be generated in the central row-related control circuit 1.

The refresh request φreq is activated, for example, at intervals of 16 μsec (micro seconds) in the self-refresh mode.

When the self-refresh mode is completed, self-refresh completion command SRFout is activated to reset the set/reset flip flop 20 and. self-refresh activation signal SRFACT is deactivated to force the self-refresh timer circuit 21 to cease a time measuring operation, whereby the self-refresh operation is terminated. When self-refresh mode is released, external clock signal extCLK is already generated and the self-refresh completion command SRFout is supplied in synchronization with the external clock signal extCLK. Since there is a possibility that self-refresh still continues to be performed internally even after release of the self-refresh mode, access to the semiconductor memory device is prohibited for a period of a prescribed number of clock cycles after the release of the self-refresh mode.

In the self-refresh mode as well, selection signal SEL supplied to the multiplexers 17a and 17b is set in a state of selecting a count bit value of the refresh address counter circuit 25 according to self refresh activation signal SRFACT, and therefore a block select signal is decoded prior to activation of refresh request φreq and additionally, row address bits RA<8:0> can be supplied to the spare determination circuit through the buffer circuit 14 and in the self-refresh mode, an operation similar to that in the normal access operation mode is ensured.

Figure 7:
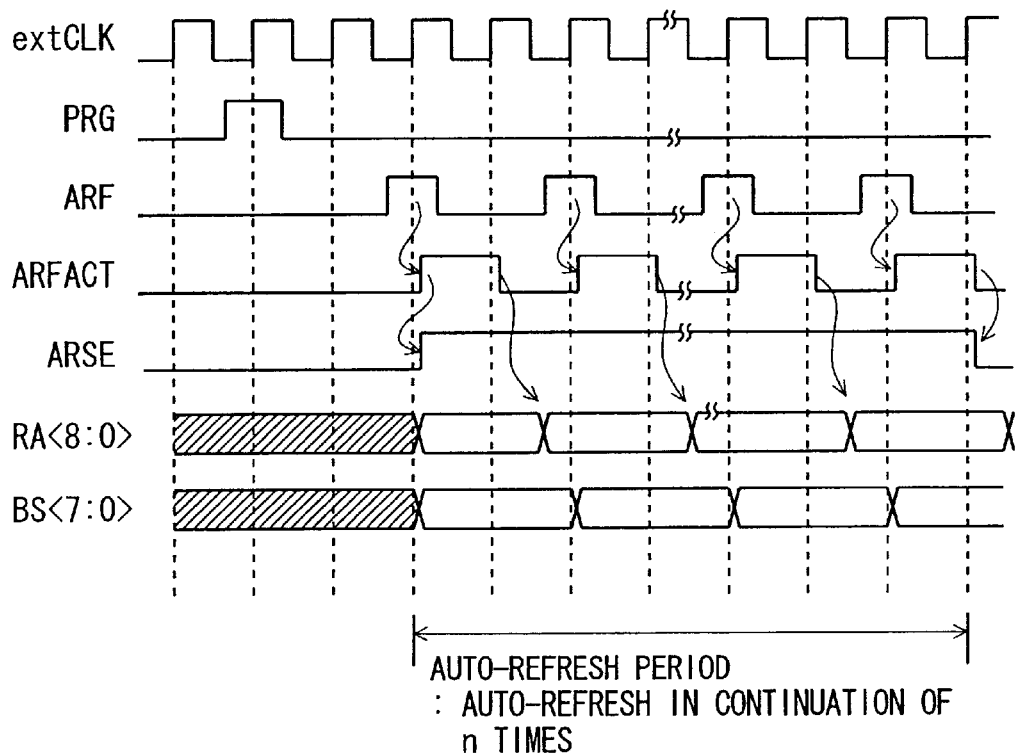
FIG. 7 is a timing chart representing operations in the auto-refresh mode of the address generating section shown in FIG. 5.

FIG. 7 is a timing chart representing operations of the row-related control circuit in the auto-refresh mode. Description will be given of operations in the auto-refresh mode below:

Auto-refresh is repeatedly performed n times successively. The number n of times of refresh is predetermined. First, precharge command PRG is supplied, prior to auto-refresh, to set the banks A and B to a precharged state. In a next cycle, a no-operation command NOP is supplied in order to restore the internal circuitry to a precharged state. In a further next cycle, the auto-refresh command ARF is supplied. When the auto-refresh command ARF is supplied, auto-refresh activation signal ARFACT from the one-shot pulse generating circuit 22 is activated for a prescribed period (for example, a period of one clock cycle). In response, the selection signal SEL is activated. The multiplexers 17a and 17b are so set as to select output count bits of the refresh address counter 25. Accordingly, when auto-refresh command ARF is applied first, row address bits RA<8:0> change in synchronization with the external clock signal extCLK (since a state of selection signal SEL is determined by application of the auto-refresh command).

Likewise, an output signal of the decode circuit 13 also becomes definite after activation of selection signal SEL. Therefore, block selection signals BS<7:0> from the block latch circuit 12 become definite in synchronization with the rise of external clock signal extCLK. The refresh request signal φreq continues to stay in a non-active state in the auto-refresh mode. When a refresh operation performed in response to auto-refresh activation signal ARFACT is completed and the auto-refresh activation signal ARFACT is deactivated, an output signal of the one-shot pulse generating circuit not shown attains H level, and responsively, an output signal of the OR circuit attains H level to increment or decrement a count value of the refresh address counter circuit 25. A state of row address bits RA<8:0> from the multiplexer 17a changes according to a change in output count bits of the refresh address counter circuit 25. On the other hand, although the output signal of the multiplexer 17b also changes, the block latch circuit 12 performs taking-in operation in synchronization with internal clock signal CLKR and the changed address bits are not taken-in, and therefore the block selection signals do not change their states.

When auto refresh command ARF is again supplied, auto-refresh activation signal ARFACT is again activated. At this time, since selection signal SEL is set so as to select output count bits of the refresh address counter circuit 25, the multiplexer 17a supplies row address bits RA<8:0> to the buffer 4 prior to rise of the clock signal extCLK (or CLKR). On the other hand, block selection signals BS<7:0> change in synchronization with the rise of a clock signal CLKR.

When auto-refresh is repeated n times successively, auto-refresh address selection activation signal ARSE from the auto-refresh selection control circuit 23 is deactivated, the selection signal is deactivated and the multiplexers 17a and 17b are set so as to select address bits extRA<8:0> and extRA<11:9> supplied externally.

Accordingly, although only in execution of a first auto-refresh operation, an address is delayed to be definite, and in the following executions of auto-refresh operation, address bits are already in a definite state prior to the rise of a clock signal extCLK, enabling execution of high speed auto-refreshing.

Figure 8A:
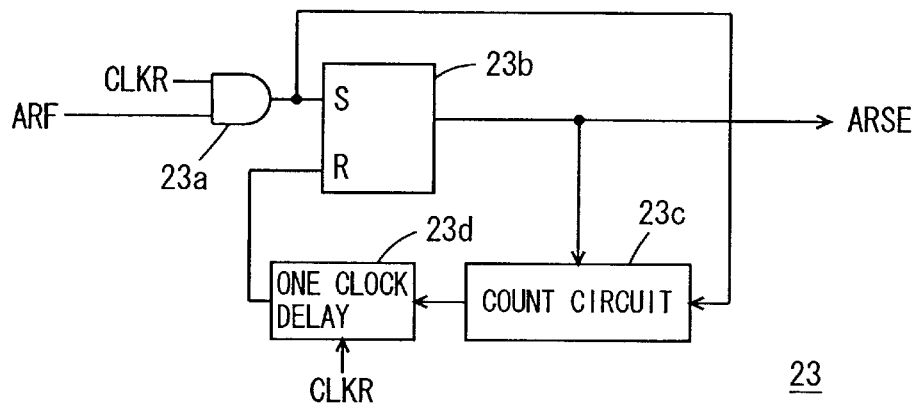
FIG. 8A represents an example of a configuration of an auto-refresh selection control circuit shown in FIG. 5.
Figure 8B:
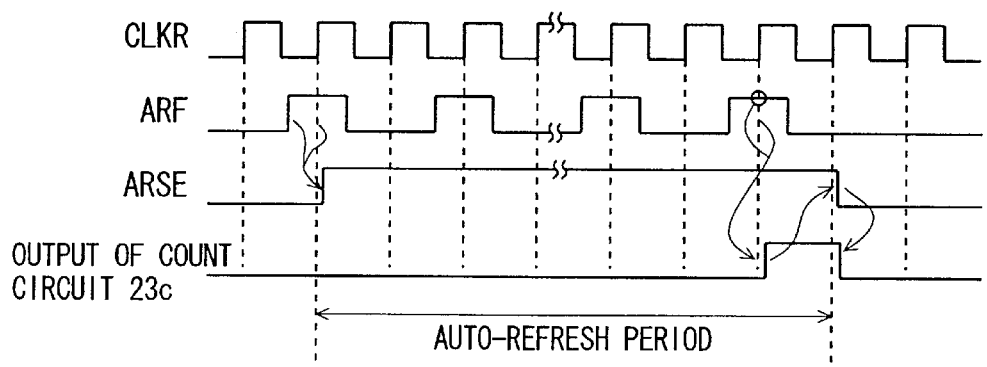
FIG. 8B is a timing chart representing operations of the circuitry shown in FIG. 8A.

FIG. 8A is a block diagram schematically showing a configuration of the auto-refresh selection control circuit 23 shown in FIG. 5. In FIG. 8, the auto-refresh selection control circuit 23 includes: an AND circuit 23a receiving an auto-refresh command ARF and an internal clock signal CLKR; a set/reset flip flop 23b set in response to the rise of an output signal of the AND circuit 23a to activate an auto refresh selection signal ARSE; a count circuit 23c activated, when an auto-refresh address selection activation signal ARSE is activated, to count the rise or fall of an output signal of the AND circuit; and a one-clock delay circuit 23d supplying a count-up instruction signal of the count circuit 23c with a delay of one clock cycle period of a clock signal CLKR to a reset input of the set/reset flip flop 23b.

The count circuit 23c activates a count-up instructing signal for application to the one clock delay circuit 23d when a count reaches a prescribed value. The one clock delay circuit is constituted of a shift register performing a shifting operation in synchronization with internal clock signal CLKR. Now, description will be given of operations in the auto-refresh selection control circuit 23 shown in FIG. 8A with reference to a timing chart shown in FIG. 8B.

When auto-refresh command ARF is first supplied, the output signal of the AND circuit 23a rises in response to the rise of internal clock signal CLKR, and responsively, the set/reset flip flop 23a is set and the auto-refresh address selection activation signal is activated to H level. The count circuit 23c is activated in response to activation of the auto-refresh address selection activation signal ARSE and counts the rises or falls of output signals of the AND circuit 23a. When the count circuit 23c counts the rises of the AND circuit 23a, the output signal of the AND circuit 23a is delayed to be supplied to the count circuit 23c in order to solve a racing problem in application of a first auto-refresh command. That is, after the auto-refresh address selection activation signal ARSE is activated, a signal supplied to the count circuit 23c rises.

When the count circuit 23c counts a prescribed count value, that is when a prescribed number (n times) of auto-refreshes to be performed in an auto-refresh period has been performed, the count-up instructing signal is activated. The one-clock delay circuit 23d delays the count-up instructing signal from the count circuit 23c by a period of one clock cycle, the set/reset flip flop 23b is reset when the auto-refresh period is over, the auto-refresh address selection activation signal ARSE is deactivated, and responsively, the count circuit 23c is reset.

Figure 9:
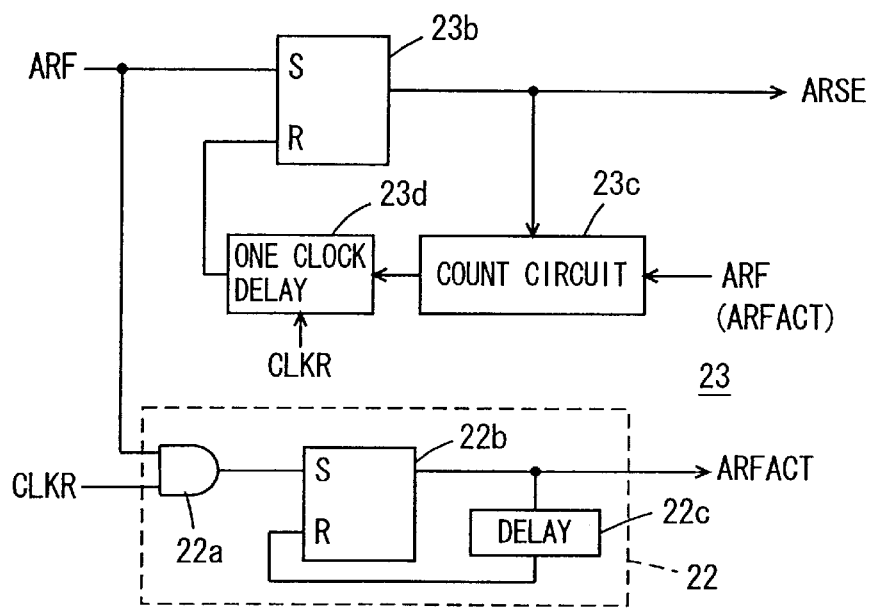
FIG. 9 is a block diagram schematically showing a configuration of an auto-refresh selection control circuit and a self-refresh timer circuit shown in FIG. 5.

First Example Modification of Auto-Refresh Selection Control Circuit:

FIG. 9 is a block diagram schematically showing a first modification of the auto-refresh selection control circuit shown in FIG. 5. In the auto-refresh selection control circuit 23 shown in FIG. 9, the auto-refresh command ARF is supplied to a set input of the set/reset flip flop 23b. The other part is the same in configuration as the corresponding part of FIG. 8A.

The one-shot pulse generating circuit 22 includes: an AND circuit 22a receiving auto-refresh command ARF and internal clock signal CLKR; a set/reset flip flop 22b set in response to the rise of an output signal of the AND circuit 22a; and a delay circuit 22c delaying an output signal of the set/reset flip flop 22b by a prescribed time. The auto-refresh activation signal ARFACT is outputted from the set/reset flip flop 22b. An output signal of the delay circuit 21c is supplied to the reset input R of the set/reset flip flop 22b.

Figure 10:
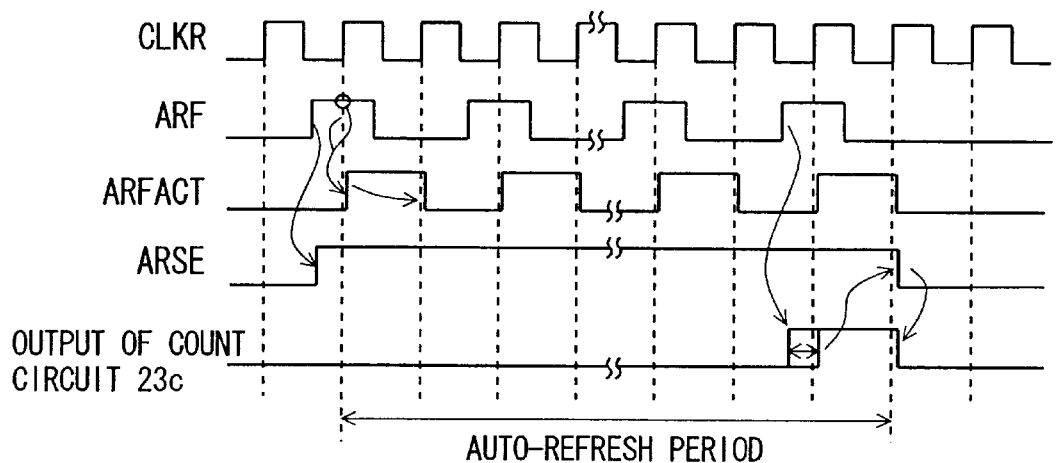
FIG. 10 is a timing chart representing operations of a circuit shown in FIG. 9.

In the configuration of the auto-reset selection control circuit 23 shown in FIG. 9, as shown in the timing chart of FIG. 10, when auto-refresh command ARF is activated, the set/reset flip flop 23b is set asynchronously with internal clock CLKR to activate the auto-refresh address selection activation signal ARSE. On the other hand, auto-refresh activation signal ARFACT from the one-shot pulse generating circuit 22 is activated to H level for a prescribed period in response to the rise of internal clock signal CLKR. Accordingly, auto-refresh address selection activation signal ARSE is already in an active state prior to activation of auto-refresh activation signal ARFACT and a refresh address can be made definite prior to execution of an auto-refresh operation.

It should be noted that, in a case of an embedded DRAM, as auto-refresh command ARF, a signal already decoded is supplied. When auto-refresh command is supplied in combination of a plurality of control signals, it is sufficient to decode an auto-refresh command composed of the plurality of control signals in asynchronization with the clock signal.

Accordingly, by activating the auto-refresh address selection activation signal ARSE in asynchronization with internal clock signal CLKR according to an auto-refresh command, definite timing of an address in an auto-refresh mode can be set at the same timing as that in the normal access operation mode (in application of a row act command).

It should be noted that in the count circuit 23c in the configuration shown in FIG. 9, auto-refresh activation signal ARFACT may be supplied instead of auto-refresh command ARF.

Figure 11:
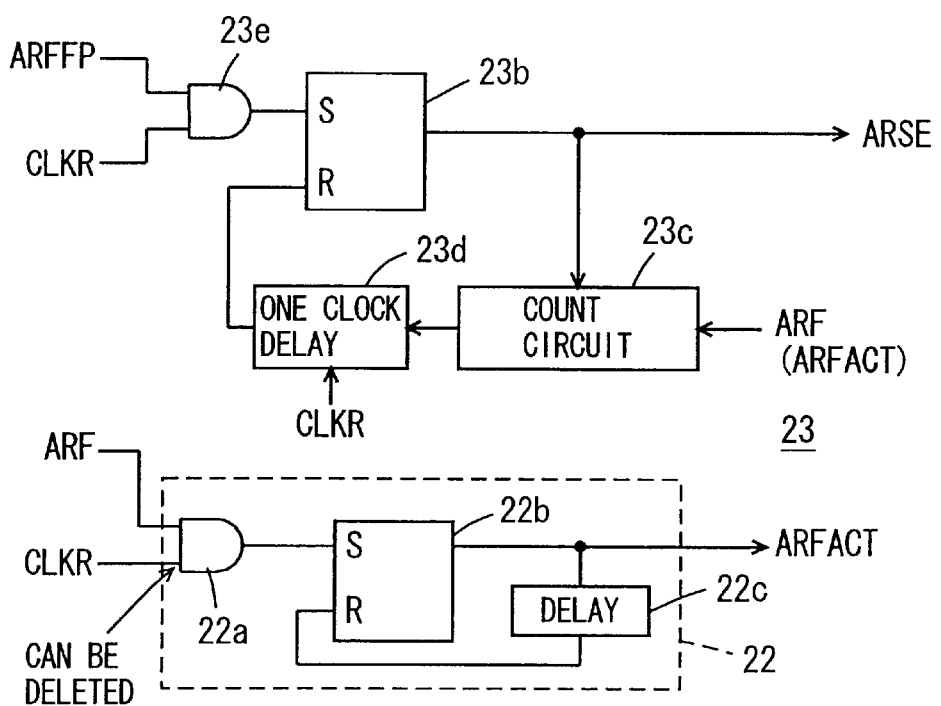
FIG. 11 is a block diagram showing a modification of the auto-refresh selection control circuit and self refresh timer circuit shown in FIG. 5.

Second Example Modification of Auto-Refresh Selection Control Circuit:

FIG. 11 is a block diagram schematically showing a configuration of the second modification of the auto-refresh selection control circuit shown in FIG. 5. In the auto-refresh selection control circuit 23 shown in FIG. 11, an output signal of an AND circuit 23e receiving an auto-refresh setting command ARFFP and an internal clock signal CLKR is supplied to a set/reset flip flop 23b. The other configuration is the same as that shown in FIG. 8A. Auto-refresh command ARF and internal clock signal CLKR are supplied to a one-shot pulse generating circuit 22 similarly to the configuration of FIG. 9, and an auto-refresh setting command ARFFP is additionally prepared.

Normally, as shown in FIG. 7, in the auto-refresh mode, precharge command PRG is first applied and thereafter a no-operation command NOP is supplied in a period of a following one-clock cycle. Auto-refresh setting command ARFFP is supplied instead of the no-operation command NOP to be supplied immediately before execution of auto-refresh.

Figure 12:
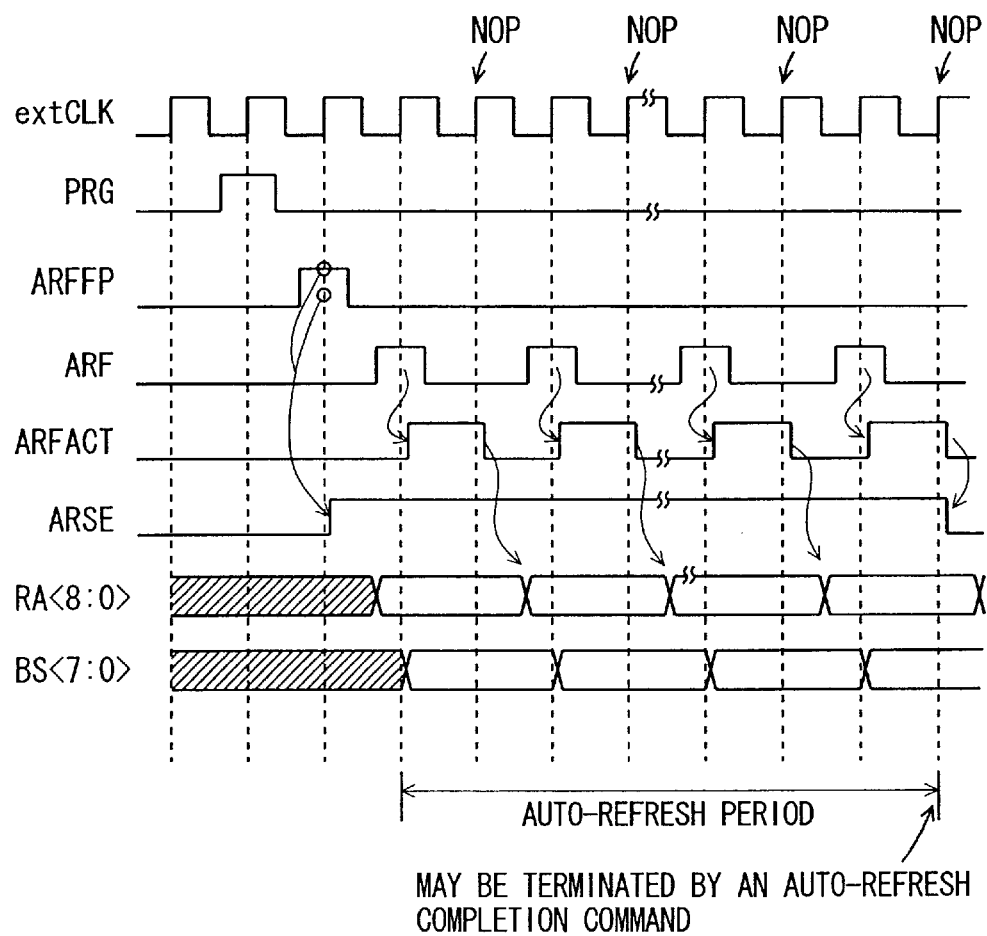
FIG. 12 is a timing chart representing operations of a circuit shown in FIG. 11.

FIG. 12 is a timing chart representing operations of the refresh address selection control circuit shown in FIG. 11. As shown in FIG. 12, precharge command PRG is supplied prior to execution of an auto-refresh and a bank is set into a non-selected state (an initial state). The auto refresh setting command ARFFP is supplied in a next clock cycle, following the precharge command PRG. The set/reset flip flop 3b is set by the auto-refresh setting command ARFFP and the auto-refresh address selection activation signal ARSE is activated to H level. Auto-refresh command ARF is supplied starting at a cycle next to a cycle in which the auto-refresh setting command ARFFP is applied. Auto-refresh activation signal ARFACT is activated by the auto-refresh command ARF.

Since auto-refresh address selection activation signal ARSE is already in a selected state (an active state) prior to application of auto-refresh command ARF; therefore when auto-refresh command ARF is first supplied, a refresh address is already selected, and row address bits RA<8:0> supplied to an address buffer according to the refresh address are in a definite state. Block selection signals BS<7:0> enter a definite state in synchronization with internal clock signal CLKR by the block latch circuit. Therefore, in the case where auto-refresh is successively repeated in any auto-refresh cycle, a refresh address is already in a definite state prior to execution of a refresh operation. Thus, in any auto-refresh cycle, internal row address bits can be always driven into a definite state at the same timing as in the normal access operation mode (when a row access command is applied).

The count circuit 23c counts auto-refresh commands ARFs or auto-refresh activation signals ARFACTs, and when a prescribed count value is reached, the count circuit 23c generates a count-up instructing signal. Responsively, the set/reset flip flop 23b is reset by the one clock delay circuit 23d and auto-refresh address selection activation signal ARSE is deactivated.

While auto-refresh setting command ARFFP is utilized, auto-refresh setting command ARFFP is merely supplied instead of a conventional no-operation command NOP; therefore the number of clock cycles required for transition to auto-refresh mode does not increase.

It should be noted that the set/reset flip flop 23b may be set/reset using the auto-refresh setting command ARFFP and the auto-refresh completion instructing command. In this case, the one clock delay circuit 23b and the count circuit 23c are omitted, thereby reducing a circuit scale.

Figure 13:
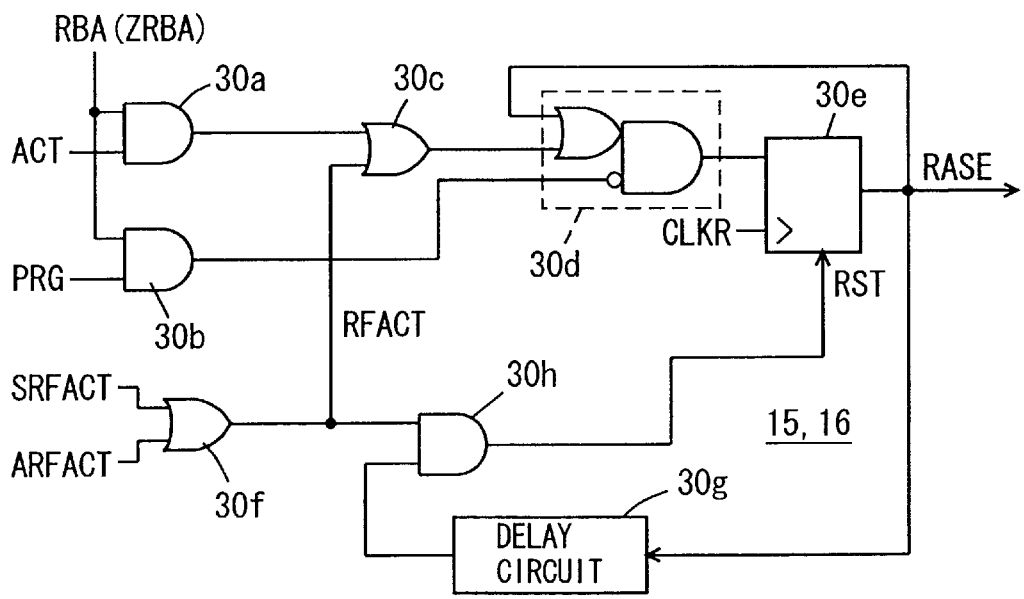
FIG. 13 is a block diagram representing a configuration of a bank control circuit shown in FIG. 5.

Configuration of Bank Control Circuits 15 and 16:

FIG. 13 is a block diagram representing a configuration of the bank A control circuit and the bank B control circuit shown in FIG. 2. The bank A control circuit 15 and the bank B control circuit 16 have the same configuration as each other except for bank address signals supplied thereto, and therefore, one of the bank control circuits is shown in FIG. 13.

In FIG. 13, the bank control circuit includes: an AND circuit 30a receiving a bank address signal RBA (or ZRBA) and an active command ACT instructing a row access; an AND circuit 30b receiving a bank address RBA (or ZRBA) and a precharge command PRG; an OR circuit 30f receiving a self-refresh activation signal SRFACT and an auto-refresh activation signal ARFACT; an OR circuit 30c receiving an output signal of the AND circuit 30a and an output signal of the OR circuit 30f; a composite gate receiving an output signal of the OR circuit 30c and an output signal of the AND circuit 30b; and an up-edge trigger latch circuit 30e taking in an output signal of the composite gate 30d at the rise of an internal clock signal CLKR to generate a bank activation signal RASE. The composite gate 30d functionally includes: an OR circuit receiving bank activation signal RASE and an output signal of the OR circuit 30c; and a gate circuit receiving an output signal of the OR circuit 30c and an output signal of the AND circuit 30b. When one of bank activation signal RASE and the output signal of the OR circuit 30c is at H level and the output signal of the AND circuit 30b is at L level, a signal at H level is outputted from the composite gate 30d.

The bank control circuit further includes: a delay circuit 30g delaying the bank activation signal RASE by a pre-scribed time; and an AND circuit 30h receiving the output signal of the OR circuit 30f and the output signal of the delay circuit 30g to generate a reset signal RST to the up edge trigger latch circuit 30e. The delay circuit 30g has a delay time, by which an output signal thereof rises after activation of a sense amplifier activation signal responsive to activation of bank activation signal RASE. In the refresh mode, after a sense amplifier operates and a restore operation of a memory cell data is performed, the bank activation signal RASE is reset by reset signal RST.

That is, the output signal of the delay circuit 30g is activated, after a memory cell row is selected, a sense operation is performed and restoring of a data to a memory cell is performed, to complete refresh of a memory cell data. In response to activation of bank activation signal RASE, various row-related control signals such as RXLATCH, RXT and RADE are activated.

Figure 14A:
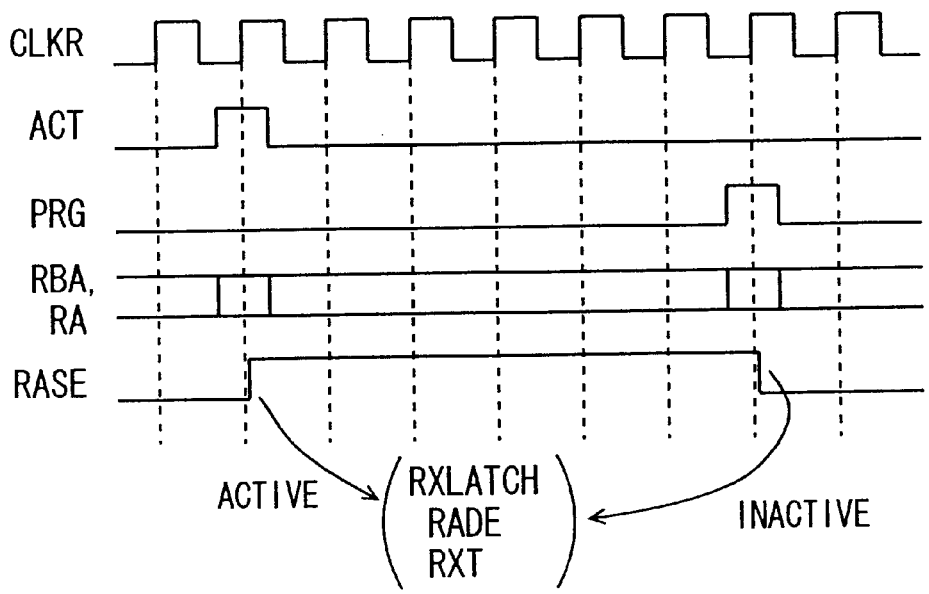
FIGS. 14A to 14C are timing charts representing operations of the bank control circuit shown in FIG. 13.

FIG. 14A is a timing chart representing operations in a normal access operation mode of the bank control circuit shown in FIG. 13. In the normal access operation mode, when active command ACT is supplied, the row bank address signal RBA (or ZRBA) supplied at that time is activated, internal clock signal CLKR rises to H level and bank activation signal RASE from the up edge trigger latch circuit 30e is driven to the active state at H level. The row-related control signals RXLATCH, RADE and RXT are activated in a prescribed sequence in response to activation of the bank activation signal RASE.

A row address signal RA is already in a definite state prior to activation of the bank activation signal RASE.

When a precharge command PRG is supplied, an output signal of the AND circuit 30b attains H level at this time or in response to the bank address signal RBA and the output signal of the composite gate 30b attains L level. Therefore, bank activation signal RASE falls to L level in response to the rise of internal clock signal CLKR, and row-related control signals RXLATCH, RADE and RXT are deactivated again in a prescribed sequence.

In the normal access operation mode, reset signal RST is normally kept in an inactive state since the output of the OR circuit 30f is at L level. Therefore, activation/deactivation of a bank can be controlled according commands ACT and PRD supplied externally.

Figure 14B:
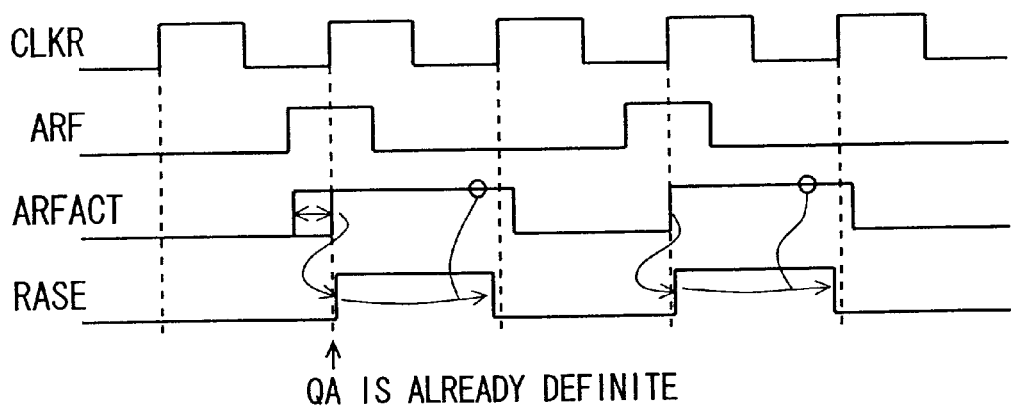

FIG. 14B is a timing chart representing operations in the auto-refresh mode of the bank control circuit shown in FIG. 13. As shown in FIG. 14B, when auto-refresh command ARF is supplied, auto-refresh activation signal ARFACT is activated for a prescribed period in synchronization with the rise of internal clock signal CLKR. When the auto-refresh activation signal ARFACT rises to H level, an output signal of the OR circuit 30c attains H level and bank activation signal RASE is activated at the rise of an internal clock signal CLKR. At this time, a refresh address QA is already in a definite state and therefore, an internal operation can be executed immediately. After a prescribe time elapses from activation of the bank activation signal RASE, an output signal of the delay circuit 30a attains H level and in response, reset signal RST is activated and bank activation signal RASE is deactivated to L level. Accordingly, in the auto-refresh mode, a row selection period, that is, a bank activation period, is determined internally by a delay time that the delay circuit 30g has.

It should be noted that the auto-refresh activation signal ARFACT may be generated in a one-shot pulse form in response to auto-refresh command ARF in asynchronization with internal clock signal CLKR. The latch circuit 30e can take in an output signal of the composite gate 30d with a sufficient margin in latch timing, and can latch the output signal of the composite gate 30d at the same timing as those in application of active command ACT and precharge command PRG.

Figure 14C:
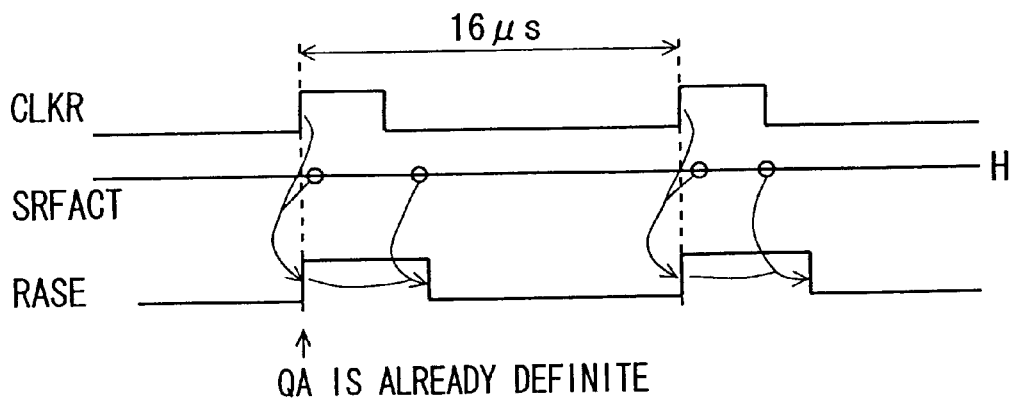

FIG. 14C is a timing chart representing operations in the self-refresh mode of the bank control circuit shown in FIG.

13. In the self-refresh mode, the internal clock CLKR is, as shown in FIG. 14C, generated in response to a refresh request signal φreq. When the internal clock signal CLKR rises to H level, self refresh activation signal SRFAT is already in the active state at H level. Therefore, refresh activation signal RFACT from the OR circuit 30f is held at H level during a period of a self-refresh mode. When a refresh request is issued, internal clock signal CLKR rises to H level in response to the request and bank activation signal RASE attains H level. When a refresh operation is performed for a prescribed period, the output signal of the delay circuit 30g attains H level, and in response, reset signal RST from the AND circuit 30h attains H level, and bank activation signal RASE is deactivated.

In the self-refresh mode, the multiplexer already selects a refresh address QA in response to self-refresh activation signal SRFACT, and the refresh address QA is already in a definite state prior to issuance of a refresh request. Therefore, in the self-refresh mode as well, the internal circuitry can perform an internal operation from the rise of internal clock signal CLKR at timings similar to those in the normal access operation mode and the auto-refresh mode.

It should be noted that in the configuration of the bank control circuit shown in FIG. 13, bank activation signal RASE is activated in the refresh mode commonly to the banks A and B. When a self-refresh operation is individually performed on each bank, active command ACT and the output signal of the OR circuit receiving the refresh request signal φreq are supplied to the AND circuit 30a, while only auto refresh activation signal ARFACT is supplied to the OR circuit 30c. When auto-refresh is performed on a bank by bank basis, a bank address to specify a bank on which auto-refresh is performed in the auto-refresh mode is externally supplied. Further, such a procedure may be employed that the refresh address counter generates a bank address to alternatively specify the banks A and B, for performing refreshes.

Figure 15:
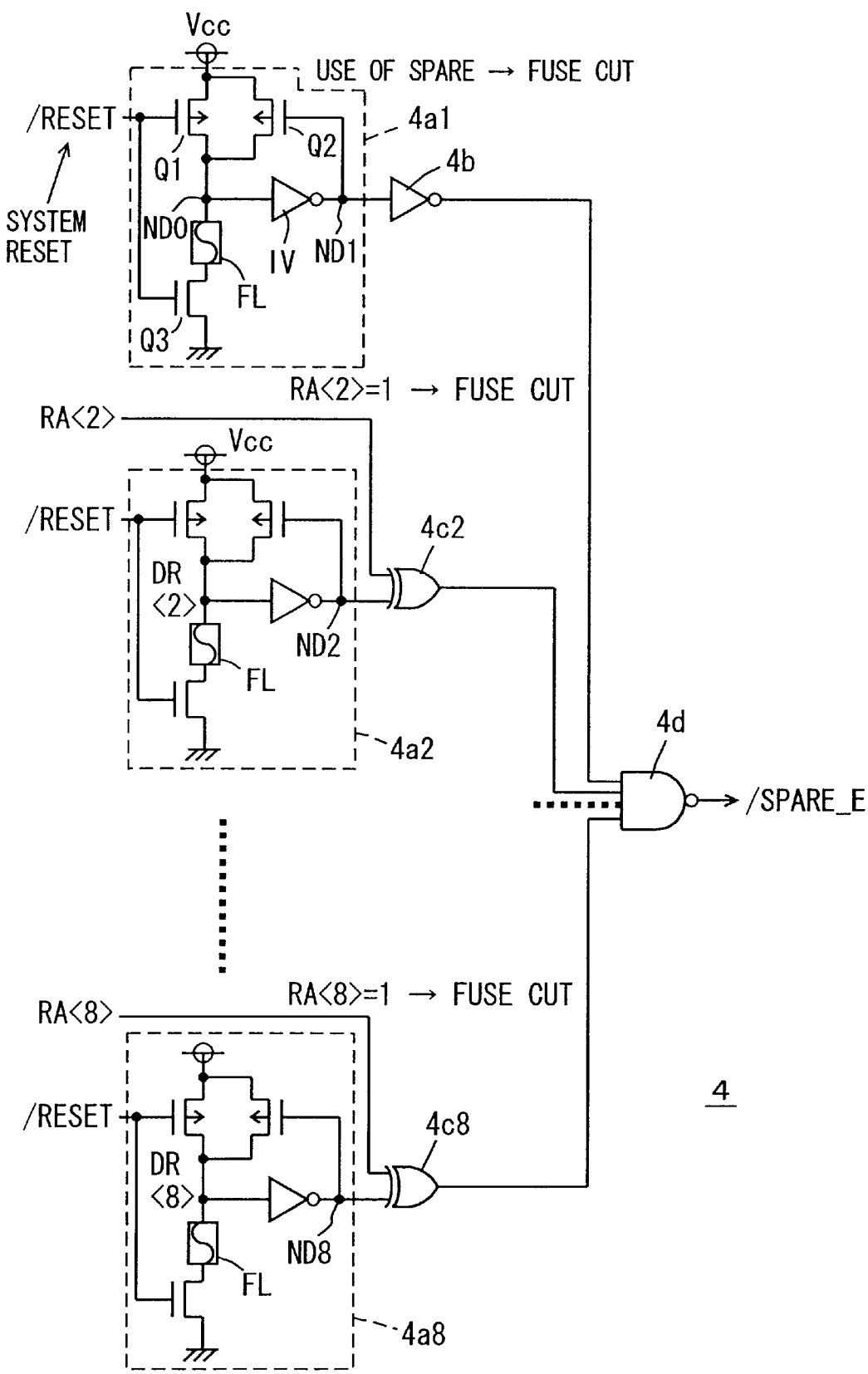
FIG. 15 is a circuit diagram showing a configuration of a spare determination circuit shown in FIG. 1.

Configuration of Spare Determination Circuit:

FIG. 15 is a circuit diagram showing a configuration of the spare determination circuit shown in FIGS. 1 and 3. In FIG. 15, a spare determination circuit 4 includes: a fuse program circuit 4a1 indicating use/non-use of a spare circuit; fuse program circuits 4a2 to 4a8 provided corresponding to respective row address bits RA<2> to RA<8>; an inverter 4b inverting an output signal of the fuse program circuit 4a1; an EXOR circuits 4c2 to 4c8 for detecting non-coincidence between outputs of the fuse program circuits 4a2 to 4a8 and the respective row address bits RA<2> to RA<8>; and a NAND circuit 4d receiving an output signal of the inverter 4b and an output signals of the EXOR circuits 4c2 to 4c8 to generate a spare determination result indicating signal /SPARE_E.

The fuse program circuits 4a1 to 4a8 are of the same configuration, and in FIG. 15, reference numerals are attached to constituent elements of the fuse program circuit 4a1 only. The fuse program circuit 4a1 includes: a P channel MOS transistor Q1, made conductive in response to a reset signal /RESET activated upon system reset or power on, for charging a node ND0 to a power voltage Vcc level; a fuse element FL connected to the node ND0; an N channel MOS transistor connected between the fuse element FL and a ground node, and receiving reset signal /RESET at a gate thereof: an inverter IV inverting a signal of the node ND0; and a P channel MOS transistor Q2 made conductive, when an output signal of the inverter IV is at L level, to charge the node ND0 to the power voltage Vcc level. With row address bits RA<2> to RA<8>, one main word line is specified.

Next, brief description will be given of operations in the spare determination circuit.

When no defective memory cell row is present, the fuse element in the fuse program circuit 4a1 is kept in a conductive state while a defective memory cell row is present, the fuse element FL is blown off in the fuse program circuit 4a1. When reset signal /RESET is activated to L level, the MOS transistor Q1 becomes conductive and the node ND0 is precharged to the power voltage Vcc level (the MOS transistor Q3 is in a non-conductive state). When a reset operation is completed, the MOS transistor Q1 is turned off while the MOS transistor Q3 is turned on. When the fuse element has been cut off (blown), the node ND0 is held at the power voltage Vcc level by the inverter IV and the MOS transistor Q2. When the fuse element FL is in a non-blown state, the node ND0 is discharged down to the ground voltage level. Responsively, an output signal of the inverter IV attains H level and the MOS transistor Q2 is turned off.

When no defective memory cell row is present and therefore, no spare circuit (spare main/sub word lines) is used, the fuse element is in the non-blown state, the node ND0 is at the ground voltage level, and an output signal of the inverter 4b attains L level. Hence, spare determination result indicating signal /SPARE_E from the NAND circuit 4d stays fixedly at H level and no spare circuit is used.

When a spare circuit is used, the fuse element Fl is blown off and the node ND0 attains the power voltage Vcc level and the output signal of the inverter 4b attains H level. In this case, the NAND circuit 4d operates as an inverter buffer and spare determination result indicating signal /SPARE_E attains L level or H level according to whether or not the row address bits RA<2> to RA<8> specify a defective row address.

In the fuse program circuits 4a2 to 4a8, when corresponding defect row address bits RA<2> to RA<8> are at "1" (H level), corresponding fuse elements are blown off. In the fuse program circuit 4a2 to 4a8, fuse elements FL are selectively blown off according to a row address of a defective bit, programming a defect bit address.

The EXOR circuits 4c2 to 4c8 each operate as a non-coincidence detecting circuit. When a bit of a corresponding row address is "1" (H level), the fuse element FL is blown off, and therefore a corresponding output node Ndi attains L level, where i=2 to 8. That is, by the action of fuse element FL, a voltage level of the node connected to the fuse element FL attains a logic level corresponding to a defective row address bit, and an inverted address of the programmed defective row address appears at the nodes ND2 to ND8. Accordingly, when supplied row address bits RA<2> to RA<8> are all inversions in logic level of the respective signals at the nodes ND2 to ND8, it means that the defect address programmed by the fuse elements FL and the supplied row address of address bits RA<2> to <8> coincide with each other. In this case, signals, all being at H levels, are outputted from the EXORA circuits 4c2 to 4c8 and responsively, spare determination result indicating signal /SPARE_E from the NAND circuit 4d attains L level, a defect address is specified, and it is indicated that defect bit repairing is required.

When the row address bits RA<2> to <8> specify an address different from the defective bit address, one of the EXOR circuits 4c2 to 4c8 outputs a signal at L level indicating coincidence and responsively, spare determination result indicating signal /SPARE_E attains H level. Thus, a spare determination can be effected.

It should be noted that various modifications can be applied to the spare determination circuit shown in FIG. 15.

The fuse element may be blown off when a corresponding defect address bit is "0" (L level). In this case, EXNOR circuits are used instead of the EXOR circuits 4c2 to 4c8. The output nodes ND2 to ND8 of the fuse program circuits 4a2 to 4a8 attain the logic levels corresponding to the respective defective row address bits DR<2> to <8>, and coincidence determination is performed between the address bits RA<2> to <8> and the defective row address bits DR<2> to DR<8>.

In the spare determination circuit shown in FIG. 15, spare determination is performed using address bits RA<8:2>. Address bits RA<2> to RA<8> are supplied in asynchronization with a clock signal and spare determination can be performed at the same timing both in application of row active command and in application of auto-refresh command. Further, in execution of self-refresh, spare determination is likewise effected prior to execution of an internal row selecting operation. Accordingly, all timings in spare determinations can be the same regardless of operating modes, and therefore, the timings in an internal operation can coincide regardless of a kind of an operating mode, and there is no necessity of changing timings in an internal operation according to an operating mode, which makes a circuit configuration simple.

As described above, according to the first embodiment of the present invention, as for an internally generated address, in the auto-refresh mode, a new internal refresh address is generated and supplied to row address decode related circuitry at completion of a refresh cycle preceding a current refresh cycle, and therefore, address decode start (word line selecting operation start) timings can be the same with each other both in the normal access operation mode and in the auto refresh mode. Accordingly, a cycle time required for auto-refresh is shorter and responsively, an operating frequency in the normal operating mode including the auto-refresh mode of a semiconductor memory device can be improved.

Second Embodiment

FIG. 16A is a diagram schematically showing a configuration of a memory array section of a semiconductor memory device according to the second embodiment of the present invention. In FIG. 16A, a memory array includes: a plurality of row blocks RB#0 to RB#7 disposed aligned in a column direction; sense amplifier bands SAB#1 to SAB#7 disposed between adjacent two of the row blocks RB#0 to RB#7, respectively; sense amplifier bands SAB#0 and SAB#8 disposed outside the row blocks RB#0 and RB#7, respectively; and a main word line driver band MWDB including main word line drivers for driving main word lines to select ed states in the row block RB#0 to RB#7.

Each of the row blocks RB#0 to BR#7 are divided into a plurality of memory sub-arrays MSA. Memory sub-arrays MSA aligned in a column direction constitute a column block CB#. In FIG. 16A, the memory array is divided into column blocks CB#0 to CB#7. In each of the row blocks RB#0 to RB#7, a main word line MWL is placed extending in a row direction, and in each of the memory sub-arrays MSA, a sub-word line SWL is placed corresponding to a memory cell row. The row blocks RB#0 to RB#7 are selected by respective block selection signals BS<0:7>.

In the normal operating mode (including the auto-refresh mode), as shown in FIG. 16B, one row block RB#i is treated as an activation unit. That is, in the normal mode (including the auto-refresh mode), one of the row block RB# to RB7 is selected by block selection signals BS<0:7> and a row selection operation is performed in a selected row block.

On the other hand, when self-refresh is performed in the data holding mode, as an activation unit is, as shown in FIG. 16C, a memory sub-array MSA is the activation unit and a prescribed number of memory sub-arrays are activated. In FIG. 16C, a configuration is shown in which one memory sub-array is used as the activation unit in the data holding mode.

In the data holding mode, self-refresh is executed. In an operation of the data holding mode, a data region whose data is required to hold is a part of an entire memory array. A refresh operation is performed only in a data region whose data is required to hold. Refresh is not required on all the row blocks RB#0 to RB#7, and refresh operation is performed on a prescribed number of row blocks. Therefore, the number of times of selection of word lines can be reduced, thereby enabling an average operating current in the refresh operation to reduce.

Further, in the data holding mode, by performing refresh with sub-word lines of a part of a main word line being a unit, the number of sense amplifier circuits activated simultaneously is reduced, thereby enabling a current consumed in the data holding to further reduce.

Figure 17:
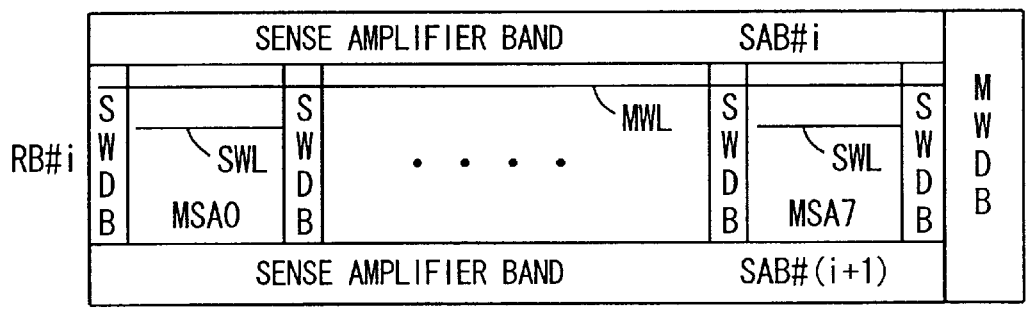
FIG. 17 is a diagram showing, in a simplified manner, a configuration of a row block of the second embodiment of the present invention.

FIG. 17 is a diagram showing schematically a configuration in one row block RB#i of a memory array shown in FIG. 16A. A row block RB#i is divided into a plurality of memory sub-arrays MSA0 to MSA7. Sense amplifier bands SAB#i and SAB#i+1 are placed on both sides, in a column direction, of the row block RB#i. Sense amplifier circuits included in the sense amplifier band SAB#i (and SAB#i+1) are shared sense amplifier circuits and shared between adjacent row blocks on both sides thereof in the column direction. A main word line MWL is placed extending in a row direction in common to the memory sub-arrays MSA0 to MSA7 of the row block RB#i. Sub-word lines SWL are provided in each of the memory sub-arrays MSA0 to MSA7.

In order to drive a sub-word line SWL to a selected state, sub-word line driver bands SWDB are provided in regions between adjacent two of the memory sub-arrays MSA0 to MSA7, and regions at the outer sides of the memory sub-arrays MSA0 and MSA7. In each of the sub-word line driver bands SWDB, there are provided sub-word line drivers driving corresponding sub-word lines SWL to selected states in accordance with a signal on a corresponding main word line MWL and sub-decode signals not shown.

Figure 18:
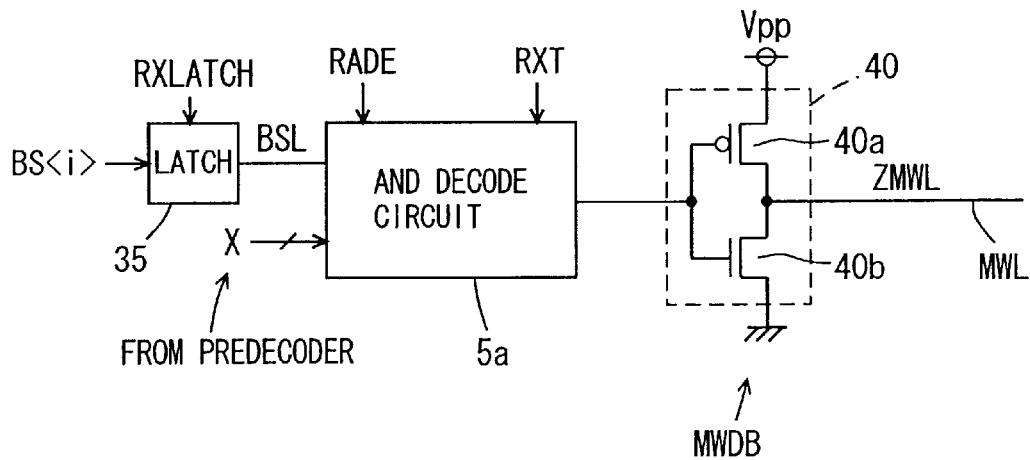
FIG. 18 is a block diagram schematically showing a configuration of a main word line drive section of a semiconductor memory device according to the second embodiment of the present invention.

FIG. 18 is a block diagram schematically showing a configuration of a part related to selection of a main word line. In FIG. 18, a main word line selecting section includes: a latch circuit 35 latching a block selection signal BS<i> in response to activation of a latch instructing signal RXLATCH; an AND decode circuit 5a receiving a latch block selection signal BSL from the latch circuit 35 and a predecode signal X from a predecoder not shown, performing a decode operation in response to activation of a row address enable signal RADE and driving an output signal thereof based on a decode result according a word line activation timing signal RXT; and a main word line driver 40 transmitting a main word line drive signal ZMWL onto a main word line MWL according to an output signal of the AND decode circuit 5a. In a selected row block, the latch block selection signal BSL is activated and a decode operation is performed according to a predecode signal X from the predecoder. When row address enable signal RADE and word line activation timing signal RXT are both activated, an output signal of the AND decode circuit 5a enter the definite state. When a corresponding main word line is selected, the output signal of the AND decode circuit 5a attains H level.

A main word line driver 40 is placed in a main word line driver band MWDB shown in FIG. 17. The main word line driver 40 includes a P channel MOS transistor 40a and an N channel MOS transistor 40b, which constitute a CMOS inverter inverting an output signal of the AND decode circuit 5a. A high voltage Vpp is applied to a source of the P channel MOS transistor 40a.

When the main word line MWL is in a selected state, the MOS transistor 40b is turned on and a main word line drive signal ZMWL is driven to L level (the ground voltage level). On the other hand, when the main word line MWL is in a non-selected state, an output signal of the AND decode circuit 5a is at L level and the main word line drive signal ZMWL is held at the high voltage Vpp level. The high voltage Vpp is sufficiently higher than the power supply voltage, and a sub-word line driver described later is used to transmit the high voltage Vpp onto a sub-word line when the sub-word line is selected, and to surely hold a non-selected sub-word line at the ground voltage level.

Figure 19:
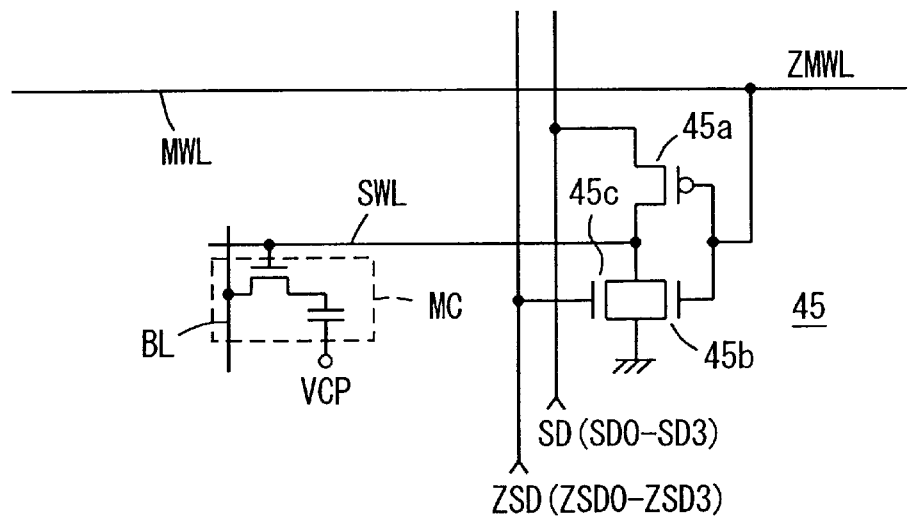
FIG. 19 is a block diagram representing a configuration of a sub-word line driver of the semiconductor memory device according to the second embodiment of the present invention.

FIG. 19 is a block diagram representing a configuration of a sub-word line driver. In FIG. 19, the sub-word line driver 45 includes: a P channel MOS transistor 45a receiving a sub-decode signal SD (one of SD0 to SD3) at a source thereof, and having a drain connected to a sub-word line SWL; an N channel MOS transistor 45b, made conductive when a main word line drive signal ZMWL is at H level, for discharging a sub-word line SWL down to the ground voltage level; and an N channel MOS transistor 45c made conductive to discharge the sub-word line SWL down to the ground voltage level when a complementary sub-decode signal ZSD (one of ZSD0 to ZSD3) is at H level. The sub-decode signal SD changes between the high voltage Vpp and the ground voltage level, and the complementary sub-decode signal ZSD changes between the power voltage Vcc and the ground voltage level. The sub-decode signals SD and ZSD are complementary to each other.

Memory cells MC disposed on one row in a corresponding sub-array are connected to a sub-word line SWL. In FIG. 19, one memory cell is shown as a representative. The memory cell MC includes: a capacitor storing information; and an access transistor connecting the capacitor to a corresponding bit line BL (or/BL) in response to a signal potential on a sub-word line SWL. A cell plate voltage VCP is applied to the memory cell capacitor.

In the sub-word line driver 45, when main word drive signal ZMWL is at H level, the MOS transistor 45b is turned while the MOS transistor 45a is turned off, and the sub-word line SWL is held at the ground voltage level regardless of a logic level of sub-decode signals SD and ZSD by the MOS transistor 45b.

When main word line drive signal ZMWL is at L level, a voltage level of the sub-word line SWL is determined by sub-decode signals SD and ZSD. When sub-decode signal SD is at H level (the high voltage Vpp level), the MOS transistor 45a is turned on, and a sub-decode signal SD at the high voltage Vpp level is transmitted onto the sub-word line SWL through the MOS transistor 45a. At this time, the complementary sub-decode signal ZSD is at L level and the MOS transistor 45c is in the off state. On the other hand, when sub-decode signal SD is at L level, the gate and source of the MOS transistor 45a are at the same voltage level and is kept in the off state. At this time, since complementary sub-decode signal ZSD is at H level, the sub-word line is discharged to the ground voltage level through the MOS transistor 45c. Accordingly, by using sub-decode signals SD and ZSD, a non-selected word line can be prevented from entering an electrically floating state.

Figure 20:
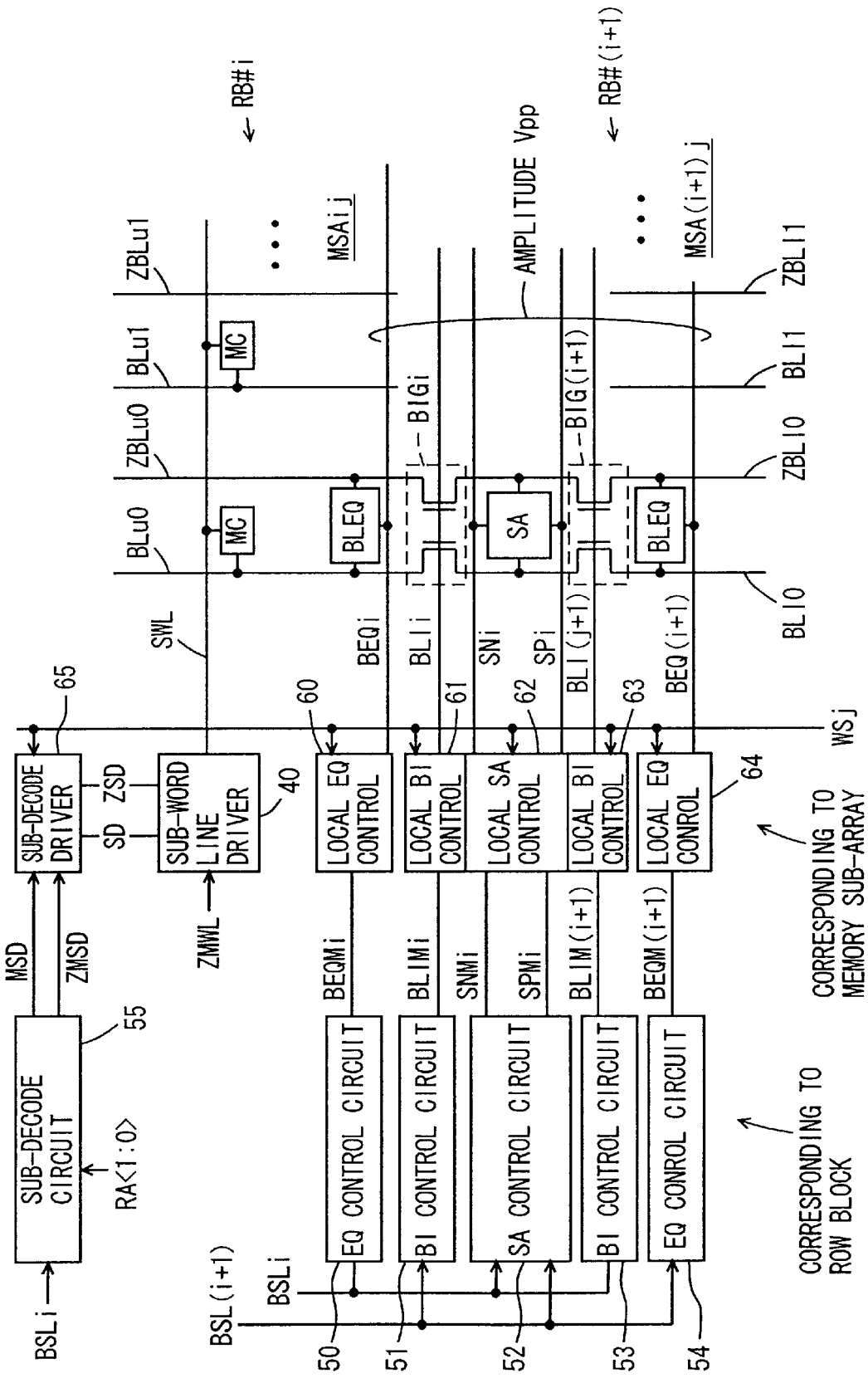
FIG. 20 is a block diagram schematically showing a configuration of row-related control circuitry of one row block of the semiconductor memory device according to the second embodiment of the present invention.

FIG. 20 is a block diagram schematically showing a configuration of a row-related control circuit for a memory sub-array. FIG. 20 shows a row-related control circuit provided for memory sub-arrays MSAij and MSA(i+1)j. In the memory sub-array MSAij, a pair of bit lines BL and ZBL is provided corresponding to a column of memory cells MC and a bit line equalize circuit BLEQ is provided to each pair of bit lines. In FIG. 20, there are shown two pair of bit lines Blu0 and ZBLu0, and BLU1 and ZBlu1 of a memory sub-array MSAij. Bit line equalize circuits BLEQ are disposed alternately on both sides of bit lines in the memory sub-array MSAij.

In memory sub-array MSA (j+1)j, too, pairs of bit lines BL10 and ZBL10, and BL11 and ZBL11 are provided corresponding to columns of memory cells.

The bit lines Blu0 and ZBlu0 are connected to a sense amplifier circuit SA through a bit line isolation gate BIGi and further the bit lines BL10 and ZBL10 are connected to sense amplifier circuit SA though a bit line isolation gate BIGj. On the other hand, the bit lines BLu1 and ZBLu1 are connected to a sense amplifier circuit shared by the memory sub-arrays MSAij and MSA (i–1)j through a bit line isolation gate not shown. The bit lines BL1 and ZBL11 are connected to a sense amplifier circuit commonly used by memory sub-arrays MSA (i+1)j and MSA (i+2)j through a bit line isolation gate not shown. Accordingly, sense amplifier circuits SA in the sense amplifier band are disposed on alternate columns.

A sub-word line driver 40 is provided to each of sub-word lines SWL of the memory sub-array MSAij. In the memory sub-array MSA(i+l)j, sub-word lines SWL and sub-word line drivers are arranged in a similar way.

The memory sub-array MSAij is included in the row block RB#i and the memory sub-array MSA(i+1)j is included in the row block RB#(i+1).

In order to control row-related peripheral circuits of the memory sub-array MSAij and memory sub-array MSA(i+1)j, an EQ control circuit 50 and a BI control circuit 51 are provided commonly to the memory sub-arrays of the row block RB#I, and a BI control circuit 53 and an EQ control circuit 54 are provided commonly to the memory sub-arrays of the row block RB# (i+1).

Further, a SA control circuit 52 is provided for sense amplifier circuits shared by the row block RB#I and the row block RB# (i+1).

The EQ control circuit 50 drives a main equalize instructing signal BEQMi at a prescribed timing to a non-selected state when a latch block selection signal BSLi is activated. The BI control circuit 51 sets an isolation instructing signal BLIMi to an isolation instructing state at L level when a latch block selection signal BSL (i+1) is in a selected state. The Bi control circuit 53 sets a main bit line isolation instructing signal BLIM(i+1) to L level when the latch block selection signal BSLi is in a selected state. The EQ control circuit 54 drives a main equalize instructing signal BRQM (i+1) to a non-selected state at a prescribed timing when a latch block selection signal BSL(i+1) is in a selected state. A SA control circuit 52 drives a main sense amplifier activation signal SNMi and SPMi to active states in prescribed timings when one of latch block selection signals BSLi and BSL (i+1) is driven to a selected state.

In the row blocks RB#i and RB#(i+1), when the row block RB#i is selected by the control circuits 50 to 54, the row block RB#(i+1) is isolated from a sense amplifier band. When the row block RB#(i+1) is selected by the control circuits 50 to 54, the row block RB#i is isolated from a sense amplifier band.

In each of intersection regions (cross bands) of the sub-word line driver bands and the sense amplifier bands, a local row control circuit is provided, which includes: a local EQ control circuit 60 receiving a main equalize instructing signal BEQMi from EQ control circuit 50 and a column block selection signal WSj to generate a local bit line equalize signal BEQi; a local BI control circuit 61 receiving a main bit line isolation instructing signal BLIMi from BI control circuit 51 and a column block selection signal WSj to generate a local bit line isolation signal BLIi; a local SA control circuit 62 receiving main sense amplifier activation signals SNMi and SPMi from SA control circuit 52 and column block selection signal WSj to generate local sense amplifier activation signals SNi and SPi; a local BI control circuit 63 receiving a main bit line isolation signal BLIM (i+1) from BI control circuit 53 and column block selection signal WSj to generate a local bit line isolation signal BLI (i+1); and a local EQ control circuit 64 receiving the main bit line equalize instructing signal BEQ (i+1) from an EQ control circuit 54 and column block selection signal WSj to generate a local bit line equalize signal BEQ (i+1).

The local bit line equalize signal BEQi from the local EQ control circuit 60 is supplied to the bit line equalize circuit BLEQ of the memory sub-array MSAij, and the local bit line isolation signal BLIi from the local BI control circuit 61 is supplied to the bit line isolation gate BIGi provided for the memory sub-array MSAij. Local sense amplifier activation signals SNi and SPi from the local SA control circuit 62 are supplied to the sense amplifier circuit SA commonly provided for the memory sub-arrays MSAij and MSA(i+1)j. A local bit line isolation signal BLI (i+1) from the local BI control circuit 63 is supplied to a bit line isolation gate BIG (i+1) provided for the memory sub-array MSA (i+1)j. A bit line equalize signal BEQ (i+1) from the local EQ control circuit 64 is supplied to a bit line equalize circuit BLEQ provided for the memory sub-array MSA(i+1)j.

Further, in the cross band, a sub-decode driver 65 is provided that modifies main decode signals MSD and ZMSD from the sub-decode circuit 55 according to column block selection signal WSj to generate sub-decode signals SD and ZSD for supply to the sub-word line driver 40.

When the local row-related control circuit is selectively activated/deactivated according to the column block selection signal WSj, the selective activation/deactivation can be performed on a memory sub-array basis. Each column block selection signal WSj is in a selected state in the normal operating mode (including the auto-refresh mode), while a column block selection signal for a necessary region is selectively driven to the selected state in the data holding mode. Now, detailed description will be given of the configuration of each component.

Figure 21:
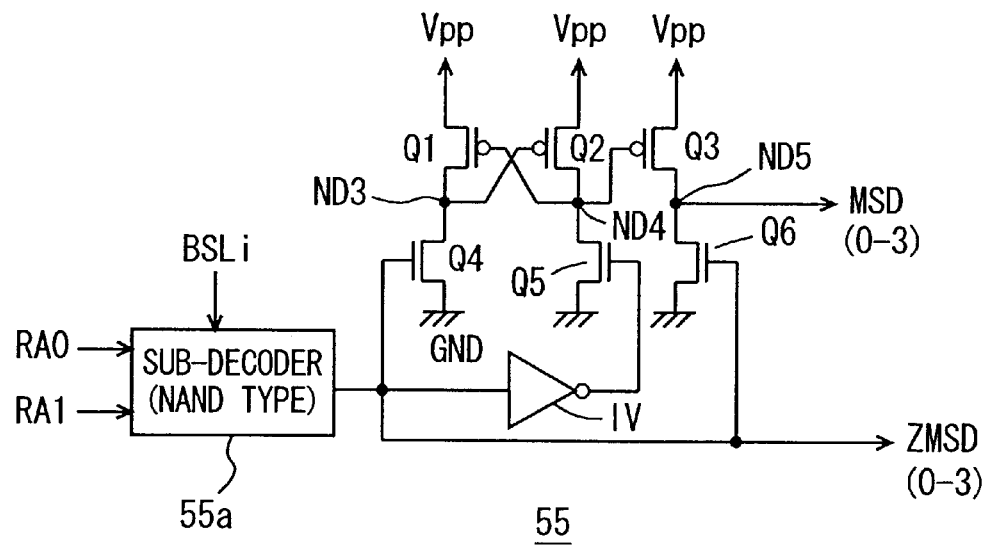
FIG. 21 is a block diagram representing a configuration of a sub-decode circuit shown in FIG. 20.

Configuration of Sub-Decode Circuit 55:

FIG. 21 is a block diagram schematically showing a configuration of the sub-decode circuit 55 shown in FIG. 20. In FIG. 21, the sub-decode circuit 55 includes: a (NAND) sub-decoder 55a activated, when a latch block selection signal BSLi is activated, to decode row address bits RA0 and RA1; and a level converting circuit for converting a level of an output signal of the sub-decoder 55a to generate a main sub-decode signal MSD (MSD0 to MSD3). A complementary main sub-decode signal ZMSD (ZMSD0 to ZMSD3) is generated from the (NAND) sub-decoder 55a.

The level converting circuit includes: an inverter IV inverting an output signal of the sub-decoder 55a; an N channel MOS transistor Q4, connected between a node ND3 and a ground node, and receiving an output signal (a complementary sub-decode signal ZMSD) of the sub-decoder 55a at a gate thereof; a P channel MOS transistor Q1 connected between a high voltage node and the node ND3, and having a gate connected to a node ND4; a P channel MOS transistor Q2, connected between the high voltage node and the node ND4, and having a gate connected to the node ND3; a P channel MOS transistor Q3 connected between a node ND5 and the high voltage node, and having a gate connected to the node ND4; an N channel MOS transistor Q5, connected between the node ND4 and the ground node, and receiving an output of the inverter IV at a gate thereof; and an N channel MOS transistor Q6, connected between the node ND5 and the ground node, and receiving a complementary sub-decode signal ZMSD from the sub-decoder 55a. A main sub-decode signal MSD is outputted from the node ND5.

The configuration shown in FIG. 21 is provided corresponding to each of the sub-decode signals MSD0 to MSD3. That is, 4 sub-word lines is provided corresponding to one main word line, and one of the 4 sub-word lines is selected by decoding row address bits RA0 (=RA<0>) and RA1 (=RA<1>). It should be noted that in the second embodiment, the row address bits RA0 and RA1 may be address bits in asynchronization with a clock signal or address bits taken-in in synchronization with an internal clock signal.

Alternatively, the sub-decoder 55a performs a decode operation in asynchronization with the clock signal and the decode result is transferred according to an internal block signal and a block selection signal to generate the sub-decode signal.

In the configuration shown in FIG. 21, the sub-decoder 55a is a NAND decoder and outputs a signal at L level when row address bits RA1 and RA1 are a predetermined combination of logic levels. When the sub-decoder 55a is selected (the row address bits RA0 and RA1 are in a state of a predetermined combination of logic levels), an output signal of the inverter IV attains H level, the MOS transistor Q5 is turned on, and the node ND4 is discharged down to the ground voltage level. Responsively, the MOS transistor Q1 becomes conductive, the node ND3 is charged to the high voltage Vpp level and in response, the P channel MOS transistor Q2 is turned off. When the node ND4 is discharged down to the ground voltage level, the P channel MOS transistor Q3 is turned on and a main sub-decode signal MSD outputted from the node ND5 attains H level at the high voltage Vpp level. At this time, the MOS transistor Q6 is in the off state by the action of a complementary main sub-decode signal ZMSD.

On the other hand, when the sub-decoder 55a in a non-selected state, a complementary main sub-decode signal ZMSD attains H level and the inverter attains L level. The MOS transistors Q4 and Q5 are turned on and the nodes ND3 and ND5 are discharged to the ground level. In response, the MOS transistor Q2 is turned on, the node ND2 is charged to the high voltage Vpp level and the MOS transistor Q3 is turned off. Consequently, in this state, main sub-decode signal MSD attains L level (the ground voltage level). Main sub-decode signals MSD and ZMSD from the sub-decoder 55a shown in FIG. 21 are transmitted to the sub-decode driver 65 provided in the row block RB#i.

Figure 22:
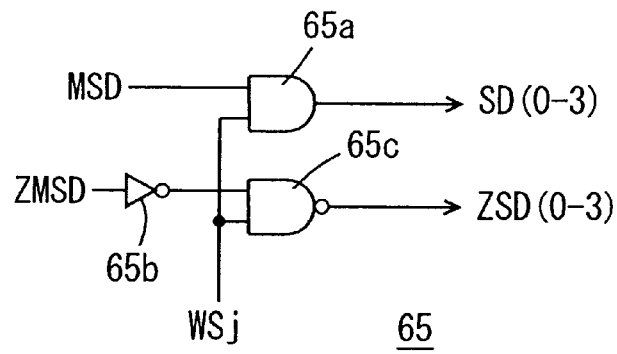
FIG. 22 is a circuit diagram representing a configuration of a sub-decode driver shown in FIG. 20.

Configuration of Sub-Decode Driver 65:

FIG. 22 is a circuit diagram representing a configuration of the sub-decode driver 65 shown in FIG. 20. In FIG. 22, the sub-decode driver 65 includes: an AND circuit 65a receiving a main sub-decode signal MSD and column block selection signal WSj to generates a local sub-decode signal SD (SD0 to SD3): an inverter 65b inverting a complementary main sub-decode signal ZMSD; and a NAND circuit 65c receiving an output signal of the inverter 65b and column block selection signal WSj to generate a complementary sub-decode signal ZSD (ZSD0 to ZSD3). The circuit shown in FIG. 22 is provided corresponding to each of the sub-decode signals SD0 to SD3.

When column block selection signal WSj is at H level, the AND circuit 65a operates as a buffer circuit and generates sub-decode signal SD based on main sub-decode signal MSD. On the other hand, the NAND circuit 65c operates as an inverter to generate the complementary sub-decode signal ZSD based on complementary main sub-decode signal ZMSD. When a column block selection signal is at L level, a sub-decode signal SD is at L level regardless of logic levels of main sub-decode signals MSD and ZMSD, and a complementary sub-decode signal ZSD attains H level. Consequently, sub-decode signals SD and ZSD in non-selected states are generated from the sub-decode driver 65, and all the sub-word lines SWL is kept in the non-selected state in the memory sub-array MSAij specified by the column block selection signal WSj. Accordingly, in the normal operating mode, each column block selection signal WSj is set to H level, while in the data holding mode, the column block selection signal WSj is selectively deactivated. In the data holding mode, sub-word lines can be driven to selected states in response to sub-decode signals MSD and ZMSD in necessary memory sub-arrays only.

Figure 23:
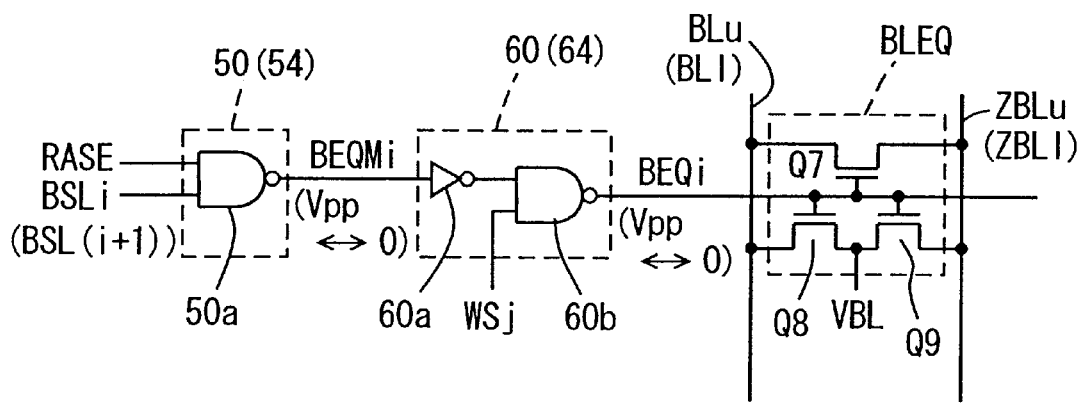
FIG. 23 is a circuit diagram representing a configuration of an EQ control circuit, a local EQ control circuit and a bit line equalize circuit shown in FIG. 20.

Configuration of Local EQ Control Circuits 60 and 64:

FIG. 23 is a circuit diagram representing a configuration related to bit line equalization. Configurations of bit line equalize control sections for the memory sub-arrays MSAij and MSA (i+1)j are the same as each other, except for associate block selection signals, and therefore, in FIG. 23, a configuration of a bit line equalization in common for the memory sub-arrays MSAij and MSA (i+1)j.

In FIG. 23, an EQ control circuit 50 (54) includes a NAND circuit 50a receiving a bank activation signal RASE and a latch block selection signal BSLi (BSL (i+1)). A main bit line equalize instructing signal BEQMi (or BEQM (i+1)) is generated from the NAND circuit 50a. The local EQ control circuit 60 (64) includes: an inverter 60a receiving a main bit line equalize instructing signal BEQMi (BEQM (i+1)); and a NAND circuit 60b receiving an output signal of the inverter 60a and a column block selection signal WSj. A local bit line equalize signal BEQi (BEQ (i+1)) is generated from the NAND circuit 60b.

The bit line equalize circuit BLEQ includes: N channel MOS transistors Q7, Q8 and Q9 made conductive in response to activation of a local bit line equalize signal BEQi. The MOS transistor Q7 electrically short-circuits bit lines Blu and ZBLu (or BL1 and ZBL1) when being conductive, and the MOS transistors Q8 and Q9 transmit a bit line precharge voltage VBL onto the bit lines Blu and ZBLu (BL1 and ZBL1) when being conductive.

When the row block RB#i is selected, latch block selection signal BSLi and bank activation signal RASE attain H level and a main bit line equalize instructing signal falls to L level. When column block selection signal WSj is at H level, the local EQ control circuit 60 operates as an inverter buffer circuit to generate the local bit line equalize signal BEQi in response to the main bit line equalize instructing signal BEQMi. Therefore, when the column block selection signal WSj is at H level in a selected row block, bit line equalize signal BEQi attains L level, the bit line equalize circuit BLEQ is deactivated and the bit lines BL and ZBL (representing bit lines generically) enter the floating states at an intermediate voltage VBL level. Responsively, the bit line equalize circuit BLEQ is activated to precharge the bit line BL and ZBL to the intermediate voltage VBL.

When the column block selection signal WSj is at L level, local bit line equalize instructing signal BEQi is kept at H level regardless of a logic level of main bit line equalize instructing signal BEQMi, and the bit line equalize circuit BLEQ is kept in an active state.

Consequently, in the normal operating mode (including the auto-refresh mode), column block selection signal WSj is set to a selected state, while in the data holding mode where no self-refresh is performed, column block selection signal WSj is selectively set to an active/inactive state. Thus, an equalize operation can be controlled on a memory sub-array basis.

It should be noted that amplitudes of signals BEQMi and BEQM (i+1) are at the high voltage Vpp level. By controlling the bit line equalize circuit BLEQ using the high voltage Vpp, a high speed bit line precharge operation is realized and further, even under a low power supply voltage, a bit line is reliably equalized to the intermediate voltage level with no adverse influence of a threshold voltage of the MOS transistors Q7 to Q9 of the bit line equalize circuit BLEQ.

Figure 24:
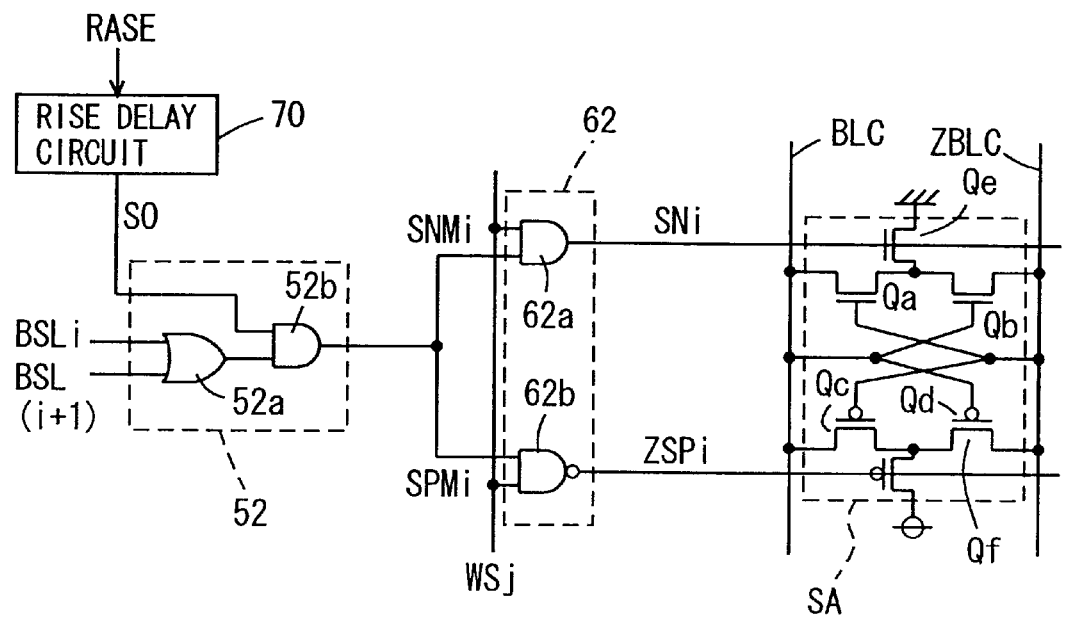
FIG. 24 is a block diagram representing a configuration of an SA control circuit, a local SA control circuit and a sense amplifier circuit combined shown in FIG. 20.

Configuration of Sense Amplifier Circuit:

FIG. 24 is a block diagram representing a configuration of a part related to control of a sense amplifier. In FIG. 24, a main sense amplifier activation instructing signal SO is generated from a rise delay circuit 70 delaying the rise of a bank activation signal RASE. The main sense amplifier activation instructing signal SO is commonly supplied to row blocks included in one bank.

The SA control circuit 52 includes: an OR circuit 52a receiving latch block selection signals BSLi and BSL (i+1); and an AND circuit 52b receiving an output signal of the OR circuit 52a and main sense amplifier activation instructing signal SO. Main sense amplifier activation signals SNMi and SPMi are generated from the AND circuit 52b. In order that activation timings of the main sense amplifier activation signals SNMi and SPMi are made different from each other, a buffer circuit for timing adjustment may be provided to the sense amplifier activation signal SPMi.

When one of the row blocks RB#i and RB# (i+1) is selected, an output signal of the OR circuit 52a attains H level. The AND circuit 52b generates sense amplifier activation signals SNMi and SPMi according to main sense amplifier activation instructing signal SO from the rise delay circuit 70. The main sense amplifier activation signal SNMi and SPMi are at L level in an inactive state.

The local SA control circuit 62 includes: an AND circuit 62a receiving a main sense amplifier activation signal SNMi and a column block selection signal WSi; and a NAND circuit 62b receiving a main sense amplifier activation signal SPMi and a column block selection signal WSj. A local sense amplifier activation signal SNi is outputted from the AND circuit 62a and a local sense amplifier activation signal ZSPi is outputted from the AND circuit 62b.

When column block selection signal WSj is at L level, local sense amplifier activation signal SNi is at L level, local sense amplifier activation signal ZSPi is at H level and the sense amplifier circuit SA is kept in an inactive state. When column block selection signal WSi is at H level, the AND circuit 62a generates the local sense amplifier activation signal SNi according to main sense amplifier activation signal SNMi. On the other hand, the NAND circuit 62b inverts main sense amplifier activation signal SPMi to generate the local sense amplifier activation signal ZSPi. Consequently, local sense amplifier activation signals SNi and ZSPi are at H level and L level, respectively, when being in active states.

The sense amplifier circuit SA includes: N channel MOS transistors Qa and Qb having their gates and drain cross-coupled; P channel MOS transistors Qc and Qd having their gates and drain cross-coupled; an N channel MOS transistor Qe made conductive in response to activation of a local sense amplifier activation signal SNi, for connecting the sources of the MOS transistors Qa and Qb to a ground no de; and a P channel MOS transistor Qf made conductive when local sense amplifier activation signal ZSPi is activated, and connecting the sources of the MOS transistors Qc and Qd to a power node when conductive.

In the sense amplifier circuit SA, when local sense amplifier activation signals SNi and ZSPi are at L level and H level, respectively, the MOS transistors Qe and Qf are in the off states and a sense operation is prohibited. On the other hand, when local sense amplifier activation signals SNi and ZSPi attains H level and L level, respectively, the MOS transistors Qe and Qf are turned on and the sources of the MOS transistors Qa and Qb are coupled to the ground node and one of the common bit lines BLC and ZBLC, which is lower in potential, is discharged to the ground voltage level. On the other hand, a common source node of the MOS transistors Qc and Qd are coupled to the power node and the other of the common bit lines BLC and ZBLC, which is higher in potential, is driven to the power supply voltage level. The common bit lines BLC and ZBLC are connected to corresponding bit lines of a selected memory sub-array through bit line isolation gates.

Figure 25:
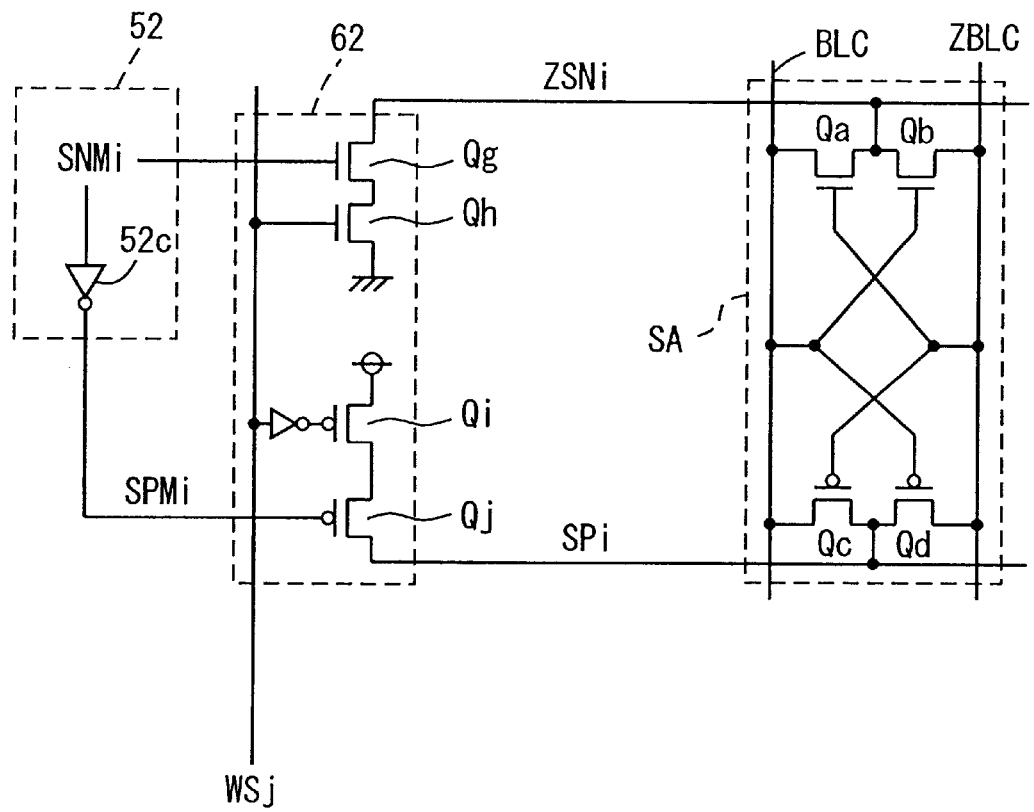
FIG. 25 is a circuit diagram representing a modification of the local SA control circuit shown in FIG. 20.

Example Modification of Sense Amplifier Section:

FIG. 25 is a circuit diagram representing a modification of the sense amplifier control section. In FIG. 25, a SA control circuit 52 generates a main sense amplifier activation signal SPMi by inverting a main sense amplifier activation signal SNMi with the inverter 52c. The SA control circuit 52 includes an OP circuit 52a and an AND circuit 52b, similarly to the configuration shown in FIG. 24.

The local SA control circuit 62 includes: N channel MOS transistors Qg and Qh connected in series between a sense power node and a ground node, and receiving a main sense amplifier activation signal SNMi and a column block selection signal WSj at the gates, respectively; and P channel MOS transistors Qi and Qj connected in series between a power node and a sense voltage line, and receiving an inverted signal of a column block selection signal WSj and a main sense amplifier activation signal SPMi at the gates, respectively. Local sense amplifier activation signals ZSNi and SPi are outputted from the local SA control circuit 62. The local sense amplifier activation signal ZSNi is at L level when activated and the local sense amplifier activation signal SPi is at H level when activated.

The sense amplifier circuit SA includes cross-coupled N channel MOS transistors Qa and Qb, and cross-coupled P channel MOS transistors Qc and Qd. The local sense amplifier activation signal ZSNi is transmitted to the sources of the MOS transistors Qa and Qb, and the local sense amplifier activation signal SPi is transmitted to the sources of the MOS transistors Qc and Qd. That is, in the sense amplifier circuit SA shown in FIG. 25, neither of the transistors Qe and Qf is provided for sense amplifier activation.

The local SA control circuit 62 is placed at an intersection of a sub-word driver band and a sense amplifier band, or in the cross band. Therefore, by utilizing the local SA control circuit 62 as a sense power transistor for a memory sub-array, a distribution of the sense power voltage due to interconnection line resistance in the normal operating mode is suppressed.

The local SA control circuit shown in FIG. 25 enters an output high impedance state when non-selected. In this case, a sense precharge/equalize circuit precharging a sense power line to a prescribed intermediate voltage level is provided for performing a control similar to control of the bit line equalize circuit for signals ZSNi and SPi.

Figure 26:
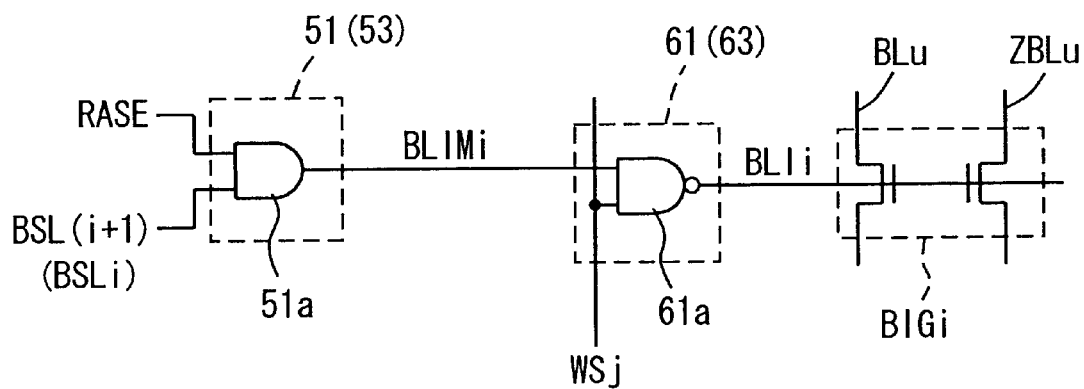
FIG. 26 is a circuit diagram representing a configuration of a BI control circuit and a local BI control circuit shown in FIG. 20.

Configuration of Bit Line Isolation Control Section:

FIG. 26 is a circuit diagram representing a configuration of a bit line isolation control section. FIG. 26 shows a configuration of the bit line isolation control section provided for the memory sub-array MSAij. A similar configuration is provided to the memory sub-array MSA (i+1)j.

The BI control circuit 51 includes an AND circuit 51a receiving a bank activation signal RASE and a latch block selection signal BSL (i+1). A main bit isolation instructing signal BLIMi is outputted from the AND circuit 51a.

The local BI control circuit 61 includes a NAND circuit 61a receiving a main bit line isolation instructing signal BLIMi and a column block selection signal WSj. A bit line isolation signal BLIi is transmitted to a bit line isolation gate BIGi included in the memory sub-array MSAij from the NAND circuit 61a.

When the memory sub-array MSAij is selected, latch block selection signal BSL (i+1) attains H level and main bit line isolation instructing signal BLIMi attains H level. When column block selection signal WSj is at H level, bit line isolation signal BLIi from the local BI control circuit 61 attains L level and the bit line isolation gate BIGi enters a non-conductive state. Consequently, the memory sub-array MSAij is isolated from a corresponding sense amplifier band.

On the other hand, when column block selection signal WSj is at L level, then bit line isolation signal BLIi from the local BI control circuit 61 attains H level, the bit line isolation gate BIGi is kept in a conductive state and the memory sub-array MSAij is connected to a corresponding sense amplifier band. When the column block selection signal WSj is at L level, then a bit line equalize operation is performed in a corresponding memory sub-array MSAij by the bit line equalize circuit BLEQ and further, a corresponding sense amplifier circuit SA is kept in an inactive state. Therefore, a non-selected memory sub-array is kept in a precharged state by column selection signal WSj. When latch block selection signal BSL (i+1) is at L level, main bit line isolation instructing signal BLIMi attains L level. When column block selection signal WSj is at H level, bit line isolation signal BLIi attains H level and the memory sub-array MSAij is connected to a corresponding sense amplifier band. Accordingly, when the latch block selection signals BSL and BSL (i+1) are both at L levels, the memory sub-arrays MSAij and MSA (i+1)j are both coupled to a sense amplifier band to be kept in precharged states.

Figure 27:
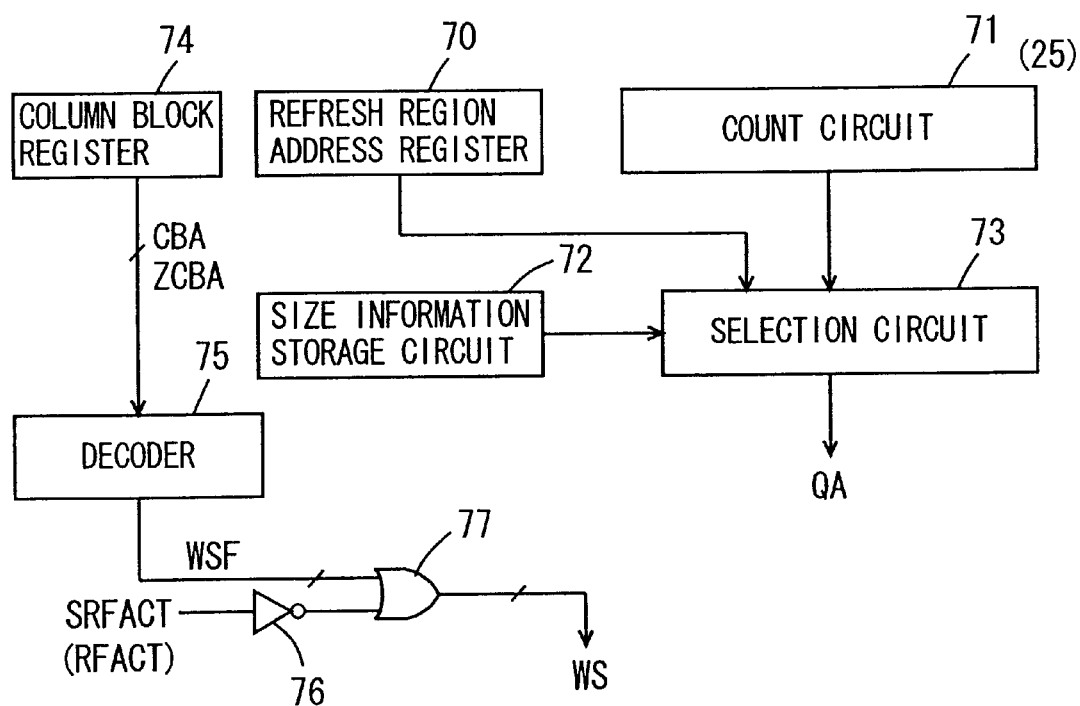
FIG. 27 is a block diagram schematically showing a configuration of a column block select signal generating section and a refresh address generating section in the second embodiment of the present invention.

Configuration of Refresh Address Generating Section:

FIG. 27 is a block diagram schematically showing a configuration of a refresh address generating section of a semiconductor memory device according to the second embodiment of the present invention. The refresh address generating section shown in FIG. 27 corresponds to the refresh address counter circuit 25 of FIG. 5.

In FIG. 27, the refresh address generating section includes: a refresh region address register 70 storing an address indicating a refresh region with respect to rows; a count circuit 71 performing a count operation according to a count-up signal from the OR circuit shown in FIG. 5 in the refresh mode; a size information storage circuit 72 storing size information on a refresh region; a selection circuit 73 selectively passing a stored address of the refresh region address register 70 and an output count of the count circuit 71, on a bit basis, therethrough according to storage information of the size information storage circuit 72 to generates a refresh address QA; a column block register 74 storing an address indicating a column block region to be refreshed on a column block basis; a decoder 75 decoding a stored column address of the column refresh register 74; an inverter 76 inverting a self-refresh activation signal SRFACT; and an OR circuit 77 receiving an output signal of the inverter 76 and a signal from the decoder 75 to generate a column block selection signal WS (WS<7:0>).

The refresh region address register 70 stores information indicating a bit position to be fixed, in order to specify a data holding region. The size information storage circuit 72 stores information indicating the number of fixed address bits of the refresh region address register 70 and controls a selection operation of the selection circuit 73. For example, when one row block is refreshed, an address specifying the row block is fixed to a prescribed value. When one of the row blocks RB#0 to RB#7 is specified by row address bits RA<11:9>, the 3-bit address is fixed to a value indicating a specific row block. The size information storage circuit 72 generates fixed 3-bit information and selects a block address stored in the refresh region address register 70 for the 3 bits corresponding to the row block address instead of count bits from the count circuit 71. Thereby, the row block address is fixed to an address stored in the refresh region address register 70, and a word line in the fixed row block is specified according to the lower output count value of the count circuit 71.

Figure 28:
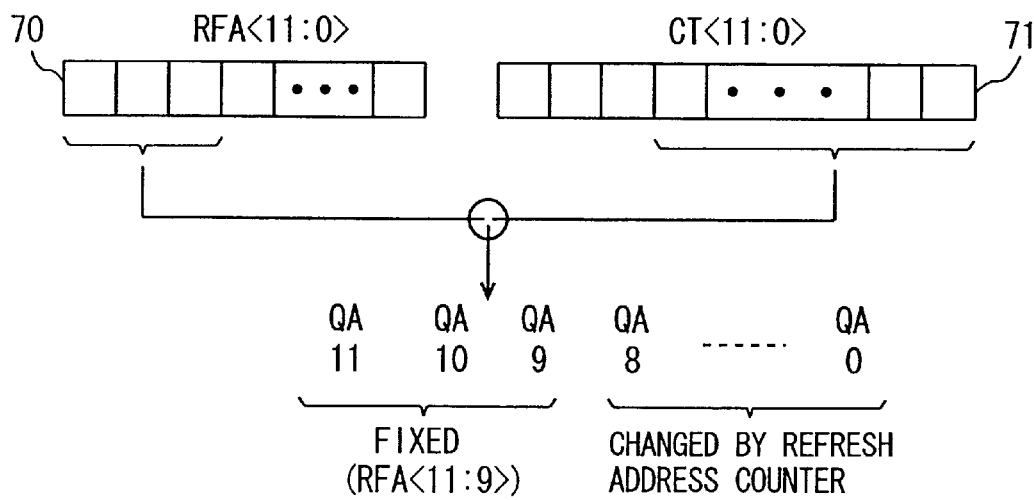
FIG. 28 is a diagram illustrating an operation of the refresh address generating section shown in FIG. 27.

As shown in FIG. 28, address bits specifying a to-be-refreshed region are stored in the refresh region address register 70. In FIG. 28, such a state is shown that the address RFA<11:0> is stored. The higher 3 bits of a count value CT<11:0> from the count circuit 71 are replaced with a refresh region address RA<11:9> stored in the refresh region address register 70 based on storage information of the size information storage circuit 72. Thus, the higher 3 bit refresh address QA<11> to QA<9> are fixed to an address bit value stored in the refresh region address register 70.

On the other hand, the lower 9 bit address QA<8> to QA<0> are replaced with a count value CT<8:0> from the count circuit 71. Hence, a refresh region can be specified on a desired address region basis. In this case, when only the highest one bit QA<11> of refresh address bits QA<11:0> is fixed, 4 row blocks can be specified as a refresh region. Further, when highest two bit refresh address QA<11:10> are fixed, two row blocks can be refreshed as a refresh region. Still further, when highest four bit refresh address QA<11:8> are fixed, a half of one row block can be specified as a refresh region.

Further, when only the lowest refresh address bit QA0 is fixed, a region including only either even-numbered or odd numbered rows can be specified as a refresh region. A refresh period is changed according to the number of fixed refresh address bits. That is, when one refresh address bit is fixed, a refresh request issuance period is set to be doubled. When the number of fixed refresh address bits is 2, a refresh interval is set four times greater. When the number of fixed refresh address bits is 3, a refresh interval is set eight times greater. This can be realized by simply changing a period of a refresh timer according to the number of fixed bits with ease.

Figure 29:
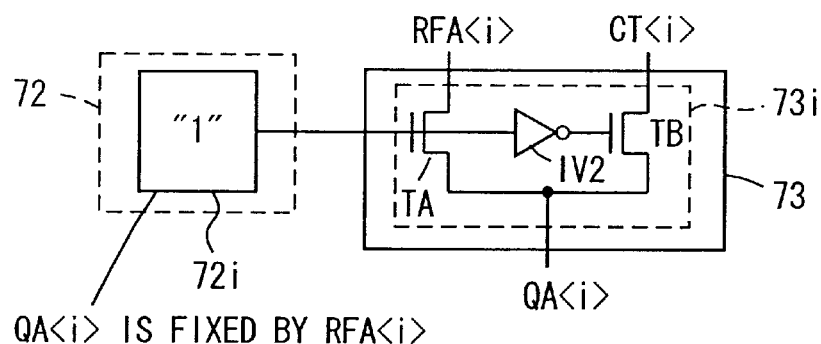
FIG. 29 is a block diagram representing a configuration of a size information storage circuit and a selection circuit shown in FIG. 27.

FIG. 29 is a block diagram schematically showing a configuration of size information storage circuit 70 and selection circuit 73 shown in FIG. 27. In FIG. 29, a configuration for one bit address is shown. The size information storage circuit 72 includes register circuits provided corresponding to respective refresh address bits. In FIG. 29, a register circuit 72i provided for an address bit QA<i> is representatively shown. The selection circuit 73, likewise, includes multiplexers provided corresponding to respective refresh address bits. In FIG. 29, a multiplexer 73i provided for an address bit RFA<i> and a count bit CT<i>, is shown as a representative.

The multiplexer 73i" includes: a transfer gate TA, rendered conductive when a storage bit of a corresponding register circuit 72i of the size information storage circuit 72 is "1, for passing an address bit RFT<i> therethrough; an inverter IV2 inverting a storage bit of the register 72i; and a transfer gate TB, rendered conductive when an output signal of the inverter IV2 is at H level (when a stored bit of the register circuit 72i is "0"), for passing a counter bit<i> therethrough. When refresh address bit QA<i> is generated by selecting one of address bits RFT<i> and CT<i> based on a bit value stored in the register 72i,a refresh region can be set to a desired size with respect to rows.

Figure 30:
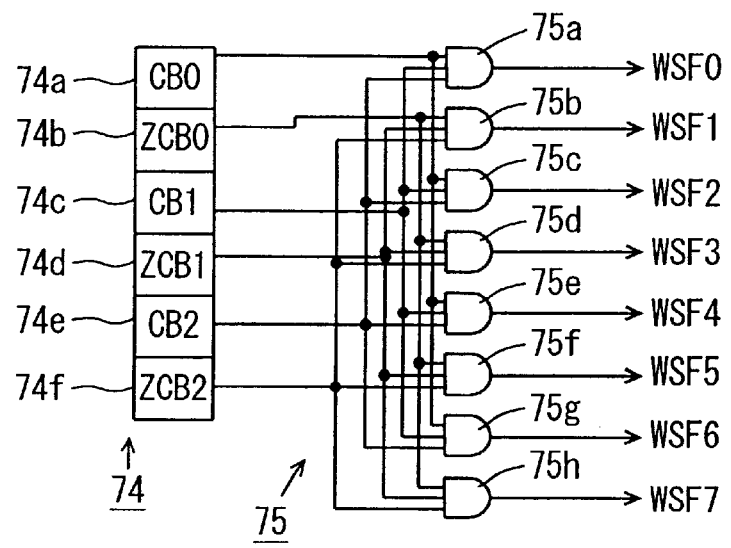
FIG. 30 is a circuit diagram representing a configuration of a column block register and a decoder shown in FIG. 27.

FIG. 30 is a circuit diagram representing configuration of a column block register 74 and a decoder 75 shown in FIG. 27. Column blocks are provided 8 in number as shown in FIG. 16. In order to specify a column block, a 3-bit column block address is stored in a column block register 70. The column block register 74 includes register circuits 74a to 74f storing complementary address bits CB0 and ZCB0 to CB2 and CB2, respectively. By storing complementary address bits, one column block is selected or the number of columns simultaneously selected is set to one of 2, 4 and 8. That is, a degenerated state of addresses is realized. The decoder 75 includes AND circuits 74a to 75h each receiving prescribed combinations of the register circuits 74a to 74f of the register 74. The AND circuits 75a to 75h drive column selection signals WSF0 to WSF7 to selected states when 3 bits of a supplied address are all at H levels. An OR of an inverted signal of self-refresh activation signal SRFACT with each of the column block selection signals WSF0 to WS7 is calculated to generate final column block selection signals WS0 to WS7.

Figures 31, 32:
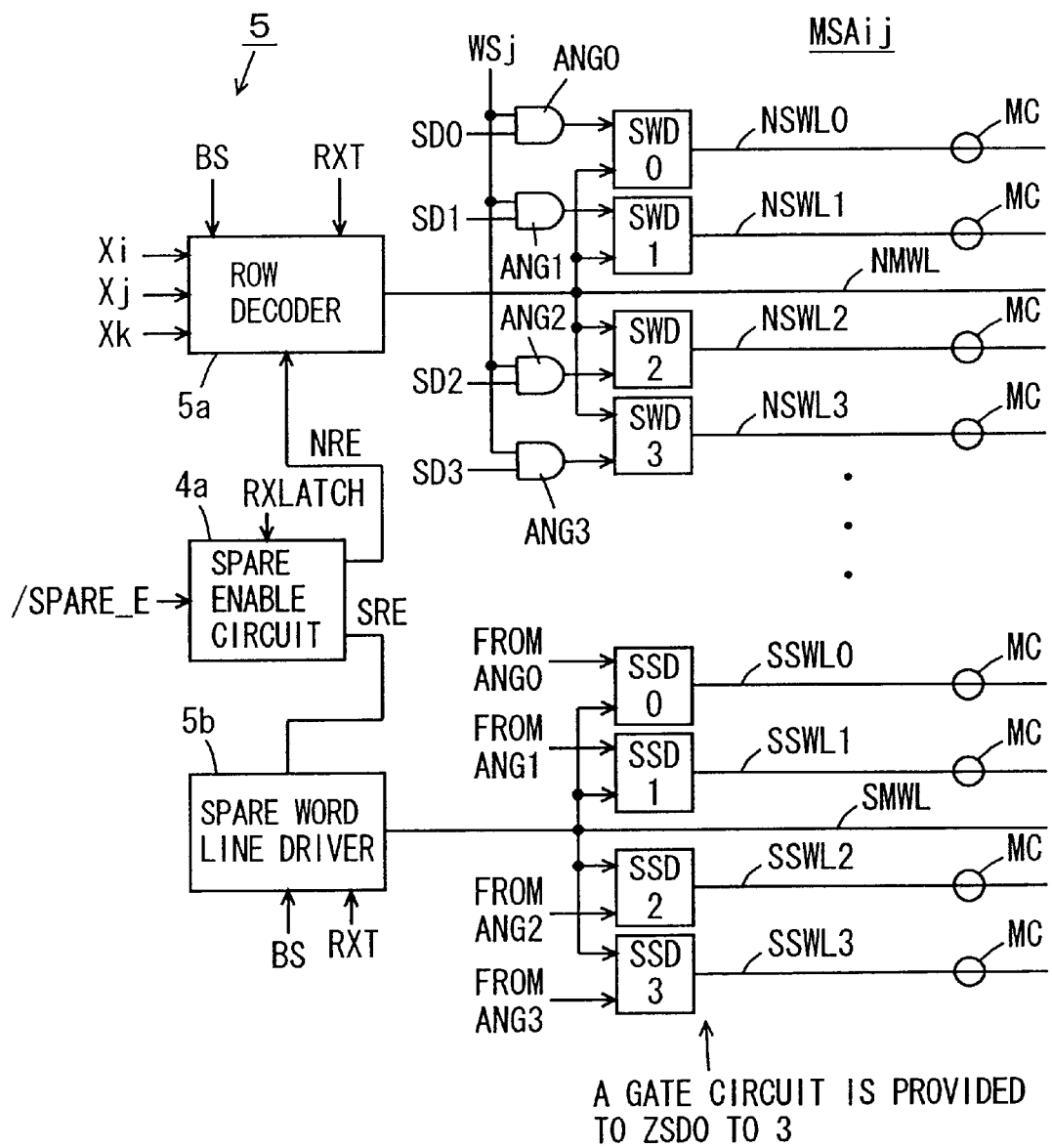
FIG. 31 is a table representing a correspondence relationship between a decode signal of a decoder shown in FIG. 30 and a column block.
FIG. 32 is a block diagram schematically showing a configuration of a main part of a semiconductor memory device according to a third embodiment of the present invention.

FIG. 31 is a table representing one example of a correspondence relationship between column block CB#0 to CB#7 and column address bits CB0 to CB2. With bit CB2, column blocks CB#0 to CB#3, or column blocks CB#4 to CB#7 are specified. With bit CB1, column blocks CB#0, CB#1, CB#4 and CB#5, or CB#2, CB#3, CB#6 and CB#7 are specified. With bit CB0, column blocks CB#0, CB#2, CB#4 and CB#6, or odd-numbered column blocks CB#1, CB#3, CB#5 and CB#7 are selected.

When bits CB2 to CB0 are all set in a non-degenerated state, one column block is specified. When a column address bit C2 is in a degenerated state, or CB2 and ZCB2 are both set to "1," two column blocks are specified by bits CB1 and CB0. When bits CB1 and CB2 are both set to degenerated states, 4 column blocks are specified by the address bit CB0. When address bits CB0 to CB are all set to degenerated states, column blocks CB#0 to CB#7 are all specified.

Accordingly, by storing the complementary address bits CB0 and ZCB0 to CB2 and ZCB2 in the register 74, a column block region of any size can be driven to a selected state in the data holding mode.

It should be noted that setting of data into the refresh region address register 70, the size information storage circuit 72 and the column block register 74 shown in FIG. 27 is performed by data writing into the registers 70, 72 and 74 through application of a register mode setting command. When an address input node is utilized in the write operation, if the register mode setting command utilizes a specific address bit, such a case may occur that all data simultaneously required cannot be supplied simultaneously. In such a case, the stored data may be generated by decoding address bits, or necessary data may be sequentially shifted-in in synchronization with clock signals.

As described above, according to the second embodiment of the present invention, in the mode performing data holding, a refresh region is set on a column block basis, and the number of sense amplifier circuits driven in the data holding mode can be decreased, thereby enabling reduction in a current consumption.

It should be noted that in the auto-refresh mode, self-refresh activation signal SRFACT is inactive and similarly to the normal access operation mode, activation/deactivation of the memory array is performed on a row block basis. This is because in the normal access mode, there is a need that intermediate processing result data are held during refreshing, for use in subsequent processing. In the auto-refresh mode as well, however, when data refresh is performed on a sub-word line, a refresh activation signal RFACT obtained by ORing auto-refresh activation signal ARFACT and self-refresh activation signal SRFACT may be used instead of self-refresh activation signal SRFACT.

Third Embodiment

FIG. 32 is a block diagram schematically showing a configuration of a main part of a semiconductor memory device according to a third embodiments of the present invention. FIG. 32 shows a configuration of part of the memory sub-array MSAij. In FIG. 32, in a memory sub-array MSAij, a normal main word line NMWL and a spare main word line SMWL are arranged. Four normal sub-word lines NSWL0 to NSWL3 are provided for the normal main word line NMWL and further, 4 spare sub-word lines SSWL to SSWL3 are provided for the spare main word line SMWL. Sub-word line drivers SWD0 to SWD3 are provided to respective normal sub-word lines NSWL0 to NSWL3, and spare sub-word line drivers SSD0 to SSD3 are provided to respective spare sub-word lines SSWL0 to SSWL3.

In order to specify one of the 4 normal sub-word lines NSWL0 to NSWL3 and specify one of the spare sub-word lines SSWL0 to SSWL3, sub-decode signals SD0 to SD3 are generated. The sub-decode signals SD0 to SD3 are generated from row address bits RA<1:0>.

In order to control activation/deactivation of sub-word lines on a column block basis, AND circuits ANG0 to AND3 each receiving column block selection signal WSj at first inputs thereof are provided corresponding to respective sub-decoder signals SD0 to SD3. The AND circuits ANG0 to ANG3 receive respective sub-decode signals SD0 to SD3 at second inputs thereof, and supply the output signals thereof to respective sub-word line drivers SWD0 to SWD3 and respective SSD0 to SSD3. The AND circuits ANG0 to ANG3 correspond to the AND circuit 65a shown in FIG. 22. Complementary sub-decode signals ZSD0 to ZSD3 are also supplied to the sub-word line drivers SWD0 to SWD3 and SSD0 to SSD3. NAND circuits receiving column block selection signal WSj are provided to the respective complementary sub-decode signals ZSD0 to ZSD3, but not shown in FIG. 32, for simplification of the figure.

A row decoder 5a is provided to a normal main word line NMWL, which decodes predecode signals Xi, Xj and Xk supplied from a predecoder not shown according to a block selection signal BS (a latch block selection signal BSL) and a word line drive timing signal RXT to drive the normal main word line NMWL to a selected state. A spare word line driver 5b driving a spare main word line SMWL in response to activation of block selection signal BS and word line drive timing signal RXT is provided to the spare main word line SMWL. The row decoder 5a is activated to perform a decode operation when a normal row enable signal NRE from the spare enable circuit 4a is activated. The spare word line driver 5b drives the spare main word line SMWL to a selected state when a spare row enable signal SRE is activated. The spare enable circuit 4a generates the normal row enable signal NRE and the spare row enable signal SRE according to a spare determination result indicating signal /SPARE-E from the spare determination circuit shown in FIG. 15. When a defective memory cell MC is connected to one of normal sub-word lines connected to a normal main word line NMWL, the normal main word line NMWL is replaced with a spare main word line SMWL.

Figure 33A:
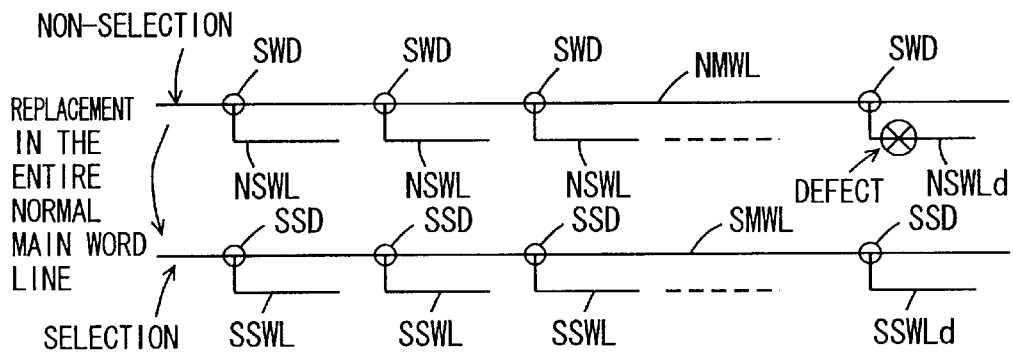
FIGS. 33A to 33C are diagrams schematically showing states of selected word lines in the semiconductor memory device shown in FIG. 32.

FIG. 33A is a diagram representing a state of repairing a defective sub-word line in the normal access operation mode. Now, consideration is given to a case where a defective memory cell is present on a normal sub-word line NSWLd provided corresponding to a normal main line word line NMWL. In the normal access operation mode, the normal main word line NMWL is in a non-selected state and on the other hand, a spare word line SMWL is driven to a selected state and the entire normal main word line NMWL is replaced with the spare main word line SMWL. Consequently, a defective memory cell on the defective normal sub-word line NSWLd is replaced for repairing with a spare sub-word line SSWLd provided correspondingly. In this case, the normal sub-word lines NSWL associated with the normal main word line NMWL are all replaced with the corresponding spare sub-word lines SSWL. Therefore, when a normal main word line and a spare main word line are present in one row block, defect repairing is executed within a row block with one main word line being a unit.

Figure 33B:
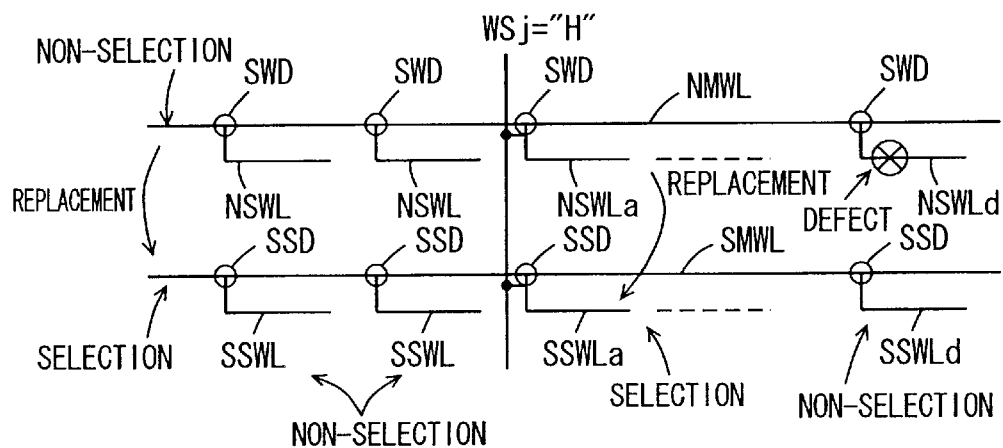
Figure 33C:
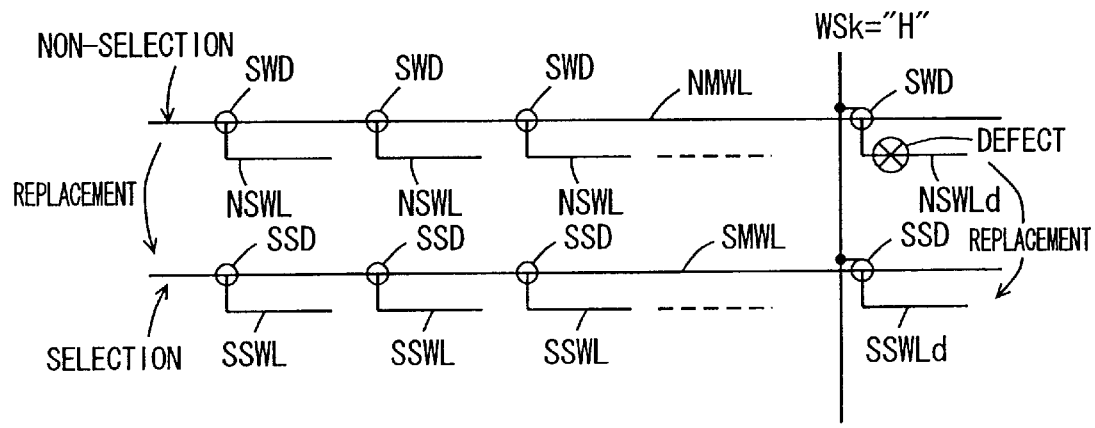

FIGS. 33B and 33C are diagrams each schematically showing a state of redundancy replacement in the data holding mode. Consideration is given to a case where in FIG. 33B, a column block selection signal WSj is at H level and the other column block selection signals (not shown) are in non-selected states. In the column block, a normal sub-word line NSWLa and a spare sub-word line SSWLa are provided. No defective memory cell is connected to the normal sub-word line NSWLa. In this case, since normal main word line NMWL is replaced with spare main word line SMWL according to a spare determination result, the normal main word line NMWL and the normal sub-word line NSWLa are kept in non-selected states. On the other hand, the spare main word line SMWL is driven to a selected state and the spare sub-word line SSWLa is driven to a selected state according to column block selection signal WSj. Accordingly, when refresh is performed with a memory sub-array being a unit in the data holding mode as well, redundancy replacement can be effected on a sub-word line basis.

A case is now considered where, as shown in FIG. 33C, a column block selection signal WSk is driven to H level, being in a select state. A normal sub-word line NSWLd and a spare sub-word line SSWLd are disposed in a column block specified by column block selection signal WSk. A defective cell is present on the normal sub-word line NSWLd and a normal main word line NMWL is replaced by a spare main word line SMWL based on a spare determination result. The column block selection signal WSk is in a selected state, and the spare sub-word line SSWLd is driven to a selected state by a spare sub-word line driver SSD. Since the normal main word line NMWL is in a non-selected state, the normal sub-word line NSWLd is kept in a non-selected state. Accordingly, the defective normal sub-word line NSWLd can be replaced with the spare sub-word line SSWLd.

As described above, in the data holding mode, when activation is performed with a memory sub-array being a unit, a defective normal sub-word line can be correctly replaced with a spare sub-word line for defect repairing, thereby enabling holding of necessary data accurately.

Figure 34:
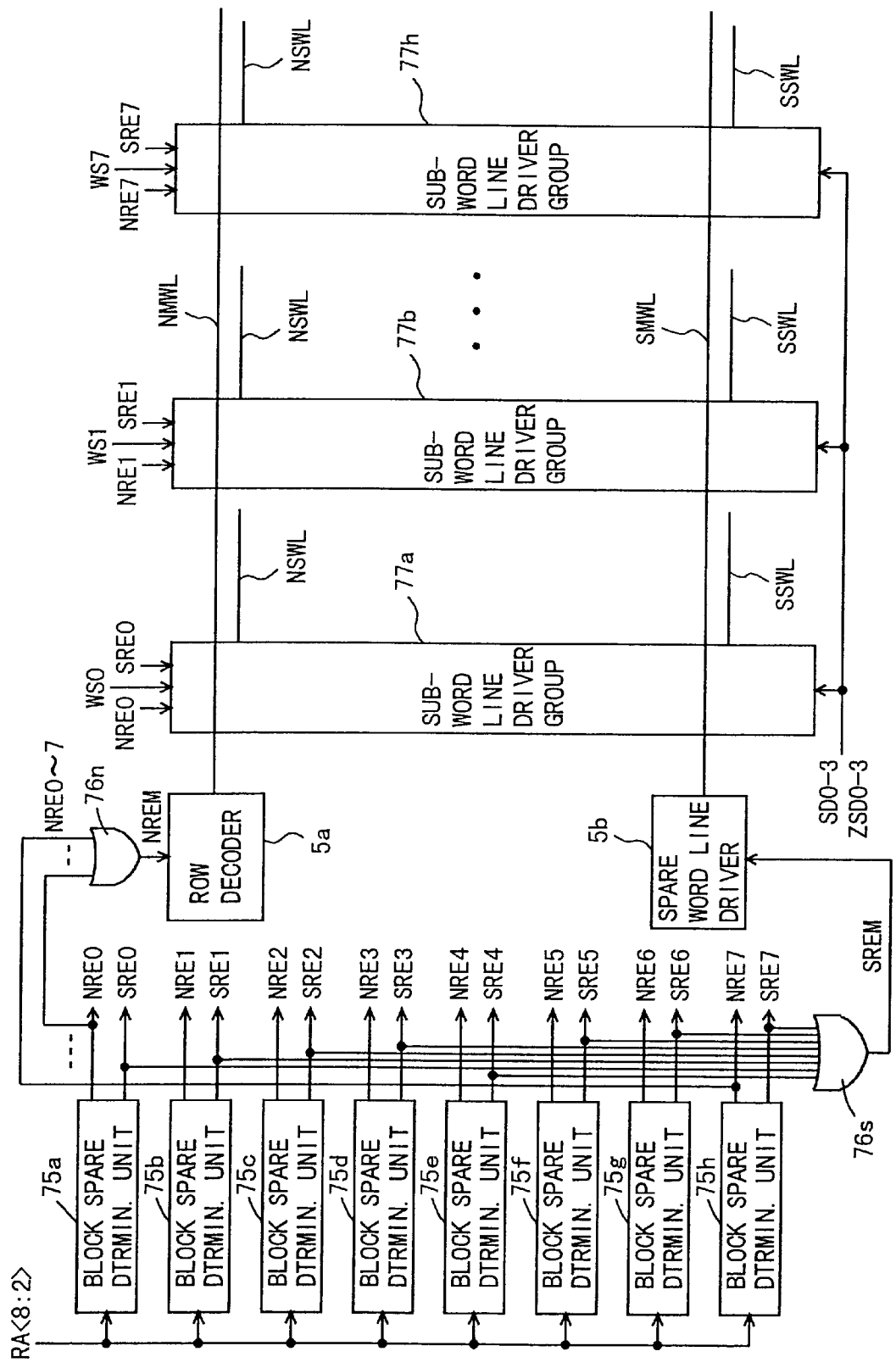
FIG. 34 is a block diagram schematically showing a configuration of a modification of the third embodiment of the present invention.

First Modification:

FIG. 34 is a block diagram schematically showing a configuration of the first modification of the third embodiment according to the present invention, and schematically shows a configuration of row related circuitry corresponding to one row block. In FIG. 34, block spare determination units 75a to 75h receiving row address bits RA<8:2> are provided corresponding to respective column blocks (memory sub-arrays). The block spare determination units 75a to 75h store defective main word line addresses with one column block (one memory sub-array) being a unit, and determine whether or not a defective main word line is addressed with a memory sub-array being a unit.

The row related circuitry includes: an OR circuit 76n receiving normal row enable signals NRE0 to NRE7 from the block spare determination units 75a to 75h; an OR circuit 76s receiving spare row enable signals SRE0 to SRE7 from the block spare determination units 75a to 75h; an row decoder 5a further decoding a predecode signal (not shown) when a normal row enable signal NREM for the OR circuit 76n is activated to drive a corresponding main word line NMWL to a selected state; and a spare word line driver 5b driving a corresponding spare main word line SMWL to a selected state when a spare row enable signal SREM from the OR circuit 76s is activated. Configuration of the row decoders 5a and the spare word line driver 5b are the same as that shown in FIG. 32.

Sub-word line driver groups 77a to 77h each including sub-word drivers are provided corresponding to respective column blocks. The sub-word line driver groups 77a to 77h each drive a normal sub-word line NSWL or a spare sub-word line SSWL in a corresponding memory sub-array to a selected state. Normal row enable signals NRE0 to NRE7, column block selection signals WS0 to WS7 and spare row enable signals SRE0 to SRE7 are supplied to the respective sub-word line driver groups 77a to 77h. Further, the sub-word line driver groups 77a to 77h are commonly supplied with sub-decode signals SD0 to SD3 and ZSD0 to ZSD3.

In the configuration shown in FIG. 34, a defective row is repaired with a memory sub-array being a unit. For example, in a case where a normal sub-word line NSWL connected to the sub-word line driver group 77a is defective, while normal sub-word lines NSWL connected to the remaining sub-word line drivers 77b to 77h are non-defective, then a spare row enable signal SRE0 from the block spare determination unit 75a is activated, while the normal row enable signal NRE0 is deactivated. Remaining spare row enable signals SRE1 to SRE7 are inactive and normal row enable signals NRE 1 to NRE7 are active. Consequently, the row decoder 5a performs a decode operation to drive a normal main word line NMWL to a selected state and at the same time, the spare word line driver 5b drives a spare main word line SMWL to a selected state since a spare row enable signal SREM is active. Since normal row enable signal NRE0 is inactive and spare row enable signal SRE0 is active, the normal sub-word line drivers are inactive and the spare sub-word line drivers are active in the sub-word line driver group 77a, and the normal sub-word lines NSWL connected to the sub-word line driver group 77a are kept in inactive states, while a spare sub-word line SSWL is driven to a selected state.

Although there is a need to provide a spare determination unit to each column block, repairing of a defective row can be performed with a memory sub-array being a unit in each row block, thereby enabling more improvement on repairing efficiency. In the data holding mode, the sub-word line driver groups 77a to 77h are selectively enabled according to column block selection signals WS0 to WS7. Therefore, in the data holding mode as well, repairing of a defective row is correctly performed and thereby enabling data holding operation.

Figure 35:
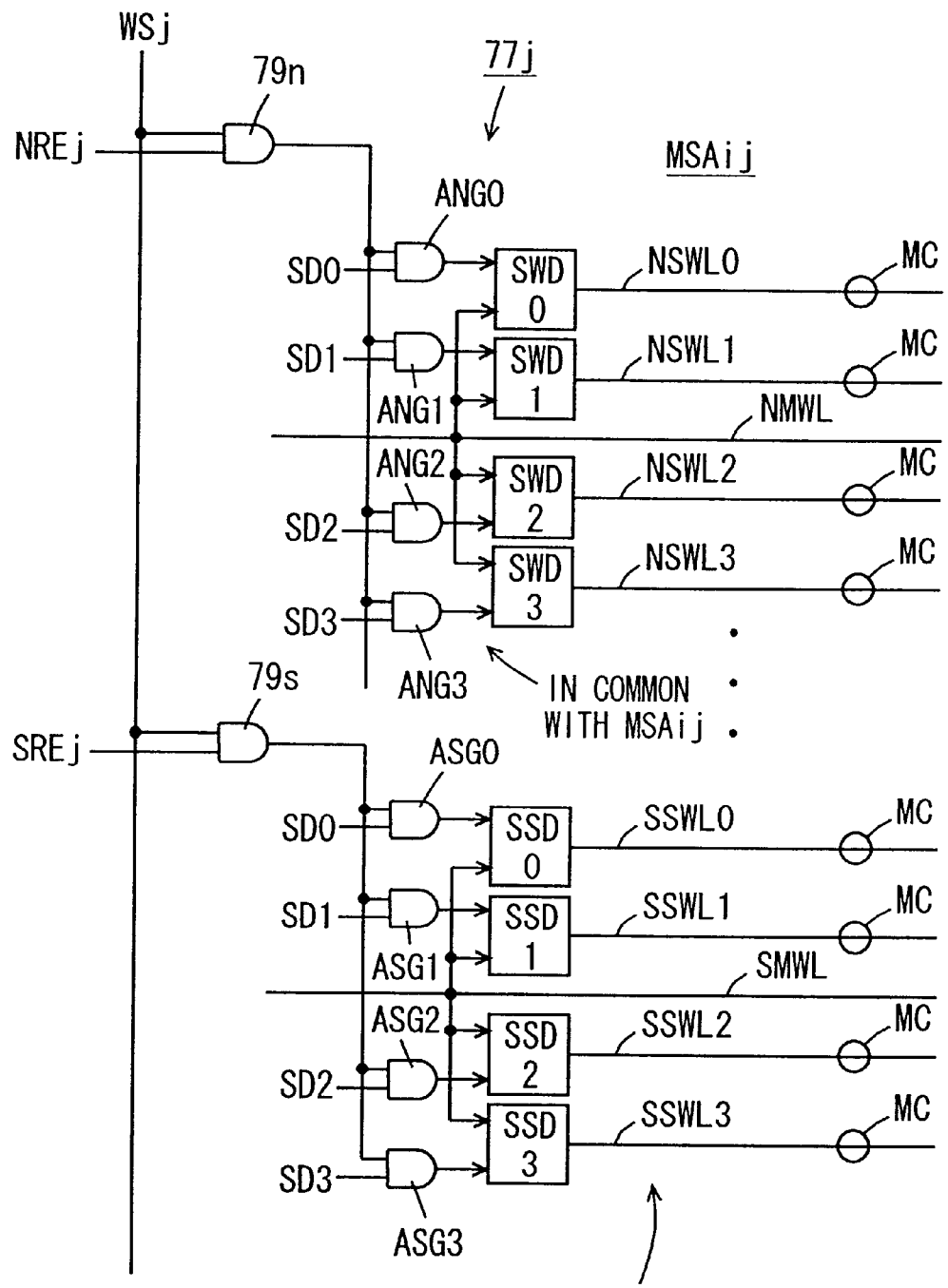
FIG. 35 is a circuit diagram schematically showing a configuration of a sub-word line driver shown in FIG. 34.

FIG. 35 is a circuit diagram schematically showing a configuration of the sub-word line driver group 77j for the memory sub-array MSAij. In FIG. 35, the sub-word line driver group 77j includes AND circuits ANG0 to ANG3 provided corresponding to respective sub-decode signals SD0 to SD3. An output signal of an AND circuit 79n receiving a column block selection signal WSj and a normal row enable signal NREj is commonly supplied to the AND circuits ANG0 to ANG3. Sub-decode signals for respective normal sub-word lines NSWL0 to NSWL3 included in the memory sub-array MSAij are generated from the AND circuits ANG0 to ANG3.

AND circuits ASG0 to ASG3 receiving sub-decode signals SD0 to SD3 at the respective first inputs are provided corresponding to respective spare sub-word lines SSWL0 to SSWL3. An output signal of an AND circuit 79s receiving spare row enable signal SREj and column block selection signal WSj is commonly supplied to the second inputs of the AND circuits ASG0 to ASG3. Output signals of the AND circuits ASG0 to ASG3 are supplied to spare sub-word line drivers SSD0 to SSD3.

In this second modification, since replacement of a sub-word line is effected with a memory sub-array being a unit, sub-decode signals for the spare sub-word lines SSWL0 to SSWL3 and sub-decode signals for the normal sub-word lines NSWL0 to NSWL3 have to be separately generated. While a configuration similar to that shown in FIG. 22 may be employed for complementary sub-decode signals ZSD0 to ZSD3, output signals of the AND circuits ANG0 to ANG3, and ASG0 to ASG3 may be inverted to generate the sub-decode signals ZSD0 to ZSD3.

When column block selection signal WSj is at L level, output signals of the AND circuits 79n and 79s are both at L level and sub-decode signals supplied to the sub-word line drivers SWD0 to SWD3 and SSD0 to SSD3 are all at L level, being in a non-selected state and therefore no sub-word line selection is performed.

On the other hand, when column block selection signal WSj attains H level, the AND circuits 79n and 79s are enabled. When normal row enable signal NREj is at H level, then spare row enable signal SREj is at L level, and sub-decode signals supplied to the spare sub-word line drivers SSD0 to SSD3 are all at L level, whereby no selection of a spare sub-word line is performed. On the other hand, a sub-word line selection operation is executed on the normal sub-word lines NSWL0 to NSWL3 according to output signals of the AND circuit ANG0 to ANG3. Contrary to this, when spare row enable signal SREj attains H level and a defective row is specified, then an output signal of the AND circuit 79s attains H level and one of the spare sub-word line drivers SSD0 to SSD3 drives a corresponding spare sub-word line of the spare word lines SSWL0 to SSWL3 to a selected state according to output signals of the AND circuits ASG0 to ASG3. A defective row can be repaired by replacement with a spare sub-word line in the memory sub-array MSAij.

It should be noted that complementary sub-decode signals ZSD0 to ZSD3 may be generated at the same logic levels as those of sub-decode signals SD0 to SD3, and then are received by NAND circuits to generate local sub-decode signals. In this arrangement, output signals of the AND circuits 79n or 79s is supplied to the NAND circuits.

Further, it should be noted that the AND circuits 79n, 79s, AND0 to AND3 and ASG0 to ASG3 generate signals at the high voltage Vpp level.

Still further, one spare sub-word line may be employed (only one spare sub-word line driver SSD is provided and in this case, the configuration shown in FIG. 35 can be utilized).

When only one spare sub-word line is provided in memory sub-array MSAij, a spare main word line may not particularly be provided. The spare sub-word line may be directly driven by the spare sub-word line driver in accordance with spare row enable signal SREj. In this case, it is necessary to perform spare determination on all the bits of a row address bits RA<8: 0> in a block spare determination unit (since there is a necessity to determine defect or non-defect for each sub-word line).

Figure 36A:
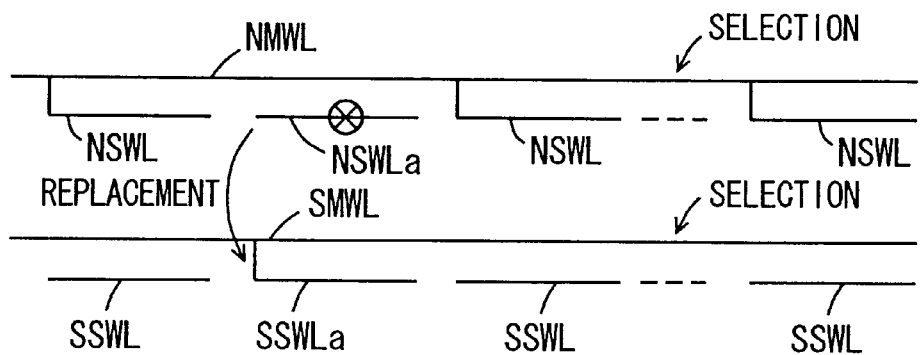
FIGS. 36A to 36C are diagrams schematically showing states of selected sub-word lines in respective operating modes of the configuration shown in FIG. 35.
Figure 36B:
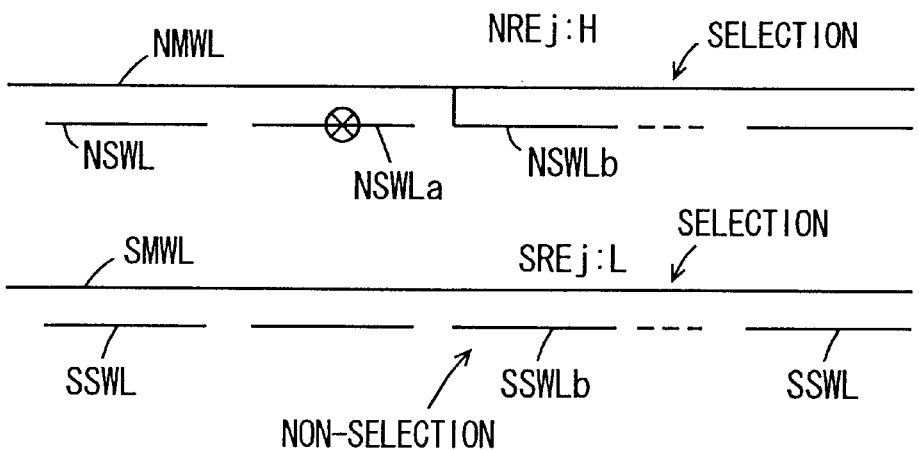
Figure 36C:
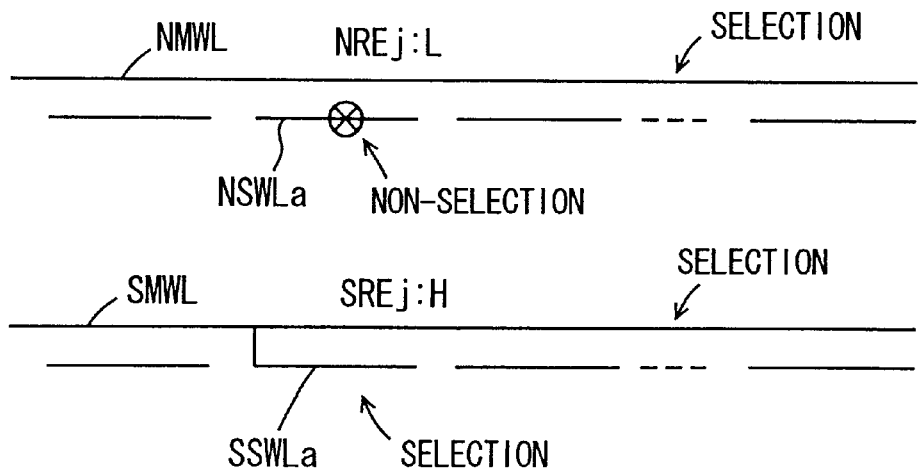

FIGS. 36A to 36C are diagrams each schematically showing states of sub-word line selection of the second modification of the third embodiment according to the present invention. As shown in FIG. 36, when a defect is present on a normal sub-word line NSWLa associated with a normal main word line NMWL in the normal operating mode (including the auto-refresh mode), the normal main word line NMWL and a spare main word line SMWL are both driven to selected states. A spare sub-word line SSWLa corresponding to the normal sub-word line NSWLa is driven to a selected state according to a spare determination result. The normal sub-word line NSWLa is maintained in a non-selected state. Therefore, the normal main word line NMWL and the spare main word line SMWL are both driven to selected states and redundancy replacement is performed with a sub-word line being a unit to repair the defect.

On the other hand, as shown in FIG. 36B, when a normal sub-word line NSWLb is selected according to a column block selection signal in the data holding mode, the normal sub-word line NSWLb is not related to a defect. Therefore, in this case, a normal main word line NMWL and a spare main word line SMWL are both driven to selected states and the normal sub-word line NSWLb is selected according to a normal enable signal and a spare row enable signal outputted from a corresponding block spare determination unit and coupled to the normal main word line NMWL. On the other hand, a corresponding spare sub-word line SSWLb is kept in a non-selected state.

Here, when the normal sub-word line NSWLb related to no defect is specified in the data holding mode, the spare main word line SMWL is driven to a selected state. This is because defect/non-defect determination is effected for each main word line in the block spare determination unit, and when the normal main word line NMWL is specified, the specified normal main word line NMWL is a defective normal main word line, and the spare main word line SMWL is also driven to a selected state. However, if such a configuration is employed that column block selection signals WS (WS0 to WS7) are provided to the respective block spare determination units 75a to 75h shown in FIG. 34 and spare determination is performed when the column selection signals are activated, the spare main word line SMWL can be maintained in a non-selected state when the normal sub-word line NSWLb is selected in the data holding mode. This is because the block spare determination unit for normal spare word line MSWLa performs no spare determination and maintains the normal row enable signal in an active state and the spare row enable signal in an inactive state (or maintains both enable signals in inactive states).

On the other hand, as shown in FIG. 36C, when a block including a defective normal sub-word line NSWLa is selected and a normal sub-word line NSWLa is specified according to a column block selection signal in the data holding mode, main word lines NMWL and SMWL are both driven to selected states. On the other hand, a normal row enable signal NREj from a corresponding block spare determination unit is at L level, being in an inactive state, and the normal sub-word line NSWLa is kept in an inactive state. On the other hand, since a spare sub-word line SSWLa is driven to a selected state since a spare row enable signal SREj attains H level. Accordingly, when refresh is performed with a memory sub-array being a unit in the data holding mode in the configuration of the second example modification as well, repairing of a defective memory cell row can be surely performed.

As described above, according to the third embodiment of the present invention, in the data holding mode, refresh is performed with a memory sub-array being a unit and sub-word line replacement is performed with a sub-array being a unit, thereby enabling holding of necessary data accurately with a low current consumption.

Fourth Embodiment

FIG. 37 is a diagram schematically showing a configuration of an array section of a semiconductor memory device according to a fourth embodiment of the present invention. In FIG. 37, a memory array is divided into normal row blocks NRB#0 to NRB#7 each including normal cells only; and a spare row block SRB# having spare memory cells, and placed adjacent to the normal row block NRB#4. Sense amplifier bands SAB#0 to SAB#8 are provided corresponding to the normal row blocks NRB#0 to NRB#7 and the spare row block SRB#. The normal row block NRB#4 and the spare row block SRB# constitute a redundancy row block and share the sense amplifier bands SAB#4 and SAB#5.

In the configuration shown in FIG. 37, a spare row (a spare sub-word line) included in spare row block SRB# can replace a defective memory cell row of any row block among the normal row blocks NRB#0 to NRB#7 for repairing. A spare determination circuit is provided only for the redundancy row block RRB# including the normal row block NRB#4 and the spare row block SRB#, while no spare determination circuit is provided for the other normal blocks NRB#0 to NRB#3 and NRB#5 to NRB#7. Only a spare determination result indicating signal is supplied to a row decoder for the normal row blocks NRB#0 to NRB#7.

Figure 38:
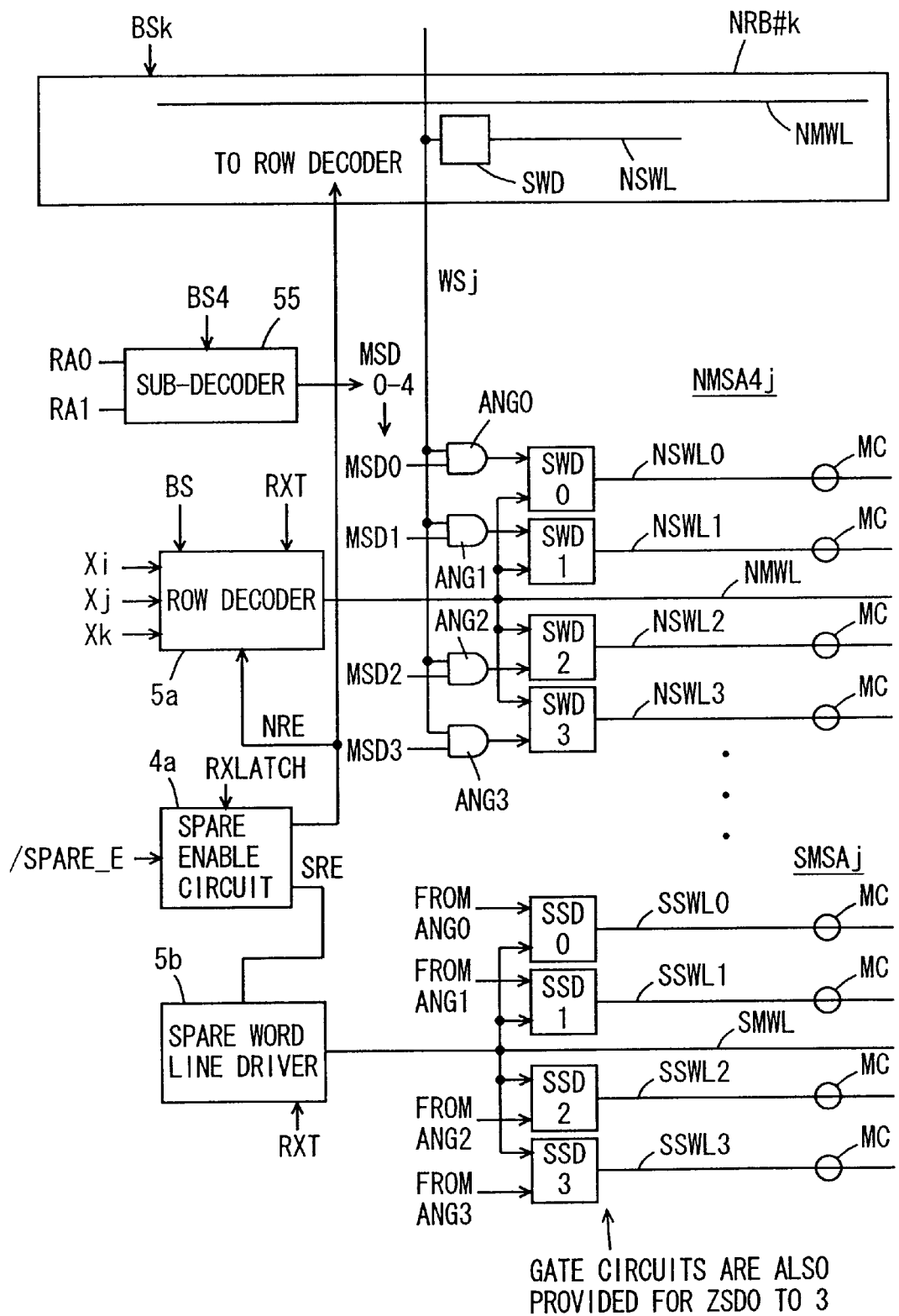
FIG. 38 is a block diagram schematically showing a configuration of a main part of a semiconductor memory device according to the fourth embodiment of the present invention.

FIG. 38 is a block diagram schematically showing a configuration of the redundancy row block RRB# and one normal row block NRB#k in the memory array shown in FIG. 37. In FIG. 38, the redundancy row block RRB#, similarly to the configuration shown in FIG. 32, is provided with: a spare enable circuit 4a; a row decoder 5a performing a decode operation in response to activation of a normal row enable signal NRE from the spare enable circuit 4a to drive a normal main word line NMWL to a selected state; a sub-decoder 55 activated, when a block selection signal BS4 is activated, to decode 2-bit row address RA0 to RA1 for generating main sub-decode signals MSD0 to MSD4; and a spare word line driver 5b driving a spare main word line SNWL to a selected state in response to activation of a spare row enable signal SRE from the spare enable circuit 4a. No block selection signal is supplied to the spare word line driver 5b. On the other hand, a block selection signal BS4 is supplied to the row decoder 5a.

There are further provided AND circuits ANG0 to ANG3 receiving main sub-decode signals MASD0 to MASD4 from the sub-decoder 55, and supplying the sub-decode signals to sub-word line drivers SW0 to SWD3 according to a column block selection signal WSj. The sub-word line drivers SWD0 to SWD3 drive normal sub-word lines NSWL0 to NSWL3 to selected states according to a signal on the normal main word line NMWL and the sub-decode signals.

Spare sub-word lines SSWL0 to SSWL3 are provided to a spare main word line SMWL. Spare sub-word line drivers SSD0 to SSD3 driving the spare sub-word line SSWL0 to SSWL3 to selected states according to sub-decode signals supplied from the AND circuit ANG0 to ANG3 and a signal on the spare main word line SMWL are provided to the respective spare sub-word lines SSWL0 to SSWL3.

In the configuration shown in FIG. 38, a configuration similar to the normal memory sub-array MSA4j and the spare memory sub-array SMSAj is also provided to other sub-arrays in the redundancy row block RRB#.

Normal row enable signal NRE from the spare enable circuit 4a is supplied to a row decoder provided for another normal row block NRB#k. In the normal row block NRB#k, the normal main word line NMWL and normal sub-word lines NSWL are arranged and a normal sub-word line NSWL is driven to a selected state by a corresponding normal sub-word line driver SWD. Activation/deactivation of the normal row block NRB#k is controlled basically by a row block selection signal BSk.

For generation of a spare determination result indicating signal /SPARE_E, spare determination may be effected with a main word line being a unit or may be effected with a sub-word line basis.

Figure 39A:
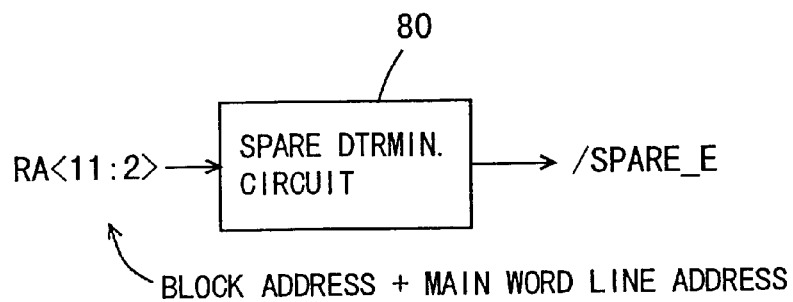
FIG. 39A is a block diagram representing a configuration of a spare determination circuit and FIG. 39B is a diagram representing a redundancy replacement on a configuration shown in FIG. 38.
Figure 39B:
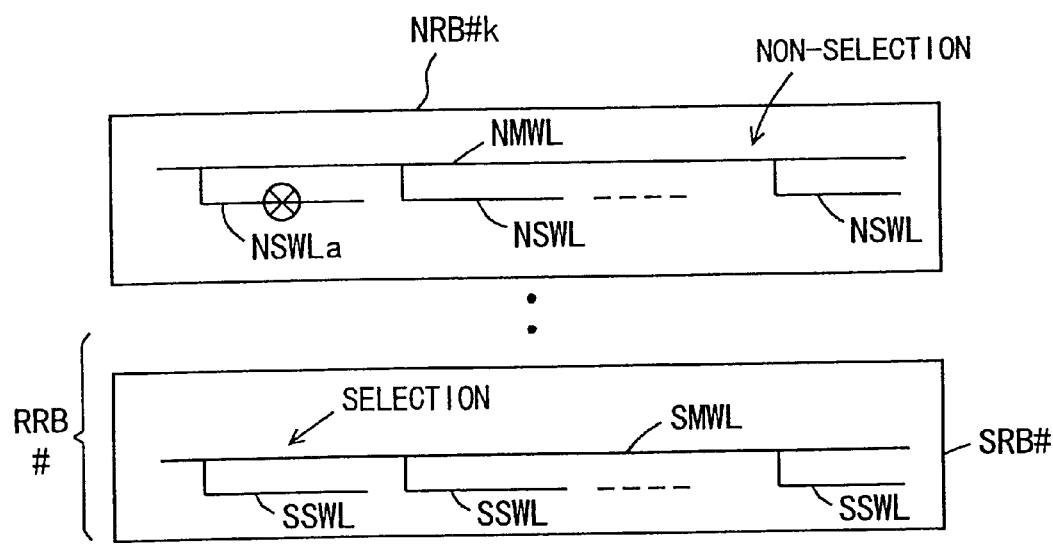

FIG. 39A is a block diagram representing a configuration of a spare determination circuit at the level of a main word line. A spare determination circuit 80 performs spare determination receiving address bits <11:2> including a block address and a main word line address and sets a main word line in an active/inactive state based on the determination result of spare determination result indicating signal /SPARE_E. When a defective row is addressed in the case shown in FIG. 39A, redundancy replacement as shown in FIG. 39B is performed. That is, when a normal sub-word line NSWLa is a defective sub-word line in a normal row block NRB#k, a normal main word line NMWL is maintained in a non-selected state (since normal row enable signal NRE is inactive).

On the other hand, in a spare row block SRB#, a spare main word line SMWL is driven to a selected state according to spare row enable signal SRE and a spare sub-word line SSWL is driven to a selected state according to sub-decode signals SD0 to SD3. Accordingly, the defective row of normal row block NRB# is replaced with a spare row of the spare row block SRB#.

As shown in FIG. 39B, since a main word line of any normal row block is replaced with a spare main word line of one spare row block SRB# (which configuration is called flexible redundancy), a defect repairing efficiency is improved.

Figure 40:
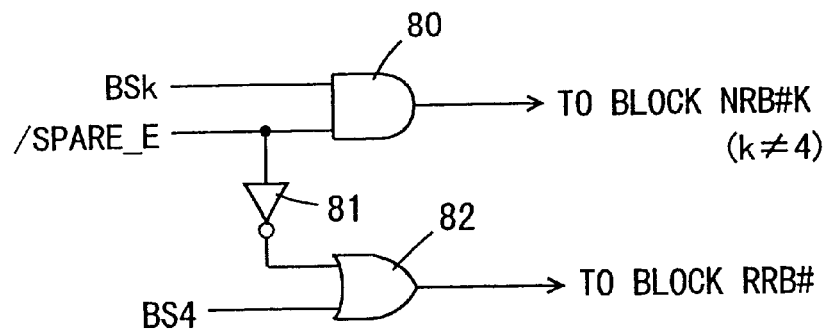
FIG. 40 is a circuit diagram schematically showing a configuration of a block selection signal generating section.

FIG. 40 is a circuit diagram schematically showing a configuration of a part for generating a block selection signal for each of row blocks. In FIG. 40, there is shown a configuration of a block selection signal generating section for a normal row block NRB#k (k≠4) and a redundancy row block RRB#. In FIG. 40, a block selection signal BSk and an output signal of an AND circuit 80 receiving a spare determination result indicating signal /SPARE_E are supplied to the normal row block NRB#k as a block selection signal. On the other hand, an output signal of an OR circuit 82 receiving an inverted signal of spare determination result indicating signal /SPARE_E supplied through an inverter 81 and a block selection signal BS4 is supplied to the redundancy row block PRB# as a block selection signal.

When a defective row has been specified, the spare determination result indicating signal /SPARE_E attains L level and the block selection signal to the normal row block NRB#k is kept in an inactive state although the block selection signal BSk is at H level, being in an active state. On the other hand, an output of the inverter 81 attains H level, the block selection signal for the redundancy row block RRB# is activated and row related circuitry operates in the row redundancy row block RRB#. In this case, the main word line is not selected since the normal row enable signal NRE is kept in inactive state in the redundancy row block RRB#. Row-related peripheral circuits such as a sense amplifier circuit and a bit line equalize circuit are activated according to the block selection signal from the OR circuit 82 in a prescribed order. With such an operation, a row selection operation on a normal row block including a defective memory cell is prohibited and on the other hand, a defective row can be repaired with a spare memory cell row of spare row block SRB#.

When a defective row is not specified, spare determination result indicating signal /SPARE_E is at H level. In this case, accordingly, a selection operation on a main word line is performed in a normal row block according to block selection signals BSk and BS4.

Figure 41A:
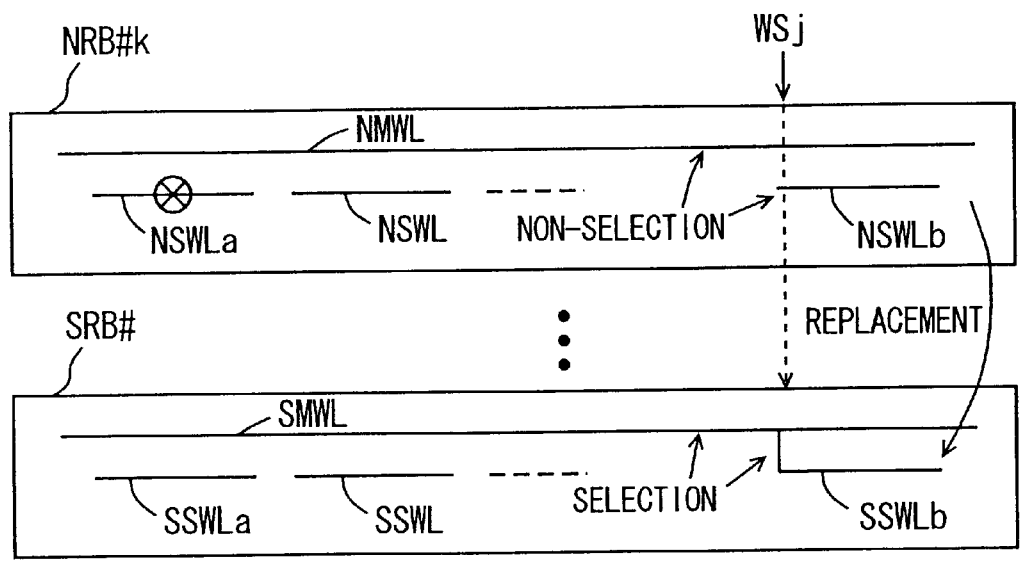
FIGS. 41A and 41B are diagrams schematically showing states of selected sub-word lines in the configuration shown in FIG. 37.

FIG. 41A is diagram schematically showing a state of a selected sub-word line in the data holding mode. Such a case is considered referring to FIG. 41A that a column block selection signal WSj specifies a column block including a normal sub-word line NSWLb and a spare sub-word line SSWLb. A normal sub-word line NSWLa associated with a defective bit is provided to a normal main word line NMWL. Accordingly, in the data holding mode, the normal main word line NMWL is replaced with a spare main word line SMWL. Moreover, the spare sub-word line SSWLb is selected according to column block selection signal WSj (by a sub-decode signal). That is, the normal sub-word line NSWLb is replaced with the spare sub-word line SSWLb. The remaining spare sub-word lines SSWLa and SSWL is kept in non-selected states according to the column block selection signals.

Figure 41B:
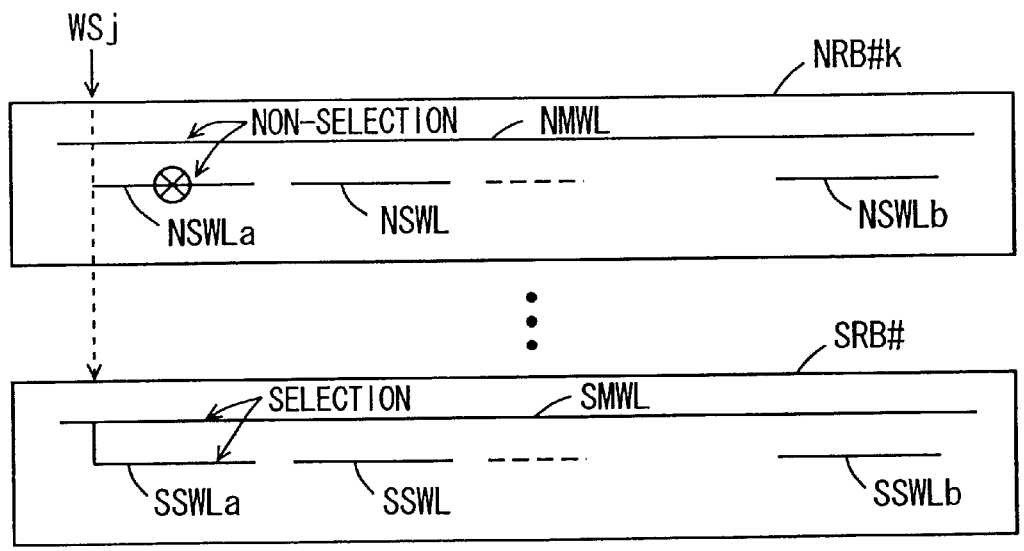

FIG. 41B is a diagram schematically showing another example of a state of a selected sub-word line in the data holding mode. In FIG. 41B, column block selection signal WSj specifies a column block including a normal sub-word line NSWLa and a spare sub-word line SSWLa. In the data holding mode, activation is performed, with a sub-word line being a unit, according to column selection signal WSj. In the configuration shown in FIG. 41B, normal main word line NMWL is provided corresponding to a defective row and is kept in a non-selected state according to a spare determination result. On the other hand, spare main word line SMWL is driven to a selected state and spare sub-word line SSWLa is driven to a selected state according to column block selection signal WSj and a sub-decode signal.

Accordingly, in the configuration shown in FIG. 41B, normal sub-word line NSWLa is replaced with the spare sub-word line SSWLa and a defective cell on the normal sub-word line NSWLa is repaired by a spare memory cell on the spare sub-word line SSWLa. Therefore, in the data holding mode, when activation/deactivation is performed with memory sub-array being a unit (one sub-word line as a unit) as well, a data holding operation can be performed through correct redundancy replacement.

Figure 42:
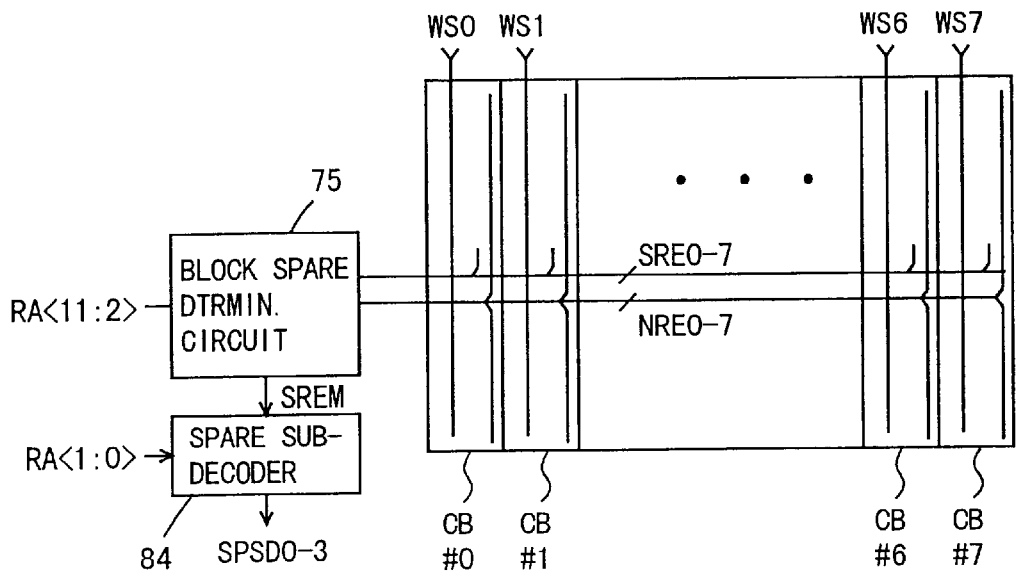
FIG. 42 is a block diagram representing a modification of the fourth embodiment of the present invention.

Modification:

FIG. 42 is a block diagram schematically showing a configuration of a modification of the fourth embodiment according to the present invention. In FIG. 42, a block spare determination circuit 75 is provided for a memory array. The block spare determination circuit 75 stores addresses of a defective main (sub) word line in each of column blocks CB#0 to CB#7, similarly to the block spare determination units 75a to 75h shown in FIG. 34. An address RA<11:2> as one example, including a block address is supplied to the block spare determination unit 75. Spare row enable signals SRE0 to SRE7 and normal row enable signals NRE0 to NRE7 for the respective column blocks are outputted from the block spare determination circuit 75. A main spare row enable signal SREM obtained by ORing the spare row enable signals SRE0 to SRE7 is supplied to a spare sub-decoder 84. The spare sub-decoder 84 decodes row address bits RA<1:0> to generate spare sub-decode signals SPSD0 to SPSD3 when being in an active state.

Column block selection signals WS0 to WS7 are supplied to the respective column blocks CB#0 to CB#7. The column block selection signals WS0 to WS7 are similar to the column block selection signals in the second embodiment. Normal row enable signals NRE0 to NRE7 are transmitted along a column direction in the respective column blocks CB#0 to CB#7. On the other hand, spare row enable signals SRE0 to SRE7 are transmitted merely in a spare sub-block SRB# only.

Figure 43:
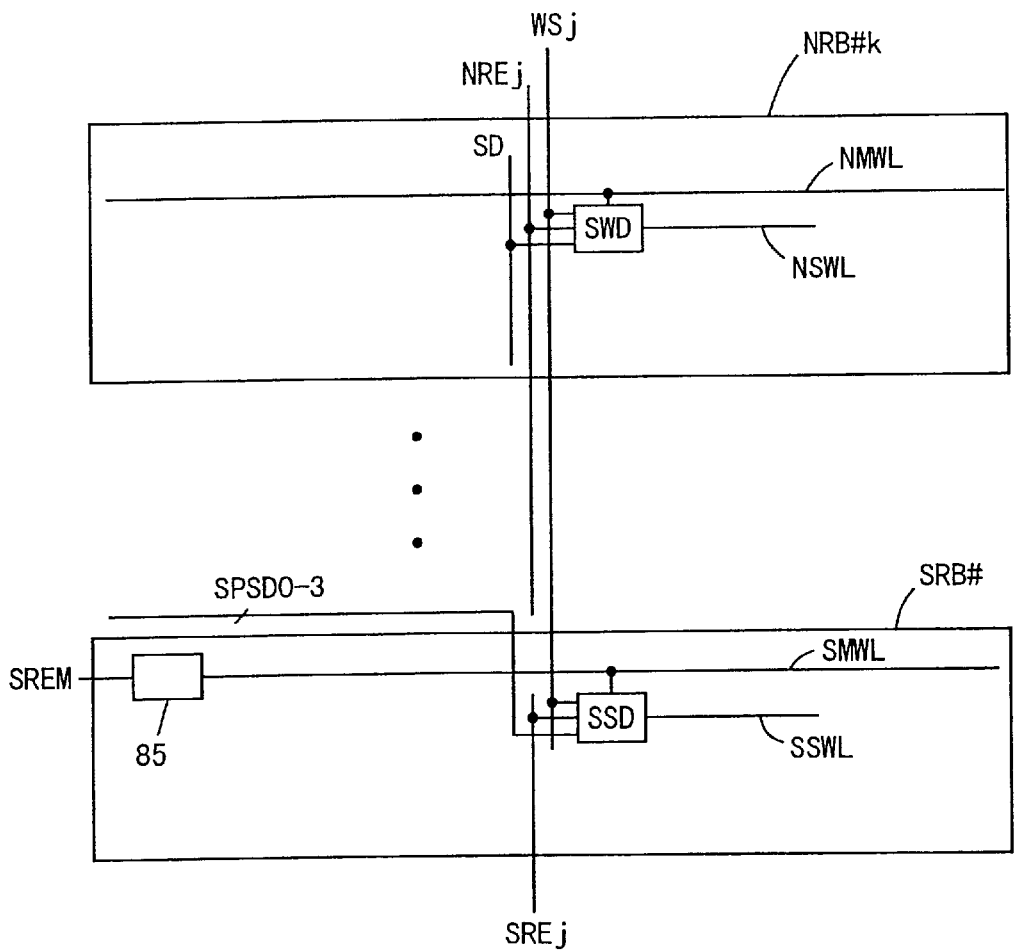
FIG. 43 is a circuit diagram representing control signals of a sub-word line driver in the configuration shown in FIG. 42.

FIG. 43 is a circuit diagram schematically showing a configuration of a row block. In a normal row block NRB#k, a normal sub-word line NSWL is provided corresponding to a normal main word line NMWL in the normal row block NRB#k. A normal sub-word line NSWL is driven by a sub-word line driver SWD receiving a column block selection signal WSj, a normal row enable signal NREj, a sub-decode signal SD and a signal on the normal main word line NMWL. The sub-word line driver SWD drives the normal sub-word line NSWL to a selected state when the normal main word line NMWL is in a selected state, a sub-decode signal SD is in a selected state, and the normal row enable signal NREj and the column block selection signal WSj are both active. A configuration of the sub-word line driver SWD is similar to that shown in FIG. 35.

On the other hand, a spare row block SRB# is provided with a spare word line driver 85 driving a spare main word line SMWL to a selected state when a main spare row enable signal SREM is activated. The spare word line driver 85 is activated when a spare determination result from the block spare determination circuit 75 indicates redundancy replacement and one of spare row enable signals SRE0 to SRE7 is active, and drives the spare main word line SMWL to a selected state. A spare sub-word line SSWL is provided to the spare main word line SMWL. The spare sub-word line SSWL is driven by a spare sub-word line driver SSD receiving a spare row enable signal SREj, column block selection signal WSj, a spare sub-decode signal SPCD (one of SPSD0 to SPSD3) and a signal on the spare main word line SMWL. A configuration of the spare sub-word line driver SSD is similar to that shown in FIG. 4.

Figure 44:
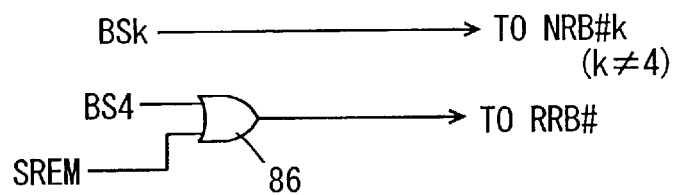
FIG. 44 is a diagram schematically showing a configuration of a row block selection signal generating section in a modification of the fourth embodiment of the present invention.

FIG. 44 is a diagram schematically showing a configuration of a row block selection signal generating section in the modification of the fourth embodiment according to the present invention. A configuration of a row block of a memory array is similar to that of FIG. 37. In FIG. 44, the row block selection signal generating section includes: a signal line for transferring a block selection signal BSk from a decoder to a normal row block NRB#k; and an OR circuit 86 receiving a block selection signal BS4 and a main spare row enable signal SREM to supply a block selection signal to a redundancy row block RRB#. The redundancy row block RRB# is activated by the OR circuit 86 when a normal row block NRB#4 is selected and when a defective row is addressed. It should be noted that a signal obtained by ORing spare determination result indicating signals /SPERE_E 0 to 7 on respective column blocks in the block spare determination circuit 75 may be supplied to the OR circuit 86 instead of the main spare row enable signal SREM.

Figure 45:
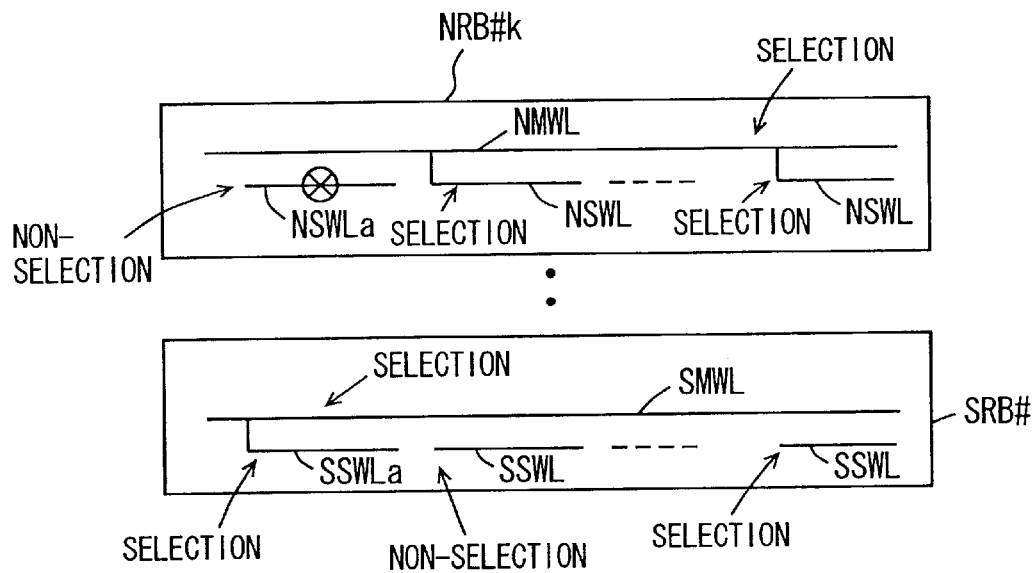
FIG. 45 is a diagram representing states of selected sub-word lines in the modification of the fourth embodiment of the present invention.

FIG. 45 is a diagram schematically showing a state of a selected word line in the normal access mode of the modification of the fourth embodiment of the present invention. In FIG. 45, a normal main word line NMWL is selected in a normal row block NRB#k. A situation is considered that a normal sub-word line NSWLa provided corresponding to the normal main word line NMWL is a defective sub-word line and the other normal sub-word line NSWL is good. A normal sub-word line NSWLa continues to stay in a non-selected state according to a normal row enable signal and the other normal sub-word lines NSWL is kept in selected states. On the other hand, in a spare row block SRB#, a spare main word line SMWL is driven to a selected state according to a main spare row enable signal SREM. Moreover, a spare sub-word line SSWLa is selected according to a spare row enable signal. The other spare sub-word lines SSWL is kept in non-selected states. Therefore, the normal sub-word line NSWLa is replaced with the spare sub-word line SSWLa. The normal main word line NMWL and the spare main word line SMWL are both driven to selected states. Accordingly, sense operation are performed in parallel in the normal row block NRB#k and the redundancy row block RRB# including the spare row block SRB#. Provided is a local sense amplifier control circuit similar to the configuration of the example modification of the third embodiment and With the local sense amplifier control circuit, activation of an sense amplifier is selectively performed according to a normal row enable signal and a spare row enable signal, with the result that a sense amplifier provided corresponding to a defective normal sub-word line NSWLa can be maintained in an inactive state.

Figure 46:
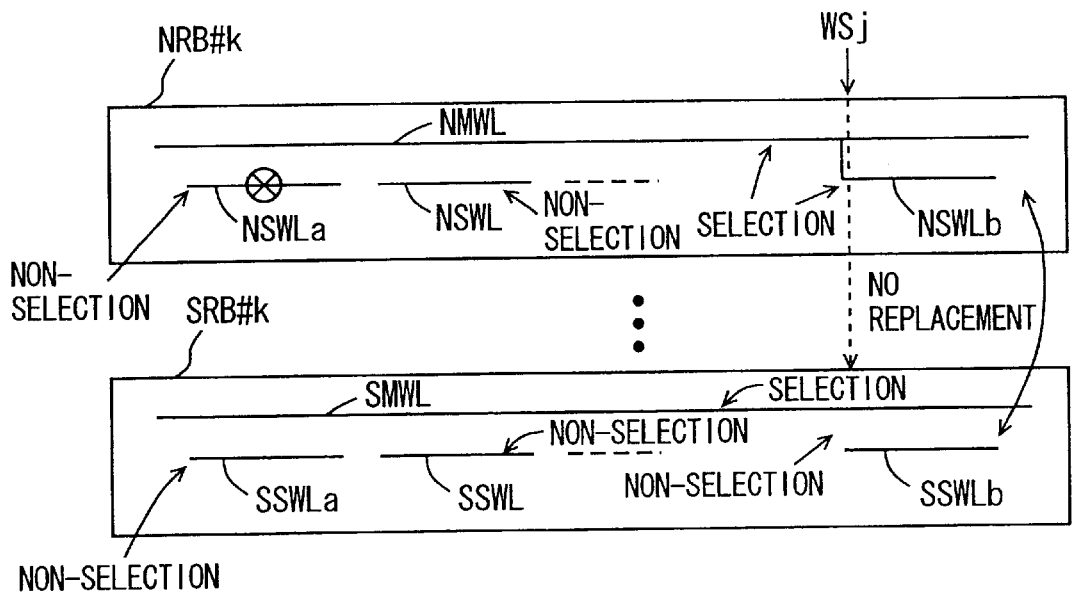
FIG. 46 is a diagram representing states of selected sub-word lines in the modification of the fourth embodiment of the present invention.

FIG. 46 is a diagram representing a state of a selected sub-word line in the data holding mode. Referring to FIG. 46, such a situation is considered that a column block selection signal WSj specifies a column block including a normal sub-word line NSWLb and a spare sub-word line SSWLb. In this situation, when a normal main word line NMWL is addressed, the normal main word line NMWL is selected and further, the normal sub-word line NSWLb is selected (since normal row enable signal NREj is active).

On the other hand, in a spare row block SRB#, a corresponding spare sub-word line SSWLb is kept in a non-selected state (since spare row enable signal SREj is inactive). A spare main word line SMWL is driven to a selected state according to main spare row enable signal SREM from the block spare determination circuit since the normal main word line NMWL is addressed. In the spare row block SRB#, no problem arises although the block selection signal is activated. In this case, in order to control an operation of a sense amplifier circuit, such a configuration may be employed that column block selection signal WSj is supplied to block spare determination units of a block determination circuit 75 and spare determination is performed only on a selected column block. Spare determination is not performed on a column block whose column block selection signal WSj is in a non-selected state, and a normal row enable signal and a spare row enable signal are both maintained to be in inactive states.

In the configuration shown in FIG. 46, when normal row block NRB#k and a normal sub-word line NSWLb are selected according to column selection signal WSj, a corresponding spare sub-word line SSWLb can be set to a non-selected state and therefore, a sense amplifier circuit provided corresponding to the spare row block SRB# can be maintained in a non-selected state. As shown in FIG. 44, a block selection signal BS4 is inactive and the main spare row enable signal SREM is in an inactive state and a redundancy row block RRB# is kept in an inactive state.

When a data holding region is set with a memory sub-array being a unit as well, a correct data holding operation can be performed.

Figure 47:
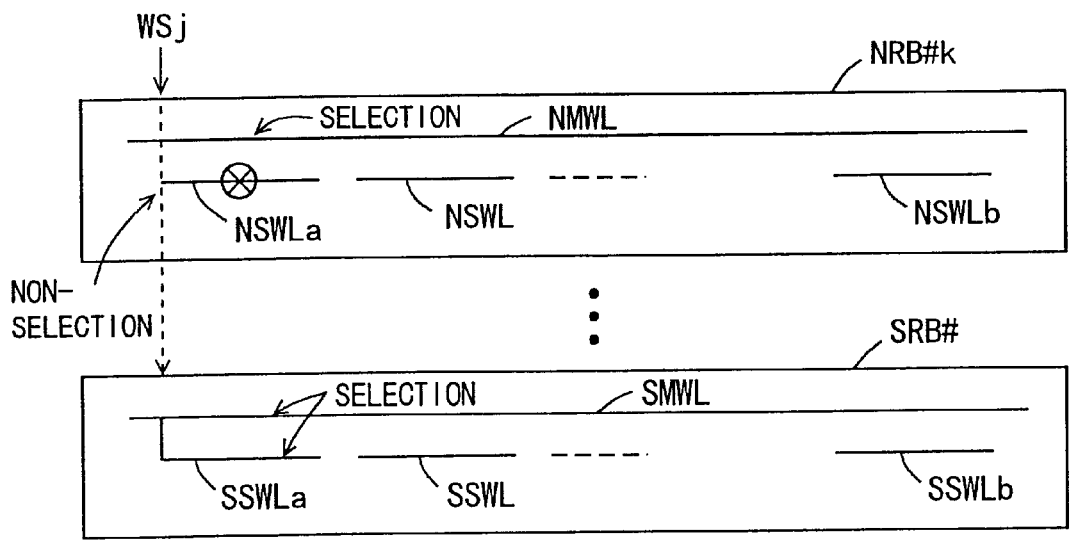
FIG. 47 is a diagram representing states of selected sub-word lines of the fourth embodiment of the present invention.

FIG. 47 is a diagram representing another state of a selected sub-word line in the data holding mode. In FIG. 47, a column block selection signal WSj specifies a column block including a normal sub-word line NSWLa and a spare sub-word line SSWLa. When a normal memory word line NMWL is specified in a normal row block NRB#k, the normal sub-word line NSWLa is kept in a non-selected state since a normal row enable signal NREj is inactive. On the other hand, in a spare row block SRB#, since a spare row enable signal SREj is active, the spare sub-word line SSWLa is driven to a selected state. At this time, a spare main word line SMWL is also driven to a selected state since spare row enable signal SREJ is activated. Accordingly, in this case, the normal sub-word line NSWLa is replaced with the spare sub-word line SSWLa.

In the normal row block NRB#k of in this case, no problem arises even when a sense operation is performed. However, by controlling sense related circuits with column block selection signal WSj and normal row enable signal MREj, operations of sense-related circuits can be controlled for each column block and thereby, a sense operation can be ceased in the normal column block NRB#k in the data holding mode.

Figure 48:
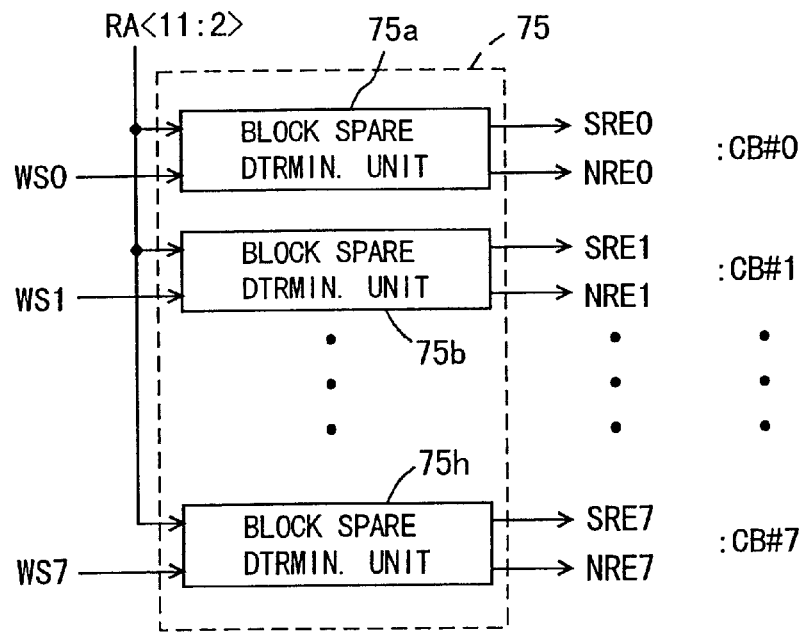
FIG. 48 is a block diagram schematically showing a configuration of a main part of the fourth embodiment of the present invention.

FIG. 48 is a block diagram schematically showing a configuration of the block spare determination circuit 75. In FIG. 48, the block spare determination circuit 75 includes block spare determination units 75a to 75h provided corresponding to respective column blocks CB#0 to CB#7. The block spare determination units 75a to 75h determine coincidence/non-coincidence of row address bits RA<11:2> supplied when column block selection signals WS0 to WS7 are activated with a stored defect row address, and generate a spare row enable signal SRE0 to SRE7 and normal row enable signals NRE0 to NRE7.

In the configuration shown in FIG. 48, when a column block selection signal WSj is inactive, a corresponding block spare determination unit 75j is kept in a precharged state to maintain a corresponding spare row enable signal SREj and a normal row enable signal NREj in inactive states (through AND with a column block selection signal). In this situation, spare determination is performed only on a selected column block, and a spare row enable signal and a normal row enable signal are generated to save a defect. In a case of sub-word line selection as shown in FIG. 46, since all spare row enable signals SRE0 to SRE7 are in inactive states, the spare main word line SMWL can be held in a non-selected state.

Figure 49:
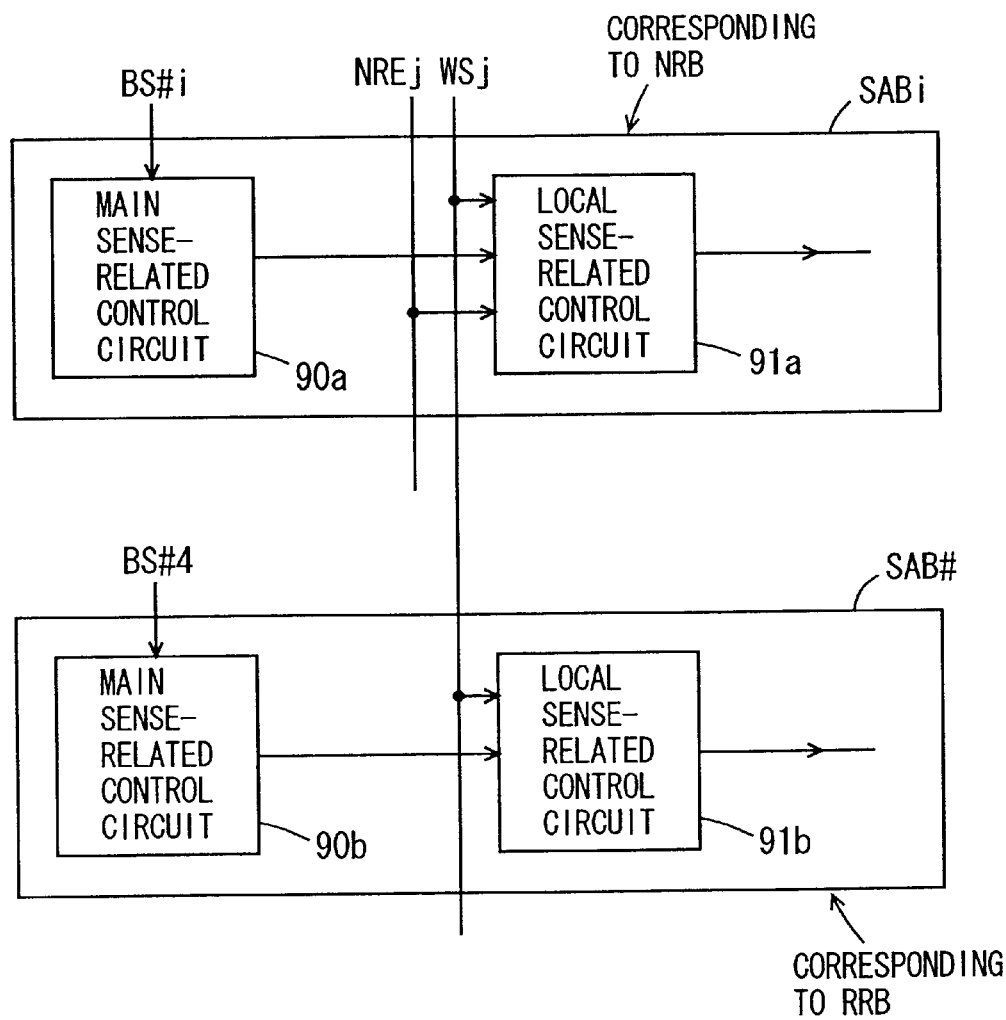
FIG. 49 is a block diagram schematically showing a configuration of a control circuit according to the fourth embodiment of the present invention.

FIG. 49 is a block diagram schematically showing a circuit for controlling sense-related circuits (a sense amplifier circuit, a bit line equalize circuit and a bit line isolation circuit) provided corresponding to each sense amplifier band. A sense amplifier band SABi provided for a normal row block NRB includes: a main sense-related control circuit 90a generating sense related control signals in a prescribed sequence according to a block selection signal BS#i; and local sense-related control circuits 91a, provided corresponding to respective memory sub-arrays, and receiving a main sense-related control signal from the main sense-related control circuit 90a and a column block selection signal WSj and a normal row enable signal NREj, to generate control signals for sense-related circuits provided corresponding to the respective memory sub-arrays.

On the other hand, in a sense amplifier band SAB# provided corresponding to a redundancy row block RRB#, there are provided: a main sense-related control circuit 90b activating sense-related control signals in a prescribed sequence according to activation of a block selection signal BS#4; and a local sense-related control circuit 91b generating local control signals for sense-related circuits provided corresponding to a corresponding memory sub-array according to column block selection signal WSj and a sense-related control signal from the main sense-related control circuit 90b.

A block selection signal BS#i supplied to the main sense-related control circuit 90a specifies memory row blocks sharing the sense amplifier band SABi. On the other hand, the block selection signal BS#4 supplied to the main sense-related control circuit 90b for the sense amplifier band SAB# also includes a block selection signal from the OR circuit 86 shown in FIG. 44 and a block selection signal specifying a memory block sharing the sense amplifier band SAB# with the redundancy row block RRB#.

In the configuration shown in FIG. 49, when a normal row enable signal NREj is inactive and redundancy replacement is performed, the local sense-related control circuit 91a is kept in a standby state. On the other hand, the main sense-related control circuit 90b generates sense-related control signals in a prescribed sequence according to the block selection signal from the OR circuit 86 shown in FIG. 44 and the local sense-related control circuit 91b activates the sense-related control signals for a corresponding memory sub-array in a prescribed sequence since column block selection signal WSj is active. Accordingly, in the data holding mode where redundancy replacement is performed with a sub-word line being a unit as well, operation of the sense amplifier circuit for a defective normal sub-word line in a non-selected state can be ceased, thereby enabling reduction in current consumption.

As described above, according to the fourth embodiment of the present invention, a spare sub-word line is provided only in one memory block and redundancy replacement is performed for each sub-word line, and therefore, correct data holding can be performed both in the normal access mode and in the data holding mode. Especially, in the data holding mode, a data holding operation can be performed with a memory sub-array being a unit, thereby enabling current consumption to decrease.

It should be noted that the numbers of main sub-word lines and spare sub-word lines included one spare row block SRB1# are not restrictive, and any number of normal/spare word lines may be provided in one spare row block SRB#. A combination of one spare main word line and spare sub-word lines disposed in one row may be employed (one spare sub-word line is provided in each column block).

The block spare determination circuit may determine coincidence/non-coincidence of row address bits RA<11:0> to perform spare determination at the level of a sub-word line.

Fifth Embodiment

Figure 50:
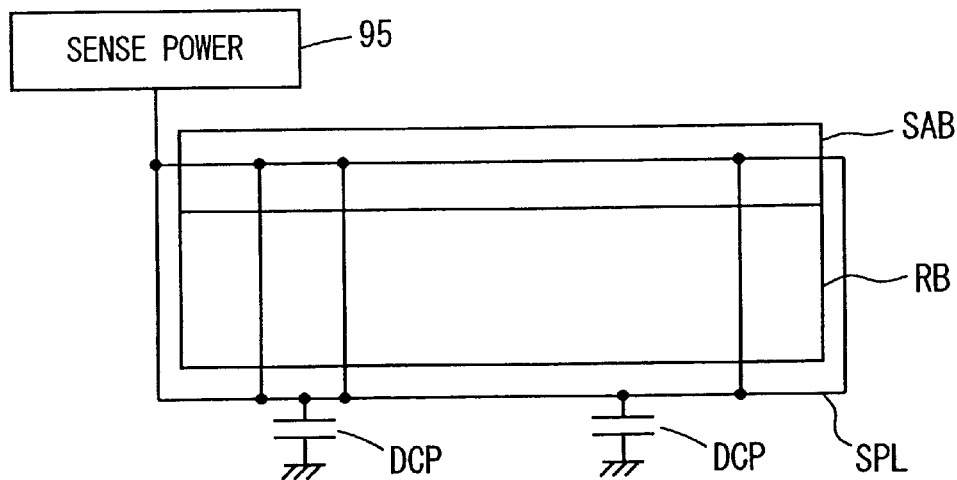
FIG. 50 is a block diagram schematically showing a configuration of a main part of a semiconductor memory device according to a fifth embodiment of the present invention.

FIG. 50 is a block diagram schematically showing a configuration of a semiconductor memory device according to a fifth embodiment of the present invention. In FIG. 50, one row block RB and one sense amplifier band SAB are provided as a fundamental constituent unit of an array section of the semiconductor memory device. The row block RB has a memory capacity of, for example, 2 Mbits. In an embedded DRAM (dynamic random address memory) or the like, a required storage capacity is different depending on application thereof, and therefore, in order to accommodate various kinds of application, a layout of a fundamental constituent unit composed of sense amplifier band SAB and row block RB is prepared in advance. By arranging repeatedly the sense amplifier band SAB and the row block RB constituting the fundamental constituent unit up to a required memory capacity, a memory having a storage capacity sufficient for an intended application is realized.

In the fundamental constituent unit, a sense power line SPL to transmit a sense power voltage from a sense power supply 95 is arranged in a meshed-shape pattern. The sense power line SPL stabilizes the sense power voltage on the sense power line SPL with arrangement in the mesh-shape pattern. Decoupling capacitances DCP are arranged in order to stabilize the sense power voltage on the sense power line SPL. Generally, the decoupling capacitances DCP are placed, for example, in cross band regions (intersections of sense amplifier bands and sub-word line driver bands) in the sense amplifier bands or positions beneath sense power lines in sense amplifier bands. Consequently, as a storage capacity of a memory increases and accordingly, the number of row blocks RB and that of sense amplifier bands SAB increase, and correspondingly, the number of decoupling capacitances DCP is increased, thereby supplying the sense power supply voltage in a stable manner.

In this case, if an array size (the number of bits included in a memory array) is smaller, a total capacitance value of decoupling capacitances is smaller. If the number of sense amplifier circuits operating simultaneously is the same even when a storage capacity (array size) changes, a total capacitance value of decoupling capacitances is smaller for a smaller array size, thereby disabling sufficiently stable supply of the sense power supply voltage. Therefore, in the fifth embodiment of the present invention, the number of sense amplifier circuits activated simultaneously in a refresh cycle is set based on an array size as follows:

With an array size being AS and the number of sense amplifier circuits activated simultaneously in one refresh cycle being NSA, $$NSA \propto AS.$$

That is, if an array size is reduced to ½ times, the number of sense amplifier circuits operating simultaneously is reduced by a factor of 2, or halved. Hence, even when a capacitance value of the decoupling capacitances DCP decreases to ½ times, the number of sense amplifier circuits consuming the sense power supply voltage on the sense power line also decreases, thereby enabling stable supply of the sense power supply voltage.

Figure 51:
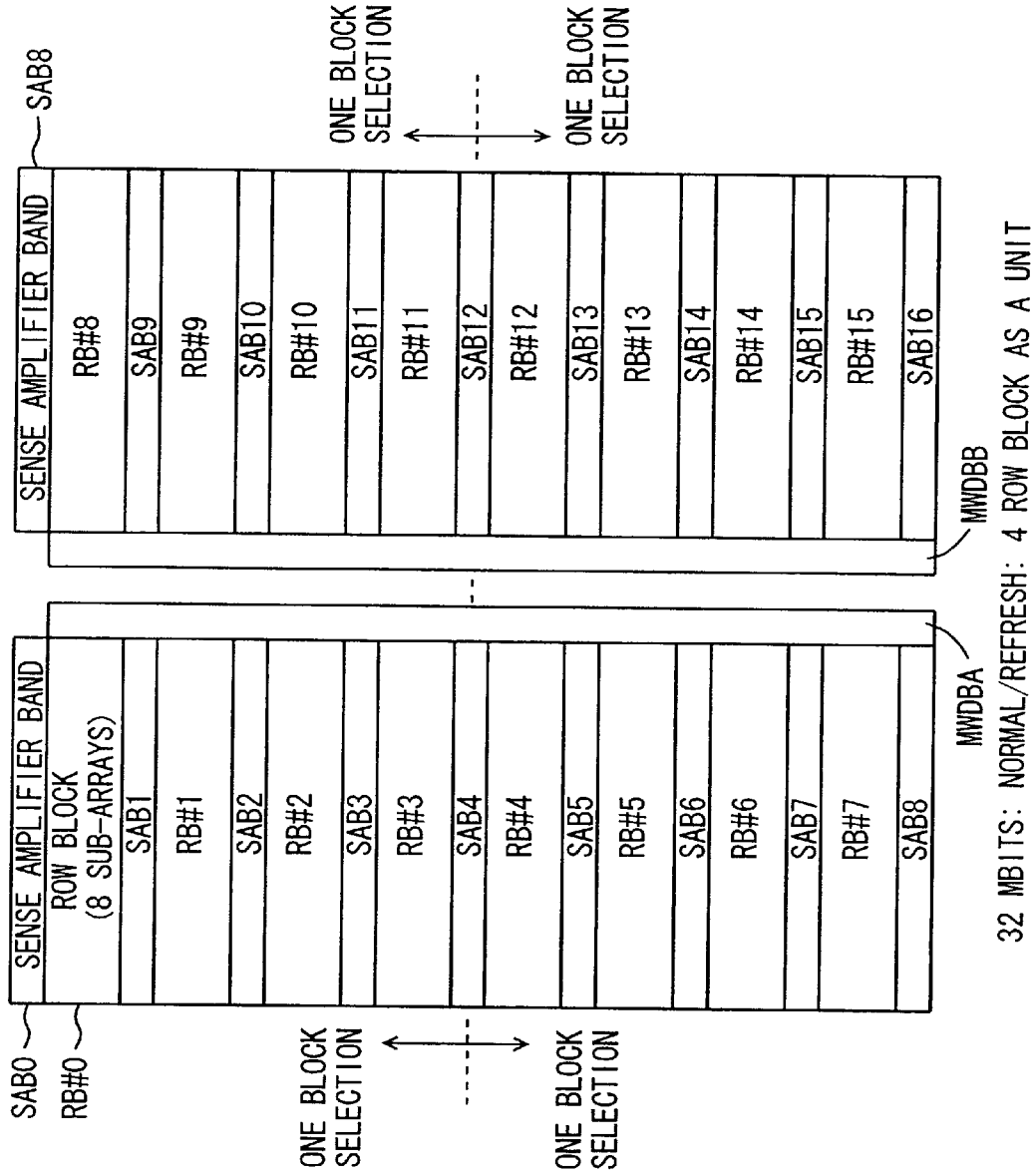
FIG. 51 is a diagram schematically showing a configuration of a memory array in the fifth embodiment of the present invention.

FIG. 51 is a diagram schematically showing a configuration of a memory array of 32 Mbits. In FIG. 51, the memory array is divided into a memory mat having row blocks RB#0 to RB#7 and a memory mat having row blocks RB#8 to RB#15. Each of the row blocks RB#0 to RB#15 has a storage capacity of 2 Mbit and is further divided into 8 memory sub-arrays.

Sense amplifier bands SAB0 to SAB8 are provided corresponding to row blocks RB#0 to RB#7 and sense amplifier bands SAB8 to SAB16 are provided corresponding to row blocks RB#8 to RB#15. A main word line driver band MWDBA is provided corresponding to the row blocks RB#0 to RB#7 and a main word line driver band MWDBB is provided corresponding to the row blocks RB#8 to RB#15.

In the 32 Mbit configuration, in the normal operating mode, one row block is selected and activated in each of groups of row blocks RB#0 to RB#3, row blocks RB#4 to RB#7, row blocks RB#8 to RB#11 and row blocks RB#12 to RB#15. In the self-refresh mode and the auto-refresh mode, a total of 4 row blocks are selected among the 16 row blocks of the row block groups, similar to the case of the normal operating mode.

Accordingly, decoupling capacitances are arranged so as to have a total decoupling capacitance adequate for stabilizing the sense power supply voltage when one row block among the 4 row blocks operates.

Figure 52:
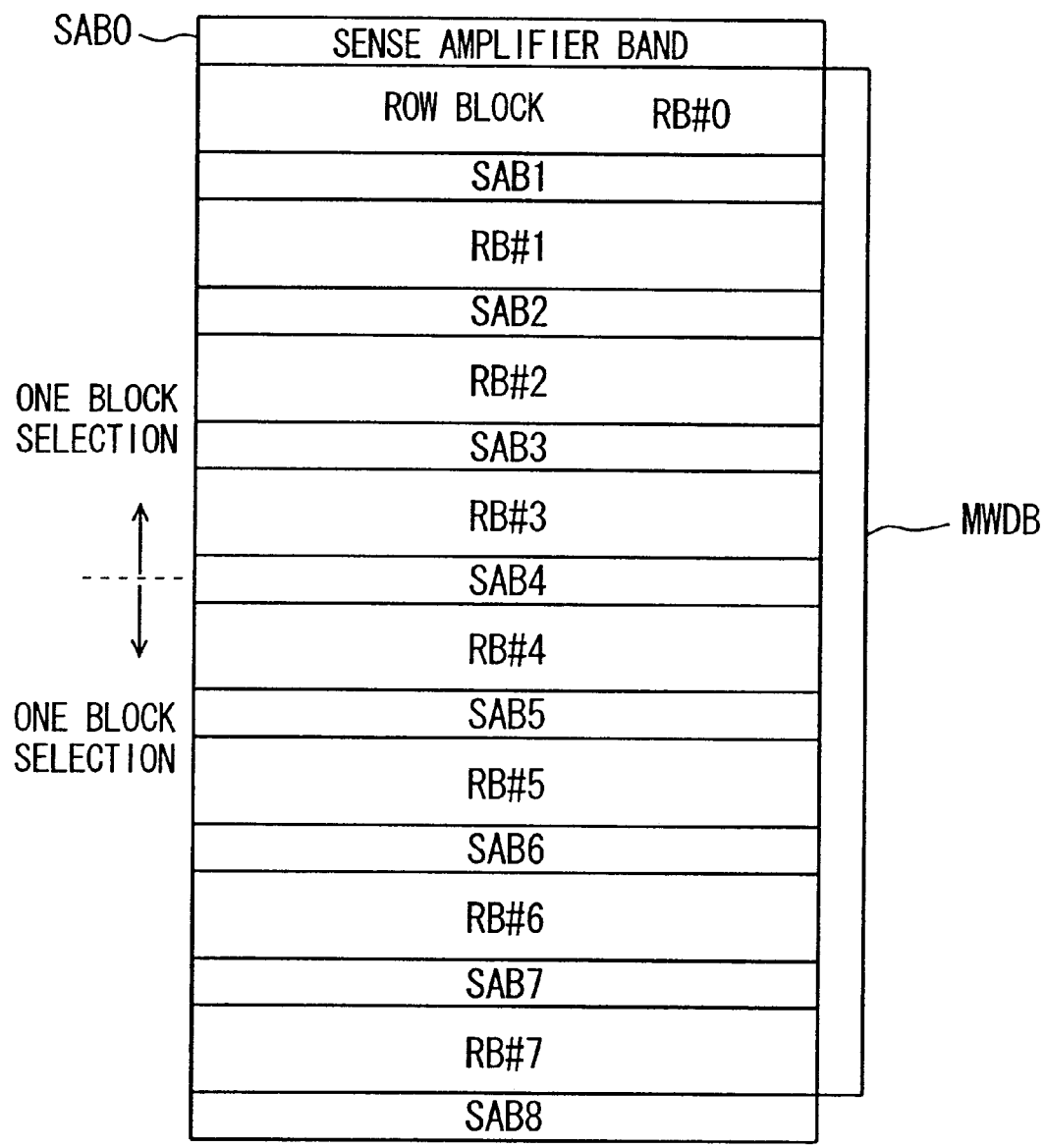
FIG. 52 is a diagram schematically showing a selected block in a memory array in the fifth embodiment of the present invention.

FIG. 52 is a diagram schematically showing a configuration of a 16 Mbit memory array. The 16 Mbit memory array includes 8 row blocks RB#0 to RB#7. Sense amplifier band SAB0 to SAB8 are provided corresponding to the row blocks RB#0 to RB#7. A main word line driver MWDB is provided to the row blocks RB#0 to RB#7. The 16 Mbit memory array shown in FIG. 52 has a storage capacity half as large as the storage capacity of 32 Mbits shown in FIG. 51, and therefore, the array size thereof is half as large. For this reason, in the normal operating mode and the refresh mode, one row block is selected from a group of row blocks RB#0 to RB#3 and simultaneously, one row block is selected from a group of row blocks RB#4 to RB#7. That is, two row blocks are simultaneously selected. According to this selection of the row blocks, when compared with the configuration of an array size of 32 Mbits shown in FIG. 51, a capacitance value of decoupling capacitances decreases to ½ times, while the number of row blocks activated simultaneously also decreases by a factor of 2, thereby enabling stable supply of a sense power supply voltage.

Figure 53:
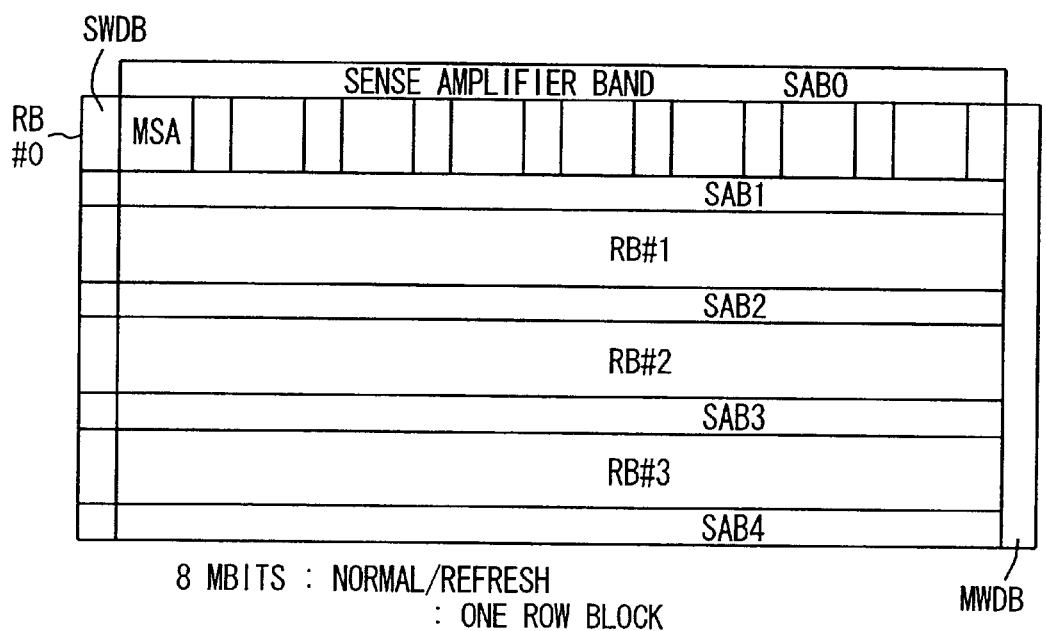
FIG. 53 is a diagram schematically showing a configuration of a memory array and a selected row block in the fifth embodiment of the present invention.

FIG. 53 is a diagram schematically showing a construction of an 8 Mbit memory array. In FIG. 53, the memory array includes 4 row blocks RB#0 to RB#3. Sense amplifier bands SAB0 to SAB4 are provided corresponding to row blocks RB#0 to RB#3. Each of the row blocks RB#0 to RB#3 is divided into 8 memory sub-arrays MSA with sub-word driver bands SWDB interposed between adjacent two memory sub-arrays MSA. A main word line driver band MWDB is provided to the row blocks RB#0 to RB#3.

In a case of the 8 Mbit memory array shown in FIG. 53, an array size is ¼ times as large as the array size of 32 Mbits. Therefore, in the normal operating mode and the refresh mode, one row block is activated. A capacitance value of decoupling capacitance and the number of sense amplifier circuits operating simultaneously can both be set to ¼ times as large as those in the case of 32 Mbits, thereby enabling stabilization of the sense power supply voltage.

Figure 54:
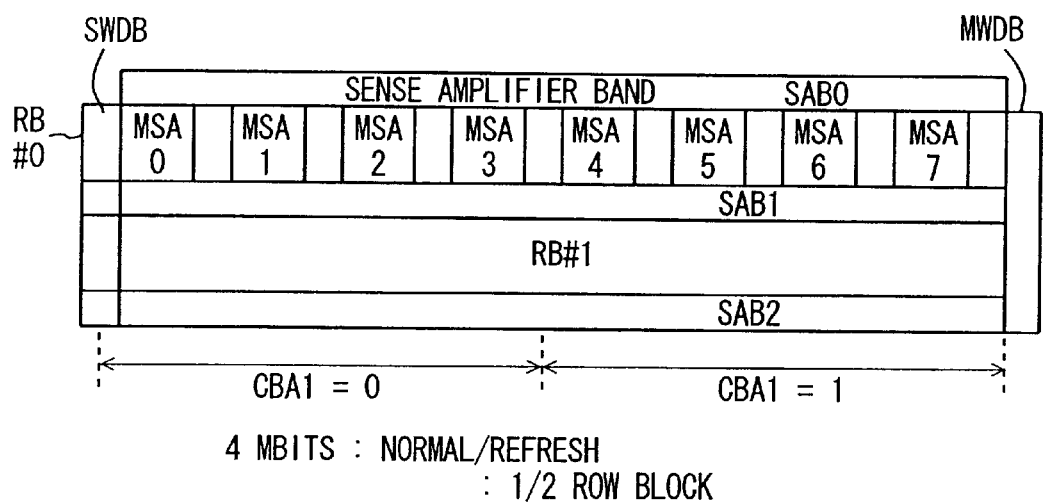
FIG. 54 is a diagram schematically showing a configuration of a memory array and a selected row block in the fifth embodiment of the present invention.

FIG. 54 is a diagram schematically showing a configuration of a memory array of 4 Mbits. In FIG. 54, the memory array includes two row blocks RB#0 and RB#1. Each of the row blocks RB#0 and RB#1 includes 8 memory sub-arrays MSA0 to MSA7. Sense amplifier bands SAB0 to SAB2 are provided corresponding to the row blocks RB#0 and RB#1 and further, a main word line driver band MWDB is provided to the row blocks RB#0 and RB#1. Sub-word line driver bands SWDB are provided corresponding to memory sub-arrays MSA0 to MSA7.

In the case of the 4 Mbit memory array configuration, in the normal operating mode and the refresh mode, half a row block, e.g., 4 memory sub-arrays are activated. That is, memory sub-arrays MSA0 to MSA3 or memory sub-arrays MSA4 to MSA7 are activated at a time. The number of sense amplifier circuits operating simultaneously is ⅛ times as large as that in the configuration of 32 Mbits and a value of decoupling capacitance is ⅛ times as large as that in the configuration of 32 Mbits, but a sense power supply voltage can still be supplied in a stable manner.

As shown in FIGS. 51 to 54, by adjusting the number of sense amplifier circuits activated simultaneously depending on a memory array size, the sense power supply voltage can be stabilized with ease, when the fundamental constituent unit is used as a module in an embedded DRAM or the like.

Figure 55:
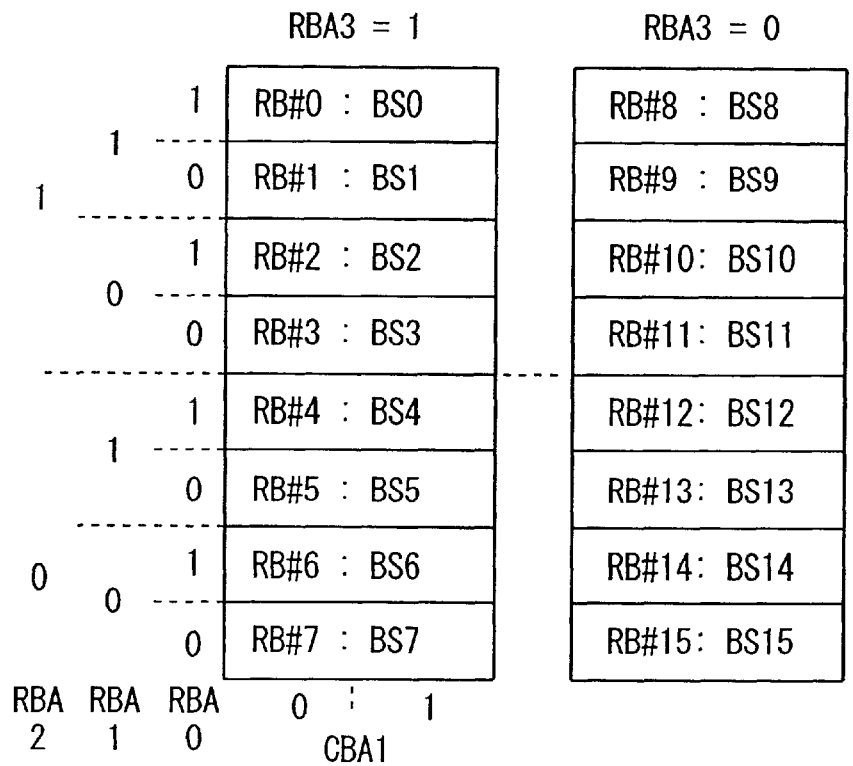
FIG. 55 is a diagram representing a correspondence relationship between each block and an address bit in the fifth embodiment of the present invention.

FIG. 55 is a diagram representing a correspondence relationship between row blocks RB#0 to RB#15 and block address bits. One of the 16 row blocks RB#0 to RB#15 is specified by 4-bit block address RBA3 to RBA0. The row blocks RB#0 to RB#7 are specified when the block address bit RBA3 is 1. The row blocks RB#8 to RB#15 are specified when the block address bit RBA3 is 0. The block address bit RBA2 specifies a group of row blocks RB#0 to RB#3 and RB#8 to RB#11, or a group of row blocks RB#4 to RB#7 and RB#12 to RB#15. With the block address bit RBA1, what is specified is row blocks RB#0, RB#1, RB#4, RB#5, RB#8, RB#9, RB#12 and RB#13, or row blocks RB#2, RB#3, RB#6, RB#7, RB#10, RB#11, RB#14 and RB#15. With the block address bit RBA0, what is specified is even-numbered row blocks or odd-numbered row blocks.

With a column selection signal CBA1, a sub-array is specified in each of the row blocks RB#0 to RB#7. The row blocks RB#0 to RB#15 are specified by respective block selection signals BS0 to BS15 generated by decoding block address bits RBA3 to RBA0.

Figure 56:
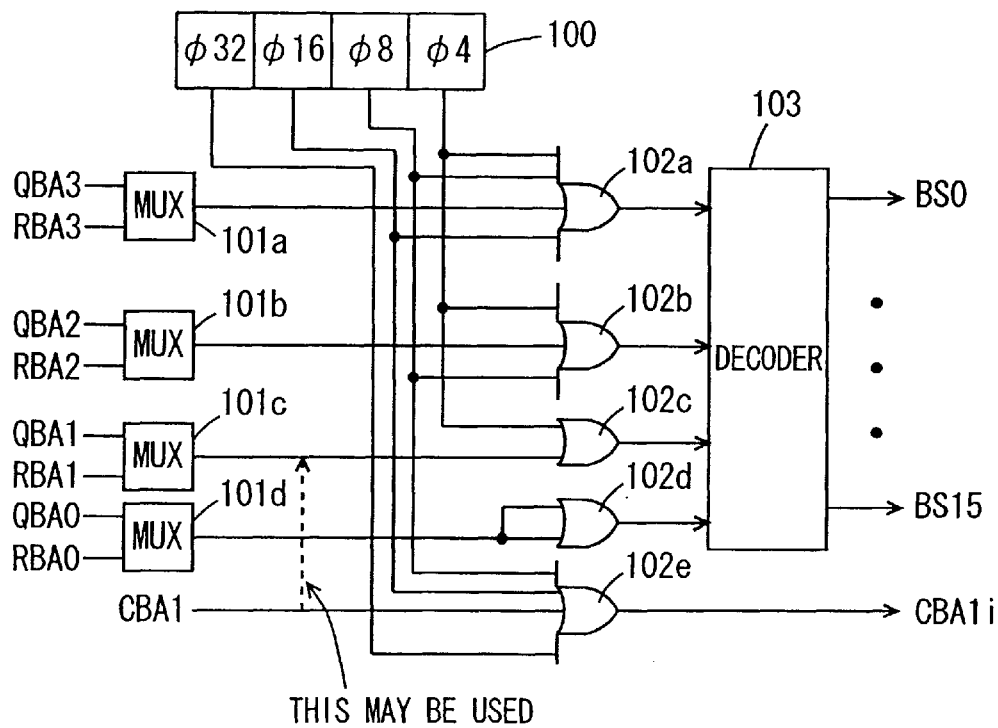
FIG. 56 is a block diagram schematically showing a configuration of a block selection signal generating section in the fifth embodiment of the present invention.

FIG. 56 is a block diagram schematically showing a configuration of a block selection signal generating section. In FIG. 56, the block selection signal generating section includes: a register 100 storing a size (a storage capacity) of a memory array; multiplexers (MUX) 101a to 101c selecting either of refresh address bits QBA3 to QBA0 from a refresh address counter and row address bits (block address bits) RBA3 to RBA0 supplied from an outside; an OR circuit 102a receiving an output bit of the multiplexer 101a, and storage information specifying signals φ16, φ8 and φ4; an OR circuit 102b receiving an output bit of the multiplexer 101b, and storage information specifying signals φ8 and φ4; an OR circuit 102c receiving an output bit of the multiplexer 101c, and storage information specifying signal φ4; and an OR circuit 102d receiving an output bit of the multiplexer 101c. The information specifying signals φ4 to φ32 indicate the array sizes of storage capacities 4 Mbits, 8 Mbits, 16 Mbits and 32 Mbits when set at H level, respectively.

The block selection signal generating section further includes an OR circuit 102e receiving the column block selection signal CBA1 and storage information specifying signals φ32, φ16 and φ8.

Output signals of the OR circuits 102a to 102d are supplied to a decoder 103. The block selection signals BS0 to BS15 are driven to selected states by the decoder 103.

In a case where storage information is of 4 Mbits, the storage information specifying signal φ4 attains H level, being in an active state. In this state, output signals of the OR circuits 102a to 102c are all fixed at H level. Accordingly, one of the block selection signals BS0 and BS1 is activated according to an address bit from the multiplexer 101c. At this time, an internal column block selection signal CBA1i is generated according to the column block selection signal CBA1 to specify an activation region in one row block.

In a case where a storage capacity is of 8 Mbits, output signals of the OR circuits 102a and 102b are both at H level. Accordingly, the decoder 103 drives one of the block selection signals BS0 to BS3 to a selected state according to outputs of the multiplexers 101b and 101c.

In a case where a storage capacity is 16 Mbits, the storage information specifying signal φ16 attains H level and an output signal of the OR circuit 102a attains H level. In this case, the decoder 103 drives one of the block selection signals BS0 to BS7 to a selected state according to output bits of the multiplexers 101b and 101c.

In a case where a storage capacity is 32 Mbits, one of the block selection signals BS0 to BS15 is driven to a selected state according to output bits of the multiplexers 101a to 101c.

The number of row blocks to be selected and a to-be-selected region can be selected according to a storage information specifying signal depending on a storage capacity.

Figure 57:
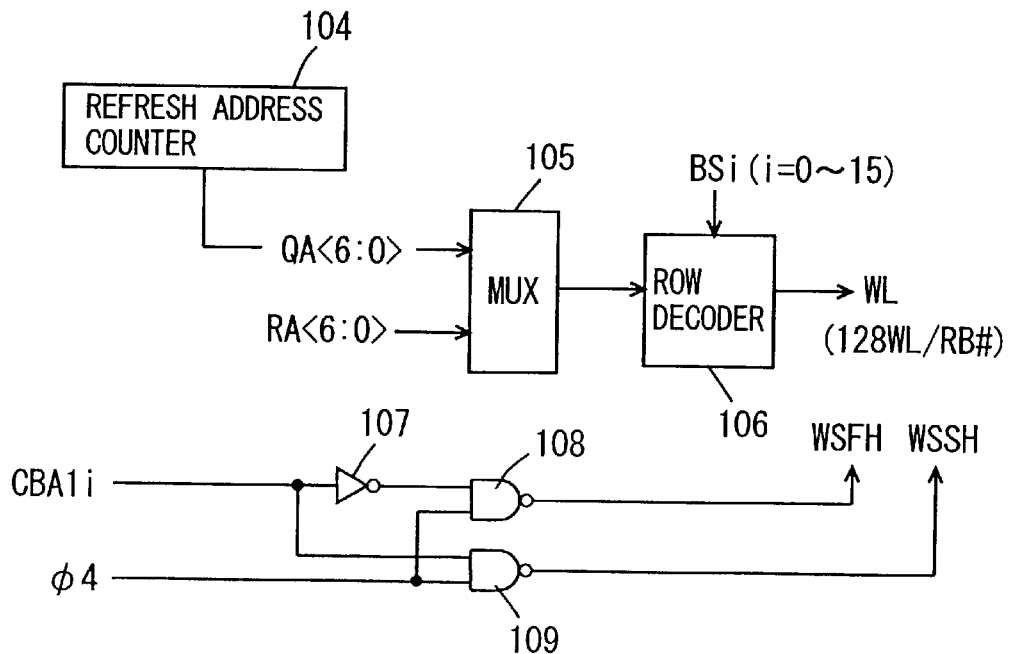
FIG. 57 is a block diagram schematically showing a configuration of a word line selecting section in the fifth embodiment of the present invention.

FIG. 57 is a block diagram schematically showing a configuration of a word line selection section. In FIG. 57, the word line selection section includes: a multiplexer 105 selecting one of a 7-bit refresh address QA<6:0> from a refresh address counter 104 and row address bits RA<6:0> supplied externally; and a row decoder 106 decoding output bits of a multiplexer 105. The row decoder 106 is provided corresponding to a row block, and is activated when a block selection signal BSi (i=0 to 15) is activated, to perform a decode operation. In one row block, 128 word lines are provided, and with an address of 7 bits, one of 128 word lines (sub-word lines) is driven to a selected state.

A column block group selection signal generating section includes: an inverter 107 receiving an internal column block selection signal CBA1i; a NAND circuit 108 receiving an output signal of the inverter 107 and a storage information specifying signal φ4 to generate a column block group selection signal WSFH; and a NAND circuit 109 receiving a column block selection signal CBA1i and a storage information specifying signal φ4 to generate a column block group selection signal WSSH. With the column block group selection signal WSFH, a first half of memory sub-arrays in one row block are selected and with the column block group selection signal WSSH, the second half of sub-arrays of the one row block are selected.

The column block selection signal CBA1 may be fixedly supplied externally in order to specify a size in the refresh mode. Alternatively, as shown with a broken line in FIG. 56, an output bit of the multiplexer 101b, which is not used in the case of the storage capacity of 4 Mbits, may be employed in order to specify the column block selection signal CBA1i.

As described above, according to the sixth embodiment of the present invention, the number of sense amplifier circuits activated simultaneously is adjusted depending on an array size. Thus, even when a capacitance value of decoupling capacitance is smaller, the number of sense amplifier circuits is reduced correspondingly, thereby enabling a stabilization of sense power supply voltage.

It should be noted that the column block group selection signals WSFH and WSSH control activation/deactivation of sense-related circuits, with a half block being a unit, in each row block similar to the configuration of the third embodiment.

Sixth Embodiment

Figure 58:
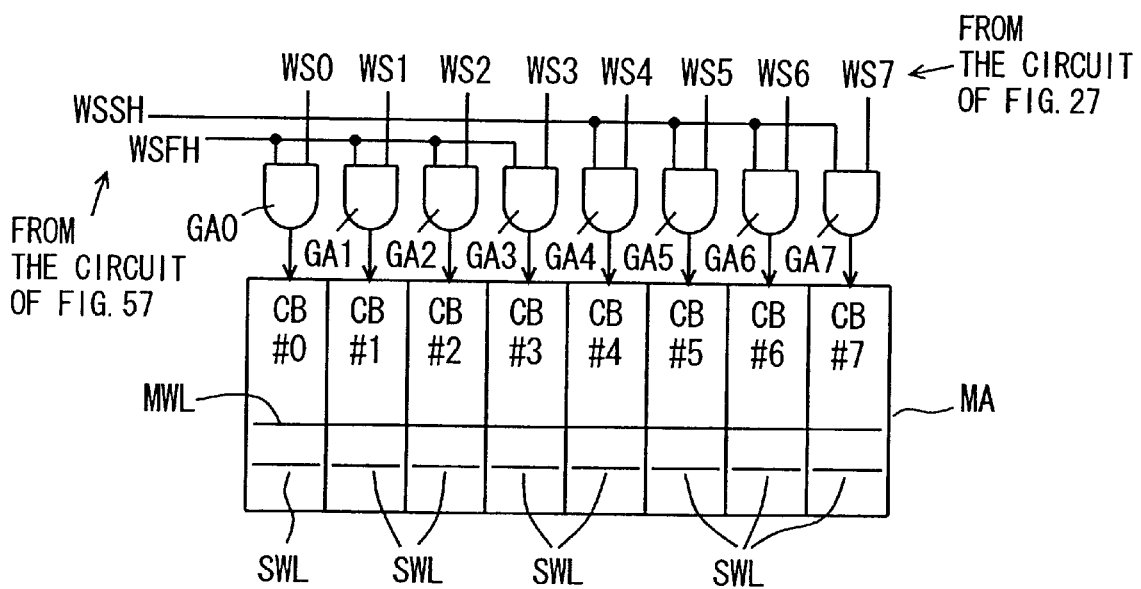
FIG. 58 is a block diagram schematically showing a configuration according to a sixth embodiment of the present invention.

FIG. 58 is a block diagram schematically showing a configuration of a main part of a semiconductor memory device according to a sixth embodiment of the present invention. In FIG. 58, a memory array MA is divided into 8 column blocks CB#0 to CB#7. AND circuits GA0 to GA7 for generating a column block selection signal are provided corresponding to the respective column blocks CB#0 to CB#7. The AND circuits GA0 to GA3 receive a column block selection signal WSFH shown in FIG. 57 at their first inputs and column block selection signals WS0 to WS7 generated from the circuit shown in FIG. 27 at their respective second inputs. The AND circuits GA4 to GA7 receive a column block group selection signal WSSH at first inputs and receive column block selection signals WS4 to WS7 at their respective second inputs.

As shown in FIG. 27, the column block selection signals WS0 to WS7 shown in FIG. 57 are at H level in the normal operating mode. Hence, in this case, an activated region of the column blocks is determined by column group selection signals WSSH and WSFH. On the other hand, in the data holding mode, only a prescribed number of signals among column block selection signals WS0 to WS7 attain H level according to the self-refresh activation signal. In the data holding mode, column block group selection signals WSSH and WSFH are fixed in logic level. Accordingly, in the data holding mode, when a size of selected sense amplifier bands is adjusted depending on an array size, activation/deactivation can be controlled with a sub-word line being a unit according to column block selection signals WS0 to WS7 as well, thereby enabling more reduction in current consumption in the data holding mode. At this time, when a decoupling capacitance is attached to a sense power line, since a decoupling capacitance provided to a non-operating sense amplifier circuit acts as a sense power supply decoupling capacitance for an operating sense amplifier circuit, thereby enabling more stable supply of the sense power supply voltage. It should be noted that a main word line NWL is activated in the entirety thereof.

As described above, according to the sixth embodiment, in a case where the number of sense amplifier circuits is adjusted depending on an array size, a sense amplifier circuits are activated with a one sub-word line being a unit in the data holding mode, and therefore, a consumed current in the data holding mode can be reduced and besides, a sense power supply voltage can be supplied in a stable manner. A sense-related control circuit can utilize the configuration of any of the second to fourth embodiments.

Seventh Embodiment

Figure 59:
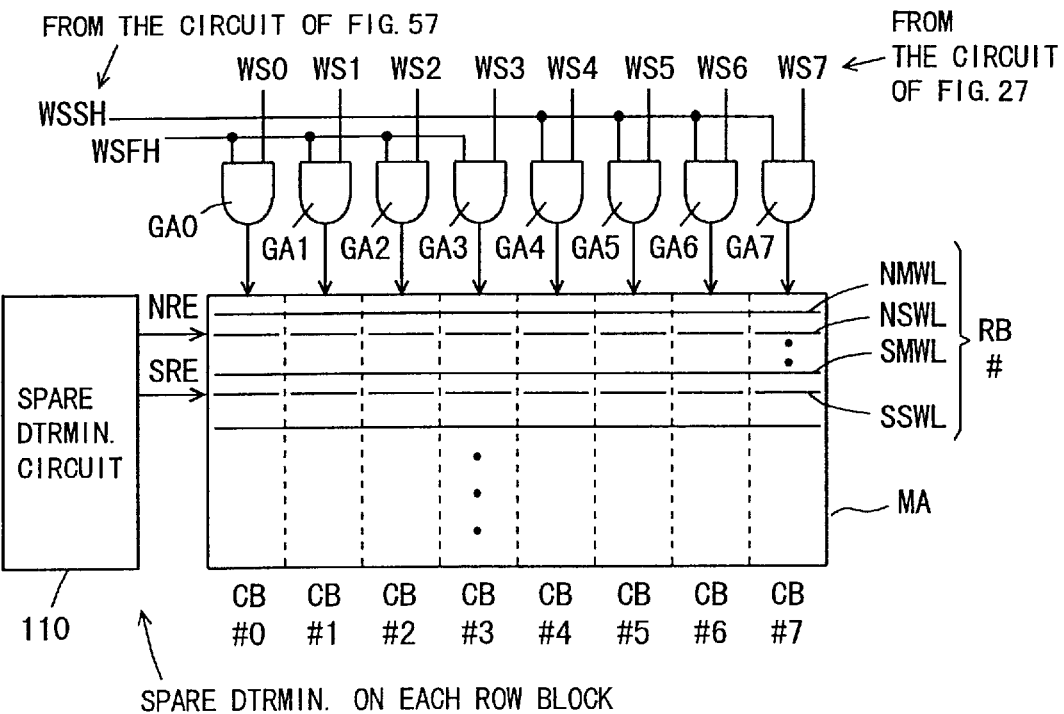
FIG. 59 is a block diagram schematically showing a configuration of a semiconductor memory device according to a seventh embodiment of the present invention.

FIG. 59 is a block diagram schematically showing a configuration of a main part of a semiconductor memory device according to a seventh embodiment of the present invention. In FIG. 59, one row block RB# included in a memory array MA is shown as a representative. In the row block RB#, a normal main word line NMWL, a normal sub-word line NSWL provided corresponding to the normal main word line NMWL, a spare main word line SMWL, and a spare sub-word line SSWL provided corresponding to the spare main word line SMWL, are provided. The normal sub-word line NSWL and the spare sub-word line SSWL are disposed in each of column blocks CB#0 to CB#7.

Column block selection signals are supplied to the column blocks CB#0 to CB#7 from AND circuits GA0 to GA7, similarly to the configuration shown in FIG. 58. A spare determination circuitry 110 is provided to the memory array MA. The spare determination circuitry 110 includes spare determination circuits provided corresponding to respective row blocks, and spare determination is performed in each row block to generate a normal row enable signal NRE and a spare row enable signal SRE.

In the configuration shown in FIG. 59, even when the number of activated blocks and that of activated sense amplifier circuits are both reduced depending on an array size, correct redundancy replacement can be performed since spare determination circuits are provided corresponding to the respective row blocks. Further, in the data holding mode as well, activation/deactivation can be controlled with a column block being a unit in a selected row block. Therefore, even in a semiconductor memory device with a storage capacity of 4 Mbits, for example, data holding can be further ensured with a column block being a unit.

By disposing a normal main word line and a spare main word line in the row block RB#, configuration of each respective row block is all the same as other, and a plurality of row blocks of the same configuration can be provided, thereby enabling easy extension of storage capacity. Furthermore, in this case, addresses assigned to each respective row block can be all the same as other, thereby enabling simplified interconnection layout. Moreover, since the configuration of each respective row block is the same as other and redundancy replacement is performed with a row block being a unit, arrangements of data lines in each of row blocks can be the same with each other and the data lines can be commonly used by the row blocks, thereby enabling alleviation in a pitch condition for data line layout.

First Example Modification

Figure 60:
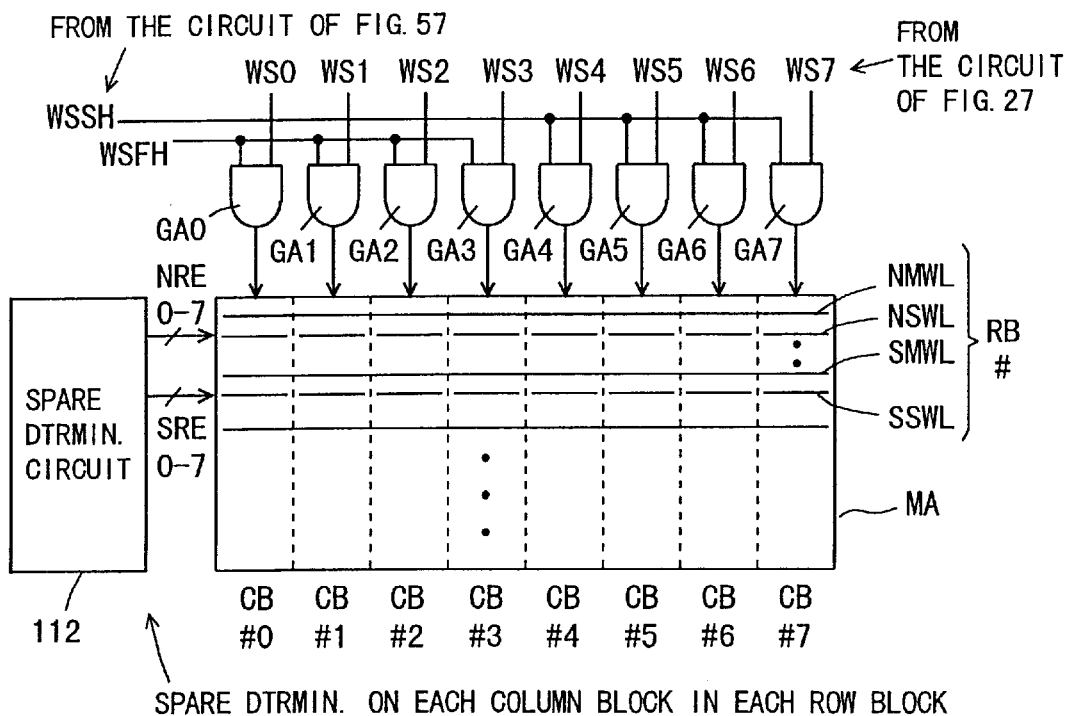
FIG. 60 is a block diagram schematically showing a configuration of a first modification of the seventh embodiment of the present invention.

FIG. 60 is a block diagram schematically showing a configuration of a first modification of the seventh embodiment according to the present invention. In FIG. 60, a spare determination circuit 112 performs spare determination with a column block being a unit in each row block, and generates normal row enable signals NRE0 to NRE7 and spare row enable signals SRE0 to SRE7 based on the spare determination result to a corresponding row block RB#. The other part of the configuration is the same as the corresponding part of the configuration shown in FIG. 59, and corresponding components are attached with the same reference numerals.

In the configuration shown in FIG. 60 as well, in the data holding mode, a refresh operation is performed with a memory sub-array (column block) being a unit, and the number of sense amplifier circuits in operation at a time is reduced as compared with that in the normal operating mode, and therefore, even in a case where a capacitance value of decoupling capacitance is small, the sense power supply voltage is stabilized and thereby, a correct refresh operation can be performed. Further, defect repairing is performed with a column block being a unit, thereby enabling more of improvement on defect repairing efficiency.

The configurations shown in FIGS. 59 and 60 are the same as that of spare determination shown in the fourth embodiment, and control operations on sense-related circuits are performed similarly to the fourth embodiment. Output signals of the AND circuits GA0 to GA7 are employed as a column block selection signal.

Second Modification

Figure 61:
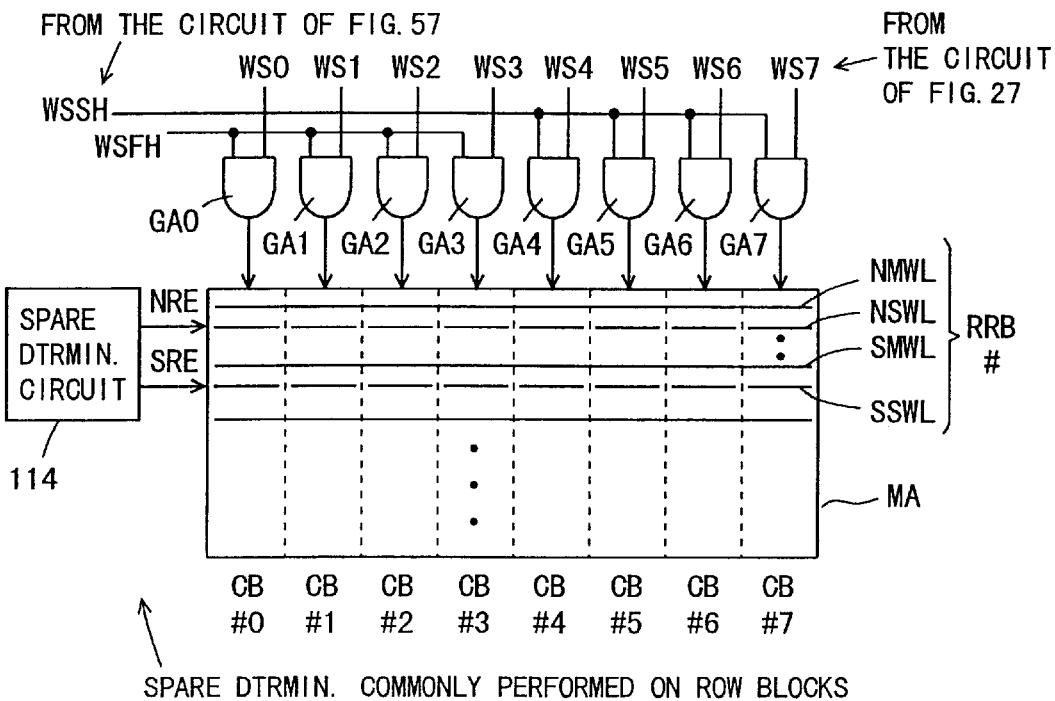
FIG. 61 is a block diagram schematically showing a configuration of a second modification of the seventh embodiment of the present invention.

FIG. 61 is a block diagram schematically showing a configuration of a second example modification of the seventh embodiment according to the present invention. In the configuration of FIG. 61, a spare determination circuit 114 is provided to a redundancy row block RRB#. The spare circuit 114 performs spare determination commonly to row blocks, and generates a normal row enable signal NRE and a spare row enable signal SRE based on the spare determination result. The other part of the configuration is the same as the corresponding part of the configuration shown in FIG. 59, and corresponding components are attached with the same reference numerals.

In the configuration shown in FIG. 61, repairing of a defective row included in the memory array MA is performed with a spare main word line SMWL of redundancy row block RRB#. In such a case as well, a sense amplifier circuits are activated only for a redundancy row as shown in the fourth embodiment, and the number of sense amplifier circuits activated simultaneously does not increase. Therefore, even if spare determination is performed commonly on a plurality of row blocks by the spare determination circuit 114, the sense power supply voltage can be stabilized with the number of sense amplifier circuits operating simultaneously being constant, thereby enabling defect repairing through redundancy replacement and correct data holding.

Further, in the data holding mode, activation/deactivation can be performed with a sub-word line being a unit, and the number of sense amplifier circuits operating simultaneously in the data holding mode can be reduced, thereby enabling reduction in current consumption. In this case, a capacitance value of decoupling capacitance provided to a sense power supply of a sense amplifier circuit being in an inactive state, functions as a decoupling capacitance for the sense power supply line for a sense amplifier circuit operating actually, thereby enabling a more stable sense operation.

Third Example Modification

Figure 62:
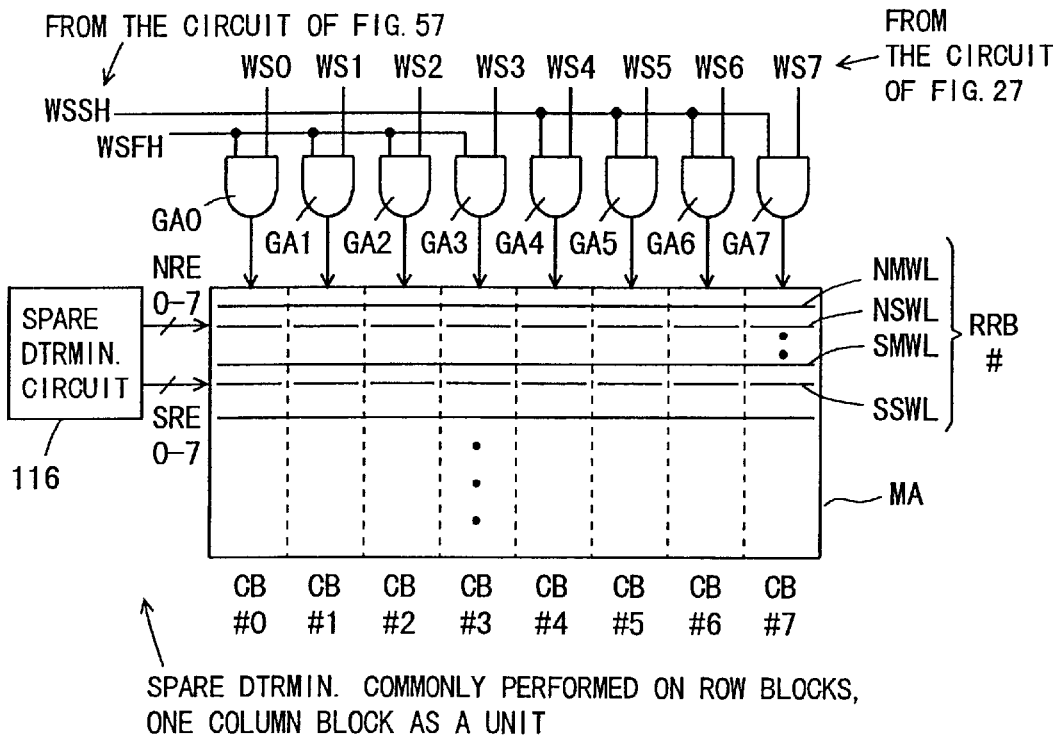
FIG. 62 is a block diagram schematically showing a configuration of a third modification of the seventh embodiment of the present invention.
Figure 63:
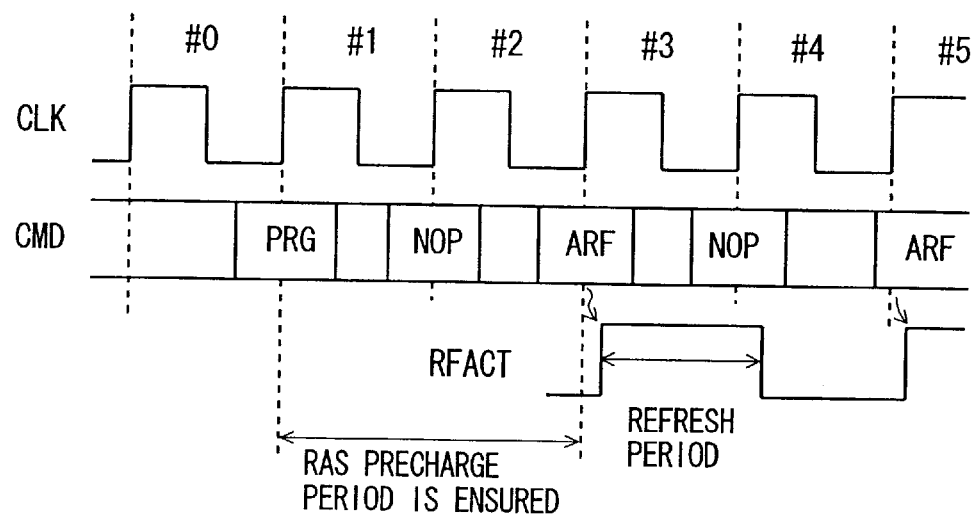
FIG. 63 is a timing chart representing a refresh operation of a conventional semiconductor memory device.
Figure 64A:
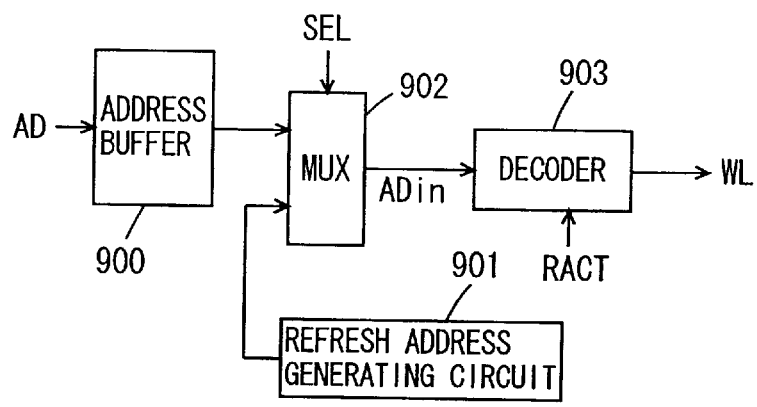
FIG. 64A is a block diagram schematically showing a configuration of a refresh address generating section of a conventional semiconductor memory device.
Figure 64B:
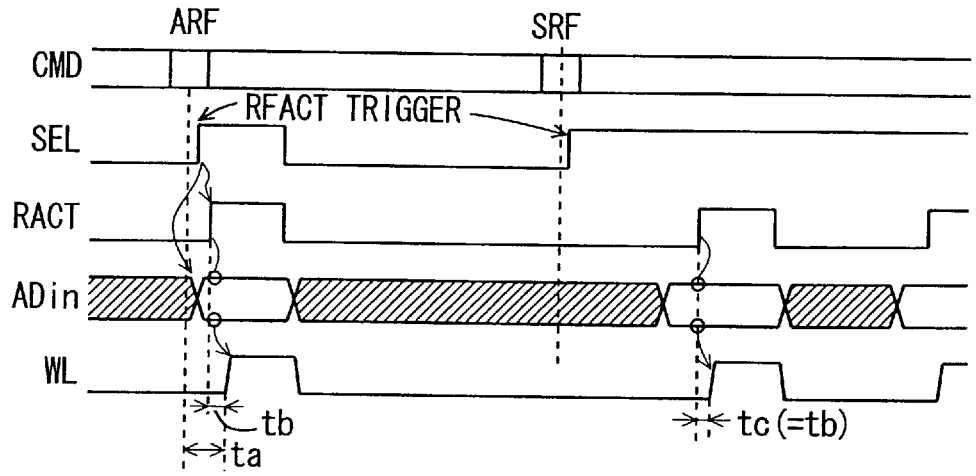
FIG. 64B is a timing chart representing operations of the circuit shown in FIG. 64A.

FIG. 62 is a block diagram schematically showing a configuration of a third modification of the seventh embodiment according to the present invention. In FIG. 62, a spare determination circuit 116 is provided to a redundancy row block RRB# of a memory array MA. The spare determination circuit 116 performs spare determination commonly on row blocks included in the memory array MA with a column block being a unit. The other part of the configuration is the same as the corresponding part of the configuration shown in FIG. 61, and corresponding components are attached with the same reference numerals.

In the configuration shown in FIG. 62, spare determination is performed for each column block. Accordingly, there arises a state where a normal main word line NMWL and a spare main word line SMWL are simultaneously activated. However, by holding sense amplifier circuits in an inactive state for a (defective) normal sub-word line to be replaced, the number of sense amplifier circuits operating simultaneously can be made constant regardless of the presence or absence of redundancy replacement. Hence, even when a size of a block to be activated is adjusted depending on an array size, activation/deactivation can be controlled with a memory sub-array being a unit in the data holding mode, thereby enabling more reduction in number of sense amplifier circuits operating simultaneously in the data holding mode. Even when capacitance value of a decoupling capacitance is smaller with decrease in array size, a sense operation can be performed in a stable manner to achieve data holding.

It should be noted that in the configurations shown in FIGS. 61 and 62, data holding, with a memory sub-array being a unit, can be realized by utilizing row-related control circuits shown in the fourth embodiment. Output signals of the AND circuits GA to GA7 are supplied instead of the column selection signal in the fourth embodiment.

As described above, according to the seventh embodiment of the present invention, an activated block size is adjusted according to an array size, data holding is performed with a memory sub-array (column block) being a unit in the data holding mode. Thus, even when a capacitance value of decoupling capacitance is reduced depending on an array size, a sense operation can be performed in a stable manner in the data holding mode and at the same time, a current consumption can be reduced.

Other Example Applications

A storage capacity (the number of bits) of a row block RB is arbitrary, and for example, one row block may have a storage capacity of 1 Mbits. Further, one spare sub-word line may be provided corresponding to a spare main word line SMWL in each column block. In this case, there is no necessity to generate a spare sub-decode signal and a spare sub-word line can be simply driven to a selected state according to a spare determination result.

Further, a DRAM performing data holding may be an SDRAM (clock synchronous DRAM) operating in synchronization with a clock signal or an embedded DRAM integrated with logics such as a processor on the same semiconductor chip.

Further, the number of row blocks included in one memory mat may be appropriately determined depending on a storage capacity of the row block or the memory mat.

Further, in a case where sub-word line drivers are disposed alternately on both sides of a memory sub-array and one sub-word line driver drives sub-word lines in two memory sub-arrays adjacent in a column direction, activation/deactivation is controlled with a sub-word line driver band being a unit. For example, only even-numbered sub-word lines or odd-numbered sub-word lines are activated in the data holding mode.

As described above, according to the present invention, a refresh operation can be performed efficiently and in a stable manner in a dynamic semiconductor memory device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
    a plurality of sub-word lines each connecting to one row of memory cells, said plurality of sub-word line disposed being aligned in a row direction;
    a main word line provided commonly to said plurality of sub-word lines; and
    row selection circuitry driving said main word line and said plurality of sub-word lines to a selected state according to an address signal in a normal operating mode, and driving said main word line and a part of said plurality of sub-word lines to a selected states according to said address signal in a data holding mode for holding storage data in the memory cell.

2. The semiconductor memory device according to claim 1, further comprising:
    a refresh address circuit generating a row address signal specifying memory cells on a row to be refreshed as said address signal in said data holding mode and a sub-row address signal specifying said part of plurality of sub-word lines.

3. The semiconductor memory device according to claim 2, wherein said row selection circuitry comprises a decode circuit for invalidating an address corresponding to said sub-row address signal in said normal operating mode and validating said sub-row address signal in said data holding mode.

4. The semiconductor memory device according to claim 1, further comprising:
   a spare main word line provided for repairing a defective memory cell when said defective memory cell is present in the memory cells arranged corresponding to said main word line;
   a plurality of spare sub-word lines provided corresponding to the respective sub-word lines, disposed alignedly in the row direction and each connecting to a plurality of spare memory cells; and
   a defect repairing circuit storing a defect address indicating an address of said defective memory cell, for replacing a sub-word line connecting to said defective memory cell with a corresponding spare sub-word line according to said address signal, said defect repairing circuit performing replacement for defect repairing with a sub-word line being a unit at least in the data holding mode.

5. A semiconductor memory device comprising:
   a plurality of memory sub-blocks, disposed being aligned in a row direction, each having a plurality of normal memory cells arranged in rows and columns;
   a plurality of normal sub-word lines, provided corresponding to the respective rows in each of said memory sub-blocks, and each connecting to normal memory cells on a corresponding row;
   a plurality of normal main word lines, disposed extending in the row direction in common to said plurality of memory sub-blocks, each provided corresponding to a prescribed number of normal sub-word lines in each of said plurality of memory sub-blocks;
   a plurality of spare memory cells, disposed being aligned on at least one row in each of said plurality of memory sub-blocks, being disposed in alignment in a column direction with the normal memory cells in a corresponding memory sub-block;
   a plurality of spare sub-word lines, provided corresponding to rows of the spare memory cells in each of said plurality of memory sub-blocks, each connecting to spare memory cells on a corresponding row;
   at least one spare main word line, disposed extending in the row direction in common to the plurality of memory sub-blocks, provided corresponding to a prescribed number of spare sub-word lines in each of said plurality of memory sub-blocks; and
   a repairing control circuit storing a defect address indicating a position of a defective normal memory cell, for replacing a normal sub-word line provided corresponding to a row including said defective normal memory cell with a spare sub-word line in a corresponding memory sub-block when said defective normal memory cell is addressed, said repairing control circuit performing replacement for defect repairing with a memory block being a unit at least in a data holding mode.

6. The semiconductor memory device according to claim 5, wherein said semiconductor memory device operates in a normal access mode in which data access is performed and in the data holding mode in which storage data is held, and said semiconductor memory device further comprises:
   a row selection control circuit for activating row-related circuits performing an operation related to row selection in each of said plurality of memory sub-blocks in said normal access mode and activating row-related circuits provided for a part of said plurality of memory sub-blocks in said data holding mode.

7. The semiconductor memory device according to claim 5, wherein said repairing control circuit comprises a circuit for performing repairing of a defective normal sub-word line over a whole normal main word line on an addressed row in said normal access mode and performing repairing of a defective normal sub-word line in a part of said memory sub-blocks in said data holding mode.

8. The semiconductor memory device according to claim 5, wherein said plurality of memory sub-blocks constitutes a first row block and said semiconductor further comprises at least one second row block disposed in alignment in the column direction with said first row block, and
   the second row block comprises:
      a plurality of second normal memory sub-blocks each having a plurality of second normal memory cells disposed in rows and columns;
      a plurality of second normal sub-word lines, provided corresponding to the respective rows in each of said plurality of second normal memory sub-blocks, each connecting to second normal memory cells on a corresponding row; and
      a plurality of second normal main word lines provided in common to said plurality of second normal memory sub-blocks and each provided corresponding to a prescribed number of second normal sub-word lines in each of said plurality of second normal sub-blocks,
   said repairing control circuit comprises a circuit for replacing a defective second normal sub-word word line connecting to a defective second normal memory cell in said second row block with a spare word line of a corresponding memory sub-block of said first row block.

* * * * *